(12) United States Patent
Anderson et al.

(10) Patent No.: US 10,236,219 B1
(45) Date of Patent: Mar. 19, 2019

(54) VFET METAL GATE PATTERNING FOR VERTICAL TRANSPORT FIELD EFFECT TRANSISTOR

(71) Applicant: INTERNATIONAL BUSINESS MACHINES CORPORATION, Armonk, NY (US)

(72) Inventors: Brent A. Anderson, Jericho, VT (US); Ruqiang Bao, Niskayuna, NY (US); Kangguo Cheng, Schenectady, NY (US); Hemanth Jagannathan, Niskayuna, NY (US); Choonghyun Lee, Rensselaer, NY (US); Junli Wang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/820,603

(22) Filed: Nov. 22, 2017

(51) Int. Cl.
| | | |
|---|---|---|
| *H01L 21/82* | (2006.01) | |
| *H01L 21/8238* | (2006.01) | |
| *H01L 21/28* | (2006.01) | |
| *H01L 29/49* | (2006.01) | |
| *H01L 23/535* | (2006.01) | |
| *H01L 29/78* | (2006.01) | |
| *H01L 29/06* | (2006.01) | |
| *H01L 29/08* | (2006.01) | |

(52) U.S. Cl.
CPC ............ *H01L 21/823842* (2013.01); *H01L 21/28088* (2013.01); *H01L 21/823814* (2013.01); *H01L 21/823871* (2013.01); *H01L 21/823885* (2013.01); *H01L 23/535* (2013.01); *H01L 29/0653* (2013.01); *H01L 29/0847* (2013.01); *H01L 29/4966* (2013.01); *H01L 29/7827* (2013.01)

(58) Field of Classification Search
CPC .......... H01L 29/4966; H01L 29/66787; H01L 29/66795; H01L 29/42356; H01L 29/42372; H01L 29/42376; H01L 29/4238; H01L 21/8232; H01L 21/823431; H01L 21/8238; H01L 21/823821; H01L 21/823842; H01L 21/823828; H01L 21/82385; H01L 21/823885
See application file for complete search history.

(56) References Cited

U.S. PATENT DOCUMENTS

| 6,686,633 B1 | 2/2004 | Lage et al. |
| 6,687,145 B2 | 2/2004 | Houston |

(Continued)

FOREIGN PATENT DOCUMENTS

KR 20140029961 A 3/2014

*Primary Examiner* — Scott B Geyer
(74) *Attorney, Agent, or Firm* — Michael O'Keefe

(57) ABSTRACT

Forming a PFET work function metal layer on a p-type field effect transistor (PFET) fin in a PFET region and on an n-type field effect transistor (NFET) fin in an NFET region, removing a portion of the PFET work function metal layer between the PFET fin and the NFET fin, thinning the PFET work function metal layer, patterning an organic planarization layer on the PFET work function metal layer, where the organic planarization layer covers the PFET region and partially covers the NFET region, removing the PFET work function metal layer in the NFET region, by etching isotropically selective to the organic planarization layer and an insulator in the NFET region, removing the organic planarization layer, and conformally forming an NFET work function metal layer on the semiconductor structure.

20 Claims, 59 Drawing Sheets

(56) References Cited

U.S. PATENT DOCUMENTS

| | | |
|---|---|---|
| 7,947,549 B2 | 5/2011 | Park et al. |
| 8,183,642 B2 | 5/2012 | Park et al. |
| 8,445,384 B2 | 5/2013 | Dixit |
| 9,054,214 B1 | 6/2015 | Baldwin et al. |
| 9,502,307 B1 | 11/2016 | Bao et al. |
| 9,576,958 B1 | 2/2017 | Bao et al. |
| 9,589,957 B2 | 3/2017 | Kim |

Section B-B

Section D-D

Section C-C

Section B-B

Section C-C

Section D-D

Section B-B

Section D-D

Section C-C

Section C-C

Section B-B

Section D-D

Section B-B

Section C-C

Section D-D

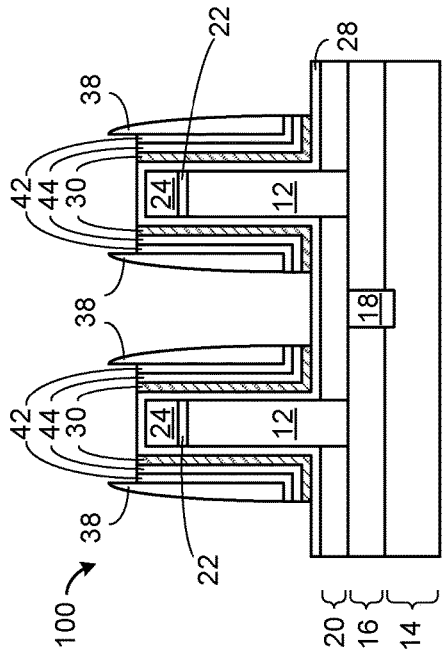
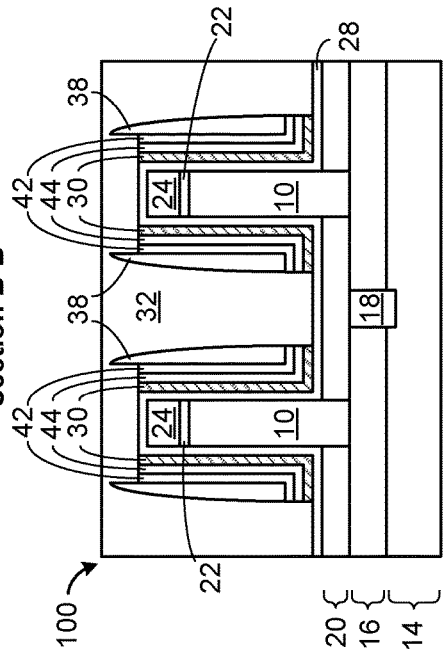
Figure 64
Figure 65
Section B-B
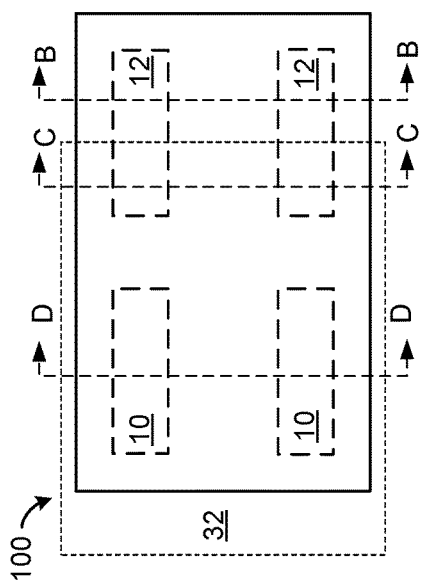
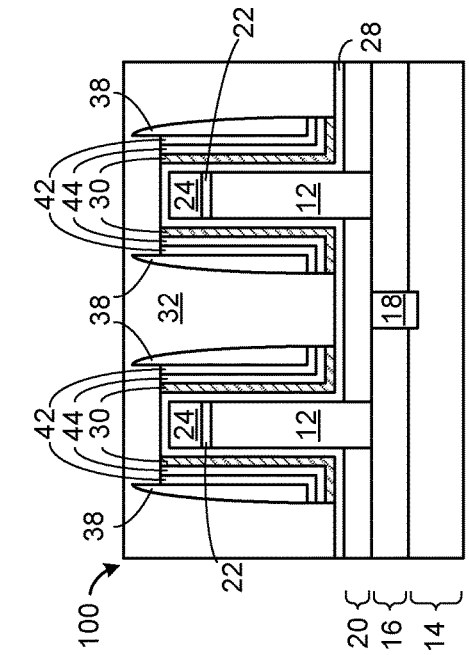
Figure 66
Section C-C
Figure 67
Section D-D Section B-B Section C-C Section D-D

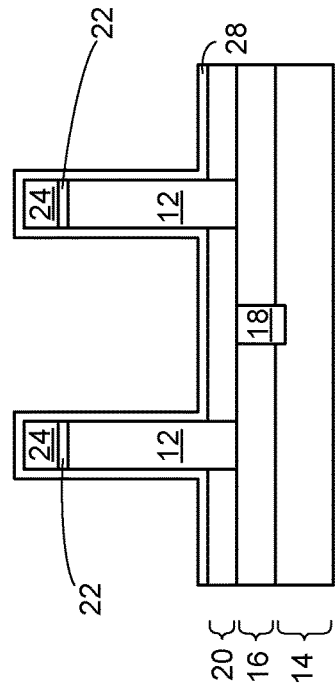
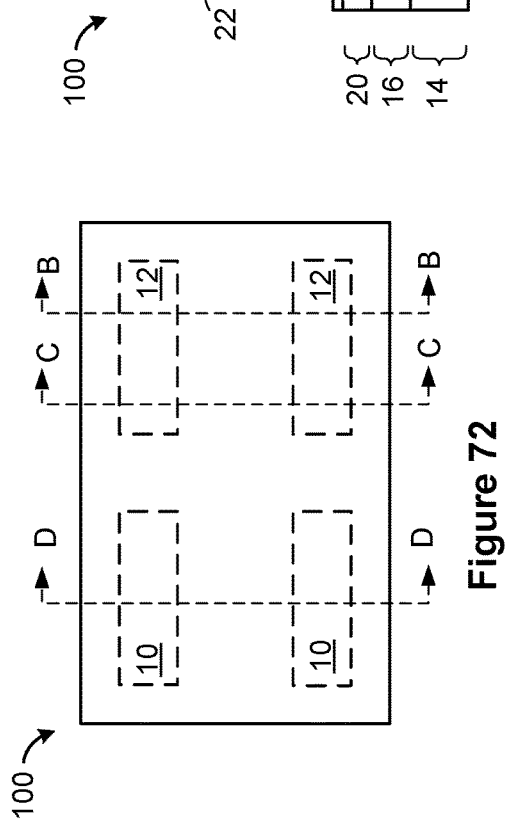
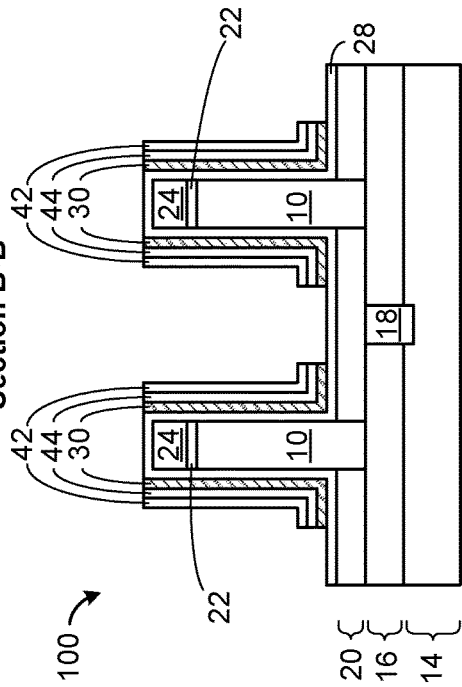
Figure 72
Figure 73 Section B-B
Figure 74 Section C-C
Figure 75 Section D-D

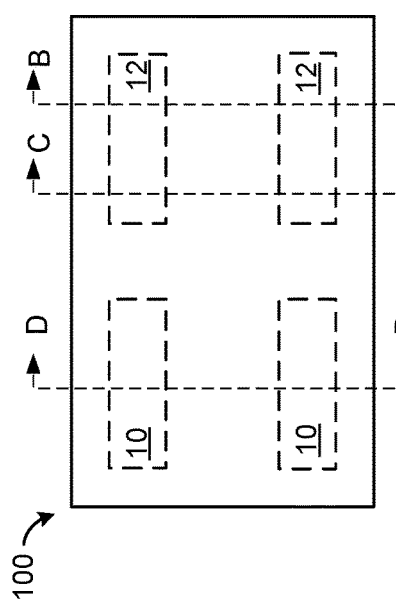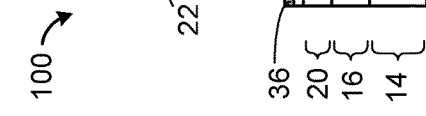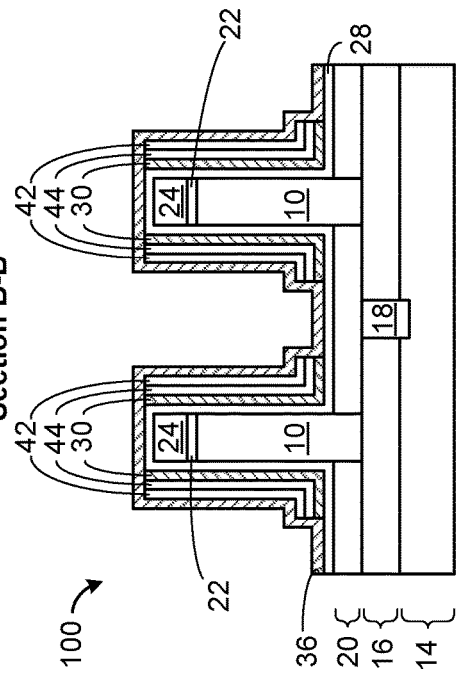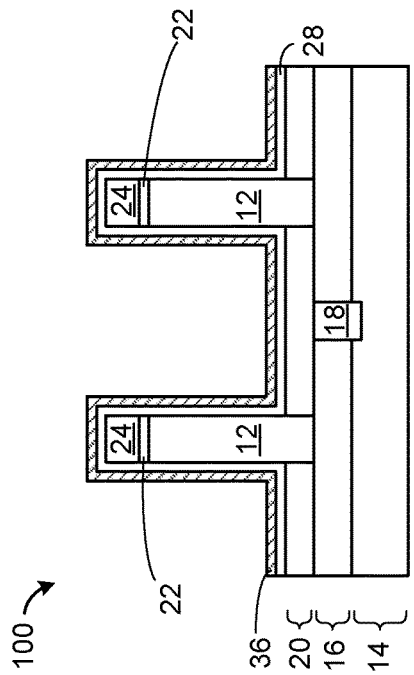

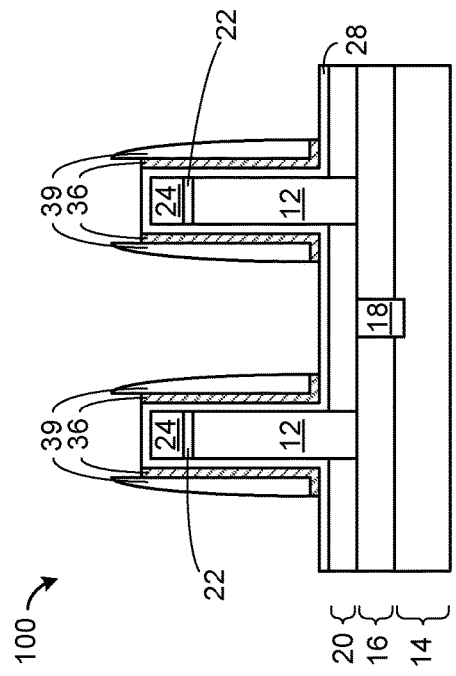
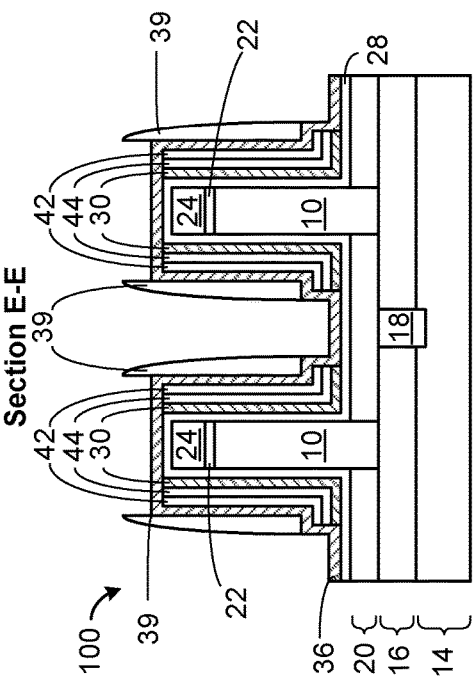
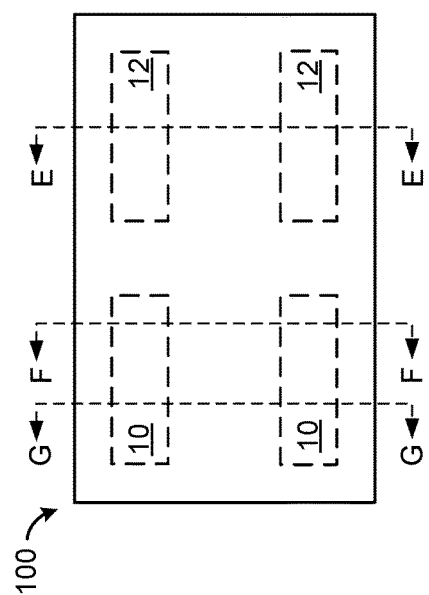
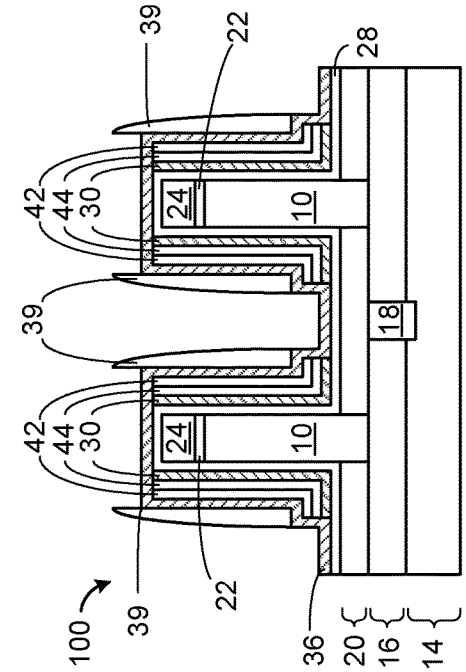

Section E-E

Section G-G

Section F-F

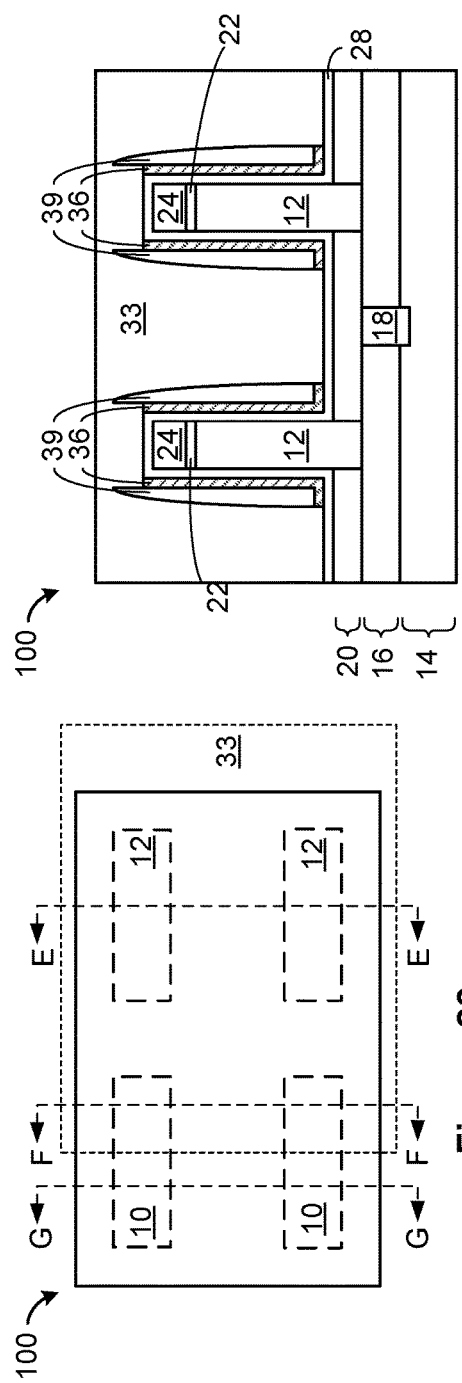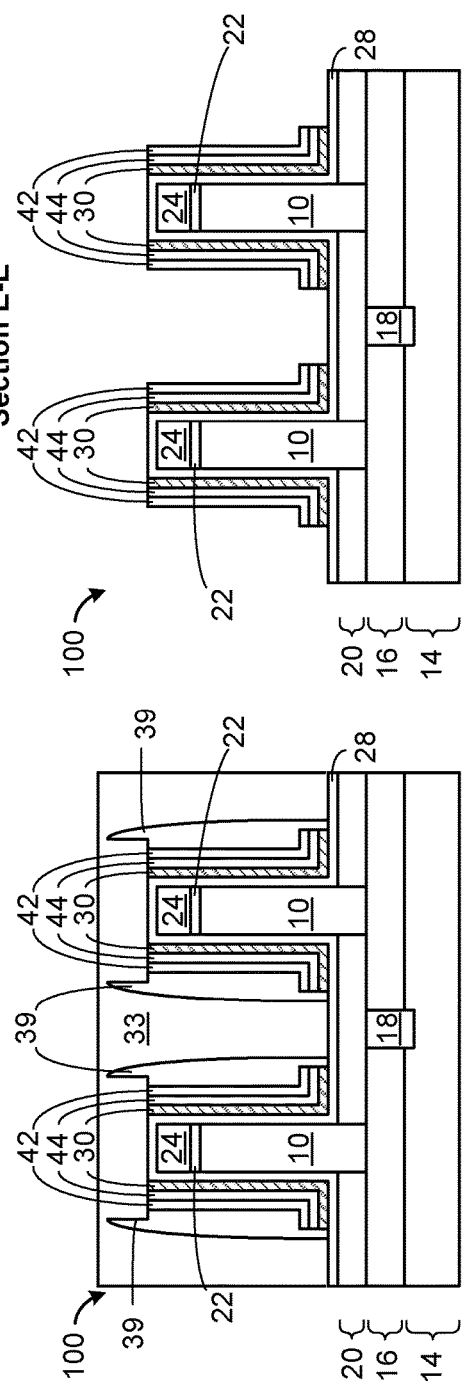
Figure 88
Figure 89
Section E-E
Figure 90
Section F-F
Figure 91
Section G-G

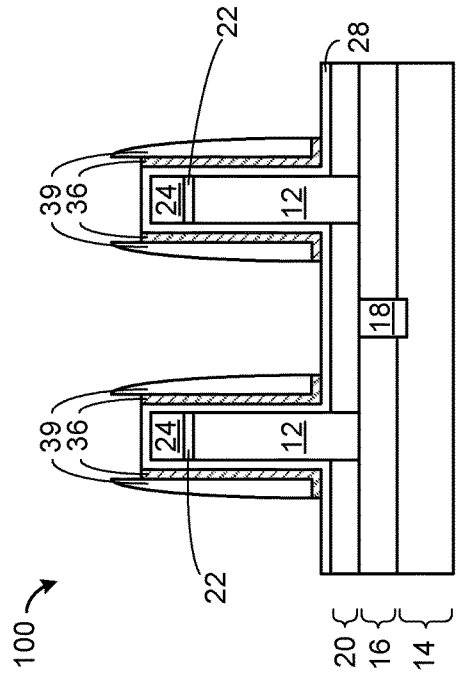
Figure 93
Section E-E
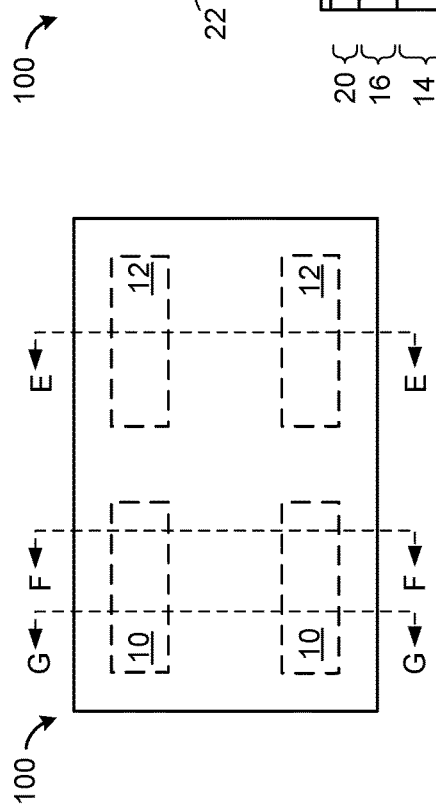
Figure 92
Figure 94
Section F-F
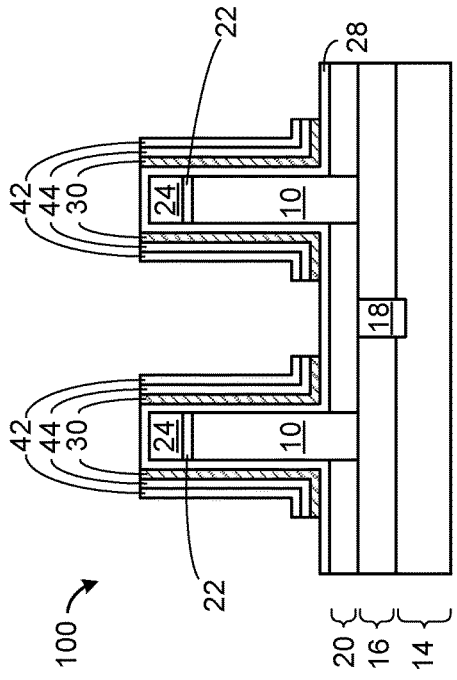
Figure 95
Section G-G
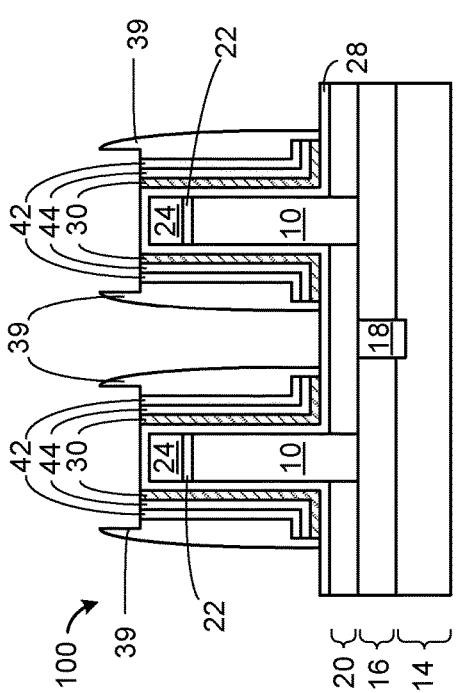

Section E-E

Section G-G

Section F-F

Section E-E

Section F-F

Section G-G

Section E-E

Section G-G

Section F-F

VFET METAL GATE PATTERNING FOR VERTICAL TRANSPORT FIELD EFFECT TRANSISTOR

BACKGROUND

The present invention relates, generally, to the field of semiconductor manufacturing, and more particularly to fabricating vertical field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. A vertical transport FET or vertical FET is a structure in which current flow is in the vertical direction flowing between a source/drain at a top of a fin and a second source/drain adjacent to a bottom of the fin, and a wrap-around gate surrounding a middle portion of the fin.

As demands to reduce the dimensions of transistor devices continue, vertical-type transistors such as vertical field effect transistors (vertical FETs or VFETs) help achieve a reduced FET device footprint while maintaining FET device performance. A vertical FET may use less surface area of a die than conventional FETs, which is needed with shrinking design rules. Patterning edge accuracy may limit reductions in dimensions.

SUMMARY

According to an embodiment of the present invention, a method is provided. The method forming a PFET work function metal layer on a p-type field effect transistor (PFET) fin in a PFET region and on an n-type field effect transistor (NFET) fin in an NFET region, where a thickness of the PFET work function metal layer is greater on a horizontal top surface of both the PFET fin and the NFET fin, than a thickness of the PFET work function metal layer on a vertical side surface of both the PFET fin and the NFET fin, removing a portion of the PFET work function metal layer between the PFET fin and the NFET fin, thinning the PFET work function metal layer, where a remaining portion of the PFET work function metal layer remains on a horizontal top surface of both the PFET fin and the NFET fin, a remaining portion of the PFET work function metal layer remains on a vertical side surface of both the PFET fin and the NFET fin, and a portion of a horizontal top surface of an insulator is exposed between the PFET fin and the NFET fin, patterning an organic planarization layer on the PFET work function metal layer, where the organic planarization layer covers the PFET region and partially covers the NFET region, removing the PFET work function metal layer in the NFET region, by etching isotropically selective to the organic planarization layer and an insulator in the NFET region, removing the organic planarization layer, and conformally forming an NFET work function metal layer on the semiconductor structure.

According to another embodiment, a method is provided. The method may include conformally forming a PFET work function metal layer on a p-type field effect transistor (PFET) fin in a PFET region and on an n-type field effect transistor (NFET) fin in an NFET region, conformally forming a sacrificial buffer on the PFET work function metal layer, conformally forming a cap layer on the sacrificial buffer, forming a sacrificial layer on the cap layer, where a thickness of the sacrificial layer is greater on a horizontal top surface of both the PFET fin and the NFET fin, than a thickness of the sacrificial layer on a vertical side surface of both the PFET fin and the NFET fin, removing a portion of the sacrificial layer, a portion of the cap layer, a portion of the sacrificial buffer and a portion of the PFET work function metal layer between the PFET fin and the NFET fin, where a portion of the sacrificial layer, a portion of the cap layer, a portion of the sacrificial buffer and a portion of the PFET work function metal layer remain on a horizontal top surface of both the PFET fin and the NFET fin, and on a vertical side surface of both the PFET fin and the NFET fin, and where a portion of a horizontal top surface of an insulator is exposed between the PFET fin and the NFET fin, forming an organic planarization layer on the sacrificial layer in the PFET region, on the portion of the horizontal top surface of the insulator between the PFET fin and the NFET fin, and partially on the NFET fin in the NFET region, removing the sacrificial layer, the cap layer, the sacrificial buffer and the PFET work function metal layer in the NFET region, using an isotropic etch, removing the organic planarization layer, conformally forming an NFET work function metal layer, where a horizontal top surface of the NFET work function metal layer on the PFET fin is a greater distance from a horizontal bottom surface of the PFET fin than a distance from a horizontal top surface of the NFET work function metal layer on the NFET fin to a horizontal bottom surface of the NFET fin, conformally forming a second sacrificial layer on NFET work function metal layer, where a thickness of the second sacrificial layer is greater on a horizontal top surface of both the PFET fin and the NFET fin, than a thickness of the second sacrificial layer on a vertical side surface of both the PFET fin and the NFET fin, removing a portion of the second sacrificial layer and a portion of the NFET work function metal layer between the PFET fin and the NFET fin, where a remaining portion of the second sacrificial layer and a remaining portion of the NFET work function metal layer remains on a horizontal top surface of both the PFET fin and the NFET fin, and on a vertical side surface of both the PFET fin and the NFET fin, where a second portion of the horizontal top surface of an insulator is exposed between the PFET fin and the NFET fin, patterning a second organic planarization layer on the second sacrificial layer, where the second organic planarization layer covers the NFET region, the second portion of the insulator, and partially covers the PFET region, and removing the second sacrificial layer and the NFET work function metal layer from a the PFET region, selective to the second organic planarization layer and the PFET work function metal, using an isotropic etch.

According to another embodiment, a structure is provided, the structure including a p-type field effect transistor (PFET) bottom source drain region on the semiconductor substrate, an n-type field effect transistor (NFET) bottom source drain region on the semiconductor substrate, a PFET fin on the PFET source drain region, an NFET fin on the NFET source drain region, a PFET work function metal layer conformally surrounding a portion of vertical sidewalls of the PFET fin, and over a horizontal top surface of the PFET fin, an organic planarization layer, where the organic planarization layer covers the PFET fin and partially covers the NFET fin, and an opening between the organic planarization layer and the NFET fin.

BRIEF DESCRIPTION OF THE DRAWINGS

The following detailed description, given by way of example and not intended to limit the invention solely thereto, will best be appreciated in conjunction with the accompanying drawings, in which:

FIG. 64 illustrates a top view of the semiconductor structure and illustrates forming a photo resist mask, according to an exemplary embodiment;

FIGS. 65, 66, and 67 are each cross-sectional views of FIG. 64 along section lines B-B, C-C, and D-D, respectively, according to an exemplary embodiment;

FIG. 72 illustrates a top view of the semiconductor structure and illustrates removing the photo resist mask, according to an exemplary embodiment;

FIGS. 73, 74, and 75 are each cross-sectional views of FIG. 72 along section lines B-B, C-C, and D-D, respectively, according to an exemplary embodiment;

FIG. 76 illustrates a top view of the semiconductor structure and illustrates forming a second work function metal layer, according to an exemplary embodiment;

FIGS. 77, 78, and 79 are each cross-sectional views of FIG. 76 along section lines B-B, C-C, and D-D, respectively, according to an exemplary embodiment;

FIG. 80 illustrates a top view of the semiconductor structure and illustrates forming a third sacrificial material, according to an exemplary embodiment;

FIGS. 81, 82, and 83 are each cross-sectional views of FIG. 80 along section lines B-B, C-C, and D-D, respectively, according to an exemplary embodiment;

FIG. 88 illustrates a top view of the semiconductor structure and illustrates removing a portion of the second work function metal layer, according to an exemplary embodiment;

FIGS. 89, 90, and 91 are each cross-sectional views of FIG. 88 along section lines B-B, C-C, and D-D, respectively, according to an exemplary embodiment;

FIG. 92 illustrates a top view of the semiconductor structure and illustrates removing the second photo resist mask, according to an exemplary embodiment;

FIGS. 93, 94, and 95 are each cross-sectional views of FIG. 92 along section lines B-B, C-C, and D-D, respectively, according to an exemplary embodiment;

Figure 1:
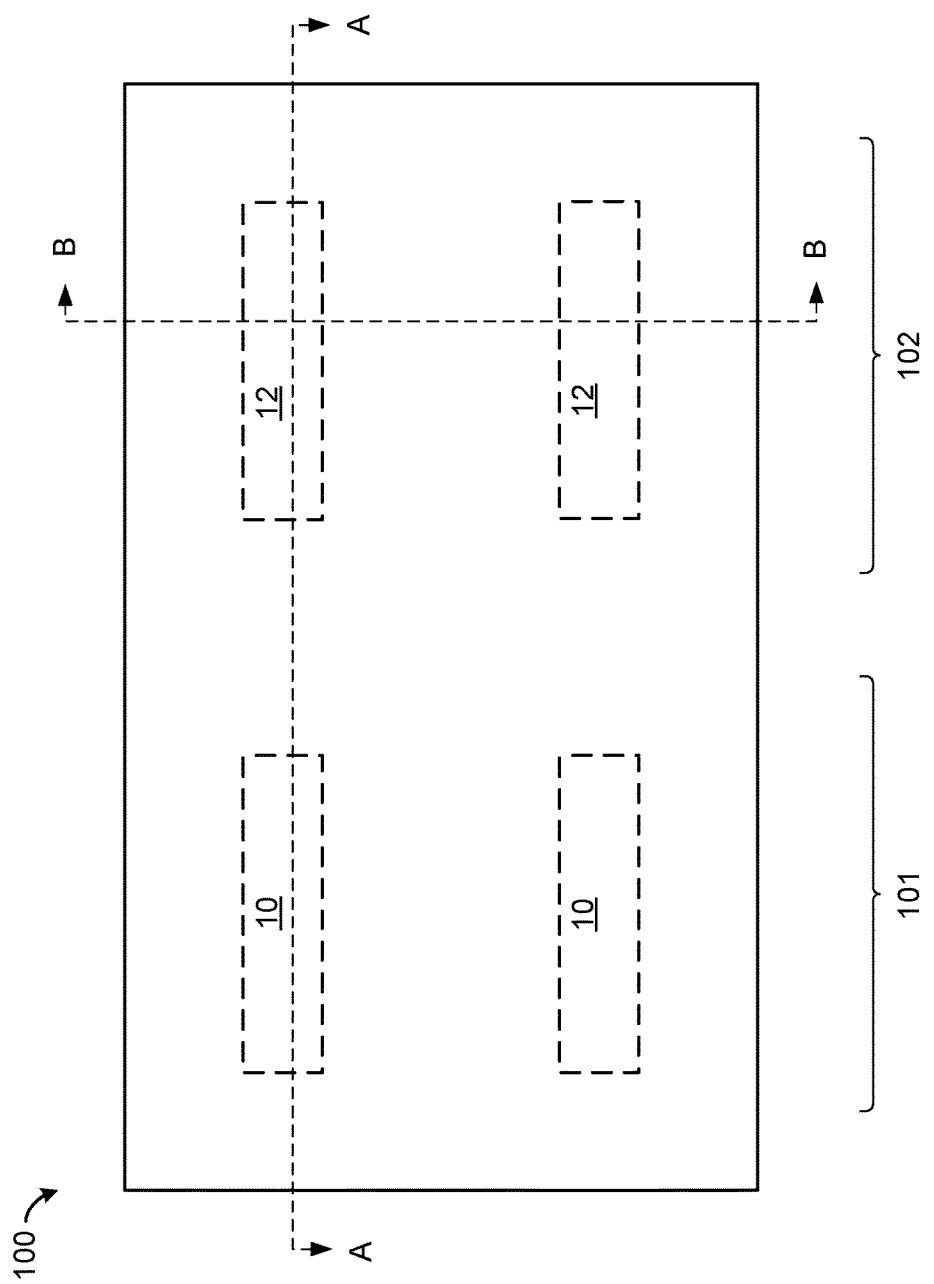
FIG. 1 illustrates a top view of a semiconductor structure, according to an exemplary embodiment.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

The present invention generally relates to semiconductor manufacturing and more particularly to fabrication of vertical field effect transistor (hereinafter "FET").

The vertical FET fabrication process may include processing a gate fabricated from a metal stack conformally deposited over a substrate, including a gate or a fin of the FET. Additionally, the vertical FET may require one metal stack for a positive channel field effect transistor (hereinafter "P-FET") gate, and a different metal stack for a negative channel field effect transistor (hereinafter "N-FET") gate. To isolate and form individual devices and provide landing pads or connection pads for contacts, the gate metal of one device may be patterned to electrically isolate from the gate metal of an adjacent device. One technique to do this is direct gate patterning. Direct gate patterning consists of a lithography (or photolithography), dry etch and wet etch steps. It is important to avoiding damaging the gate metal during patterning to avoid device degradation. It may be challenging to strip lithography layers to perform the gate cut without simultaneously damaging the gate metal.

Photolithography may use a photo resist for patterning a mask, where remaining portions of the mask over an area surrounding a feature, such as a fin, may be blocked from subsequent processing. Lithography or photolithography minimum spacing size may limit a density of FETs on a semiconductor structure. Alternative methods may be used to form different metal stacks in different areas of the semiconductor substrate and achieve a spacing between different metal stacks being smaller than lithography minimum spacing size. For example, spacing between adjacent gates or fins may be about 30 nm, and subsequent layering may reduce spacing between adjacent gates or fins to about 13 nm. Current lithography may not be able to pattern between gates or fins, for example 6.5 nm, and an alternate method is needed to remove material between gates or fins.

The present invention may cut the metal stack using self-alignment techniques to electrically isolate the metal stack between gates, fins, or other features. Specifically, masking portions of the device and lateral etching may be used to cut and electrically isolate the metal stacks from adjacent devices. A photolithography mask may cover a region where the metal stack, for example a gate of a fin, is to be preserved, and the photolithography mask may extend to partially cover a second region where the metal stack, for example a gate of a second fin, is to be removed. The lateral etching may remove metal from the partially covered second region, etching from a top surface and from a sidewall. Using this method can result in a first metal gate over a first fin, and an electrically isolated second metal gate over a second fin, where a lithography spacing between the first fin and the second fin is smaller than lithography minimum spacing.

A method of cutting metal or removing portions of the metal stack between adjacent fins and then performing lateral etching of the metal gate to enable metal gate patterning is described in detail below by referring to the accompanying drawings in FIGS. 1-107, in accordance with an illustrative embodiment. In the present embodiment, a PFET work function metal is applied to the structure including PFET fins and NFET fins, a photo resist mask is applied to cover the PFET fins and partially cover the NFET fins, a lateral etch is used to remove the PFET work function metal from the NFET fins, and an NFET work function metal is applied to the structure. In an alternate embodiment, the NFET metal is applied to the structure including the NFET fins and the PFET fins, a photo resist mask is applied to cover the NFET fins and partially cover the PFET fins, a lateral etch is used to remove the NFET work function metal from the PFET fins, and a PFET function metal is applied to the structure.

Referring to FIG. 1, a semiconductor structure 100 (hereinafter "structure") is shown in a top view, according to an exemplary embodiment. The structure 100 may be formed or provided. At this step of the manufacturing process, a beginning structure of a field effect transistor (hereinafter "FET") is shown. The FET may be formed on the structure 100 according to techniques known in the art. A fin 10 may be formed on the structure 100 and may subsequently form the basis for a positive channel field effect transistor (hereinafter "P-FET"). A fin 12 may be formed on the structure 100 and may subsequently form the basis for a negative channel field effect transistor (hereinafter "N-FET"). As shown in FIG. 1, there are two fins 10 and two fins 12. There may be one or more fins 10 and one or more fins 12. Additional structures, (not shown), may be formed on the structure 100. In an alternate embodiment the one or more fins 10 and the one or more fins 12 may each be a gate structure. The one or more fins 10 may be in a PFET region 101 of the structure 100. The one or more fins 12 may be in an NFET region 102 of the structure 100.

A vertical FET device may include a plurality of gates, fins, or other structures, formed on the structure 100. In this example, the vertical FET may be formed using known photolithography and etch processes.

A vertical FET device may include a plurality of gates or fins formed in a substrate and a wrap-around gate covering a portion of each of the fins. The portion of each of the fins covered by the gate may serve as a channel region of the device. In the context of a vertical FET, a top source drain region of the device may be located above the fin and a bottom source drain region may be located adjacent to a lower portion of a side of the fin.

Figure 2:
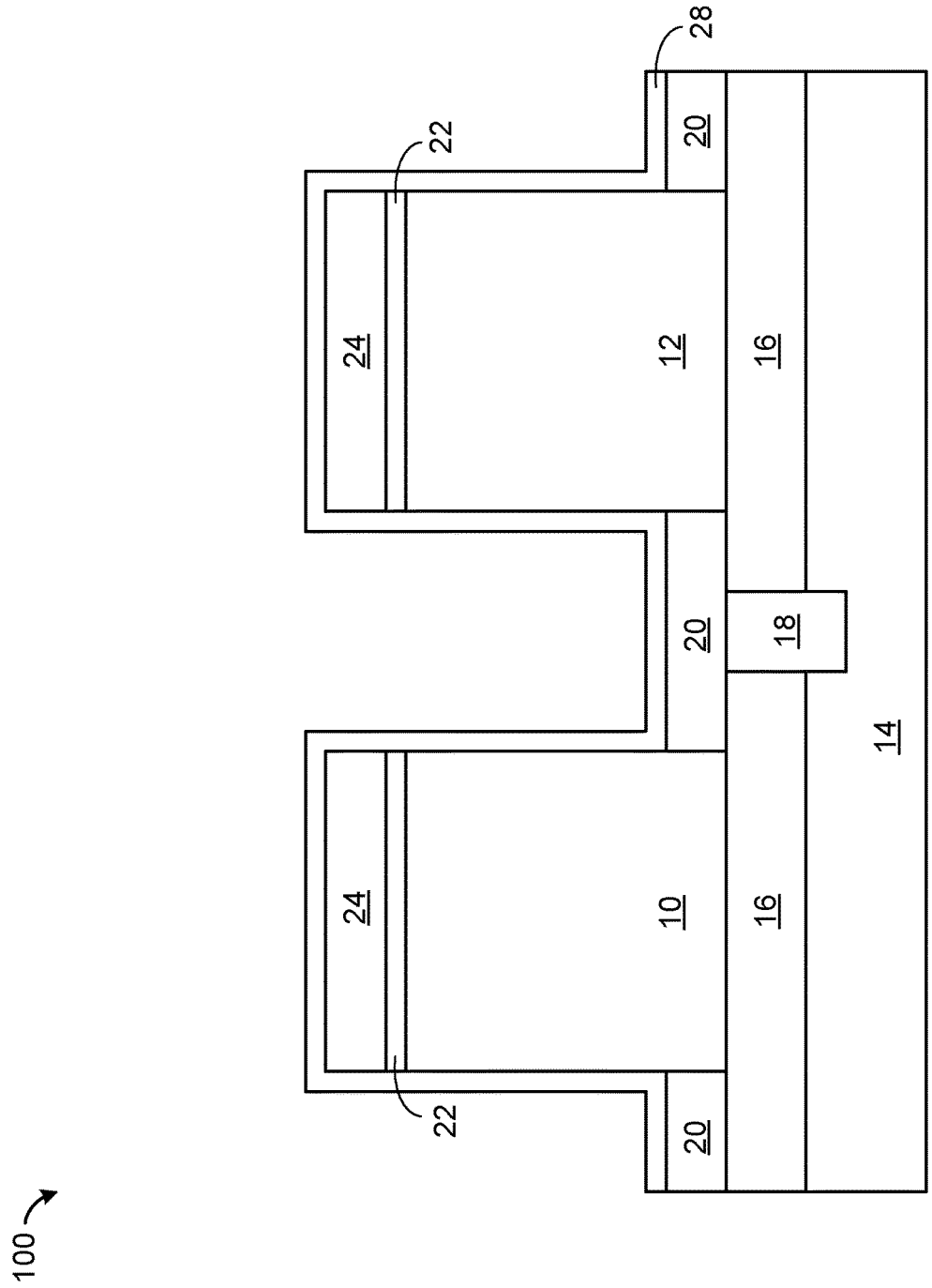
FIG. 2 illustrates a cross-sectional view of the semiconductor structure at an intermediate step of fabrication, according to an exemplary embodiment.
Figure 3:
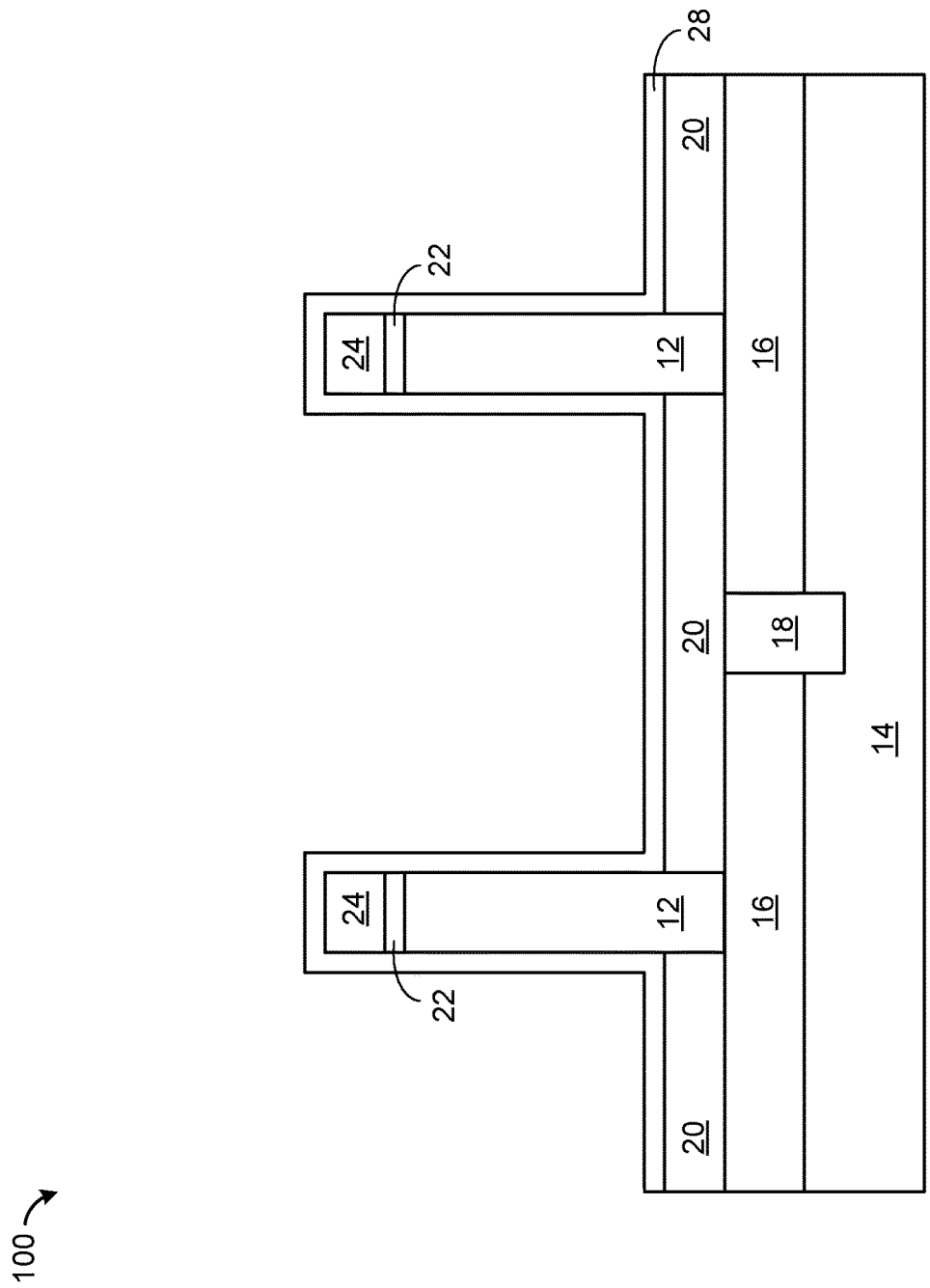
FIG. 3 illustrates a cross-sectional view of the semiconductor structure at an intermediate step of fabrication, according to an exemplary embodiment.

Referring to FIGS. 2 and 3, the structure 100 is shown according to an exemplary embodiment. FIG. 2 is a cross section view of FIG. 1 taken along section line A-A. FIG. 3 is a cross section view of FIG. 1 taken along section line B-B.

It should also be noted, that in the context of vertical FET devices, the portion of the structure 100 illustrated in FIG. 2 represents a cross-section view along the length of the fins 10 and 12, and the portion of the structure 100 illustrated in FIG. 3 represents a cross-section view along a width of the fin 12.

The structure 100 may include a substrate 14. The substrate 14 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. In other embodiments, the substrate 14 may be, for example, a layered semiconductor such as Si/SiGe, a silicon-on-insulator, or a SiGe-on-insulator, where a buried insulator layer separates a base substrate from a top semiconductor layer. In such cases, components of the structure 100 may be formed in or from the top semiconductor layer of the SOI substrate. Typically, the substrate 14 may be approximately, but is not limited to, several hundred microns thick.

An epitaxy 16 may be formed on an exposed top surface of the substrate 14. The epitaxy 16 may form a bottom source/drain region of an FET. The epitaxy 16 may be selectively grown on exposed surfaces of the substrate 14. Examples of various epitaxial growth techniques used in forming the epitaxy 16 may include, for example, rapid thermal chemical vapor deposition, low energy cluster beam deposition, ultra-high vacuum chemical vapor deposition, and atmospheric pressure chemical vapor deposition. In some cases, the epitaxy 16 may be formed directly on the substrate 14, as shown in FIGS. 2 and 3. The epitaxy 16 may be doped during the epitaxy process (in-situ doping) or after the epitaxy process (ex-situ doping). A non-limiting list of exemplary epitaxial materials are: silicon germanium alloy (SiGe), silicon (Si), in-situ boron doped SiGe or Si, in situ phosphorus or arsenic doped Si or SiGe, with doping levels ranging from $1E19/cm^3$ to $1.5E21\ cm^3$, with $4E20\ cm^3$ to $9E20\ cm^3$ dopant levels preferred. The epitaxy 16 in an area adjacent to the fin 10 may be silicon germanium doped for a subsequently formed P-FET. The epitaxy 16 in an area adjacent to the fin 12 may be boron doped for a subsequently formed N-FET. Thermal anneal such as laser anneal, rapid thermal anneal, flash anneal may be performed to activate dopants. In an embodiment, the epitaxy 16 may be about 10 nm deep, although depths less than 10 nm and greater than 10 nm may be acceptable.

A shallow trench isolation region (hereinafter "STI") 18 may be formed using any known patterning technique, according to an embodiment. The STI 18 may be embedded in the substrate 14 where a portion of the substrate 14 and a portion of the epitaxy 16 has been removed between adjacent fins, for example the fin 10 and the fin 12. After formation of the STI 18, a portion of the epitaxy 16 may remain between the fins 10, 12, and the STI 18. The STI 18 may isolate a source drain region of the epitaxy 16 adjacent to the fin from a source drain region of the epitaxy 16 adjacent to an adjacent fin, for example the fin 10 and the fin 12. A horizontal top surface of the STI 18 may be essentially coplanar with a horizontal top surface of the epitaxy 16. In an embodiment, the STI 18 is formed by lithography and etch techniques. Alternatively, the STI 18 may be patterned by sidewall image transfer (SIT) technique. In an embodiment, the STI 18 may be 30 nm deep below a surface of the epitaxy 16 which is adjacent to the STI 18, although depths greater than 30 nm and less than 30 nm may be acceptable. A width of the STI 18 may range from 20 nm to 50 nm, and ranges there between, although a width less than 20 nm and greater than 50 nm may be acceptable depending on spacing between individual devices.

At this point in the manufacturing process, there may be one or more fins 10 and one or more fins 12. The fins 10, 12, may be formed above or on top of the epitaxy 16, where a horizontal bottom surface of the fin may be horizontally coplanar with a top surface of a portion of the epitaxy 16. In an embodiment, the fins 10, 12, may have a horizontal width, between 8 nm-15 nm, a height of 80 nm-100 nm, and a pitch of 36 nm-54 nm between adjacent fins. The fins 10, 12, may have a length of 40 nm-90 nm.

An insulator 22 may cover a top horizontal surface of the fins 10, 12. The insulator 22 may be an adhesion layer between a channel region and a hard mask of the structure 100. The insulator 22 may include oxide, nitride, oxynitride, silicon carbon oxynitride, silicon boron oxynitride, low-k dielectric, or any combination thereof. The insulator 22 may be deposited using typical deposition techniques, for example, atomic layer deposition (ALD), molecular layer deposition (MLD), chemical vapor deposition (CVD), physical vapor deposition (PVD), and spin on techniques. The insulator 22 may be formed over the fins 10, 12. In an embodiment, the insulator 22 may include one or more layers. In an embodiment, the insulator 22 may have a vertical thickness, or height, about 1 nm to 5 nm, and ranges there between.

There may be a hard mask 24 covering a horizontal top surface of the insulator 22 above the fins 10, 12. In an embodiment, the hard mask 24 may be about 45 nm high above a surface of the insulator 22, although depths less than 45 nm and greater than 45 nm may be acceptable.

A spacer 20 may cover an area between adjacent fins 10, 12. The spacer 20 may be formed by conformally depositing or growing a dielectric material, followed by a combination of dry and wet anisotropic etch and recessing steps to remove the dielectric material from a top of the hard mask 24 and from vertical surfaces of the structure 100, such as sidewalls of the fins 10, 12, the fins 10, 12, and sidewalls of the hard mask 24. After removal of portions of the dielectric material from the top of the hard mask 24 and from vertical surfaces of the sidewalls of the fins 10, 12, and the hard mask 24, the dielectric material may remain on an exposed top surface of the STI 18, and an exposed top surface of the epitaxy 16, forming the spacer 20. The spacer 20 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the spacer 20 may include one or more layers. The spacer 20 may cover a top surface of the STI 18 and a top surface of the epitaxy 16. In an embodiment, the spacer 20 may include any dielectric material such as silicon oxide, silicon oxynitride, silicon nitride, SiBCN, SiOC, low-k dielectric or any combination of these materials. In an embodiment, the spacer 20 may be nitride. In an alternate embodiment, the spacer 20 may be oxide. In an embodiment, the spacer 20 may have a thickness ranging from about 5 nm to about 15 nm, and ranges there between, although a thickness less than 5 nm and greater than 15 nm may be acceptable.

There may be an insulator 28 conformally deposited on exposed surfaces of the structure 100, according to an exemplary embodiment. The insulator 28 may be formed on a top surface of the spacer 20, on a portion of a vertical side surface of the fins 10, 12, on a vertical side surface of the insulator 22, and the hard mask 24, and on a horizontal top surface of the hard mask 24. The insulator 28 may be deposited using typical deposition techniques, for example, atomic layer deposition (ALD), molecular layer deposition (MLD), chemical vapor deposition (CVD), physical vapor deposition (PVD), and spin on techniques, followed by an anisotropic vertical etch process such as a reactive ion etch (RIE), wets, or any suitable etch process. The material of the insulator 28 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulator 28 may further include dopants such as lanthanum and aluminum. In an embodiment, the insulator 28 may include hafnium oxide. In an embodiment, the insulator 28 may have a thickness ranging from about 1 nm to about 2 nm and ranges there between, although a thickness less than 1 nm and greater than 2 nm may be acceptable. In some cases, the insulator 28 may be referred to, and function as, a gate dielectric.

In an embodiment, there may be an interfacial layer formed prior to forming the insulator 28. The interfacial layer may be formed on a top surface of the spacer 20, on a portion of a vertical side surface of the fins 10, 12, on a vertical side surface of the insulator 22, and the hard mask 24, and on a horizontal top surface of the hard mask 24. The interfacial layer may be formed using any known patterning technique, for example chemical or thermal techniques. The interfacial layer may include silicon oxide, and silicon oxynitride, or any combination thereof.

FIGS. 4-43 each illustrate a cross sectional view of FIG. 1 taken along section line A-A of FIG. 1.

Figure 4:
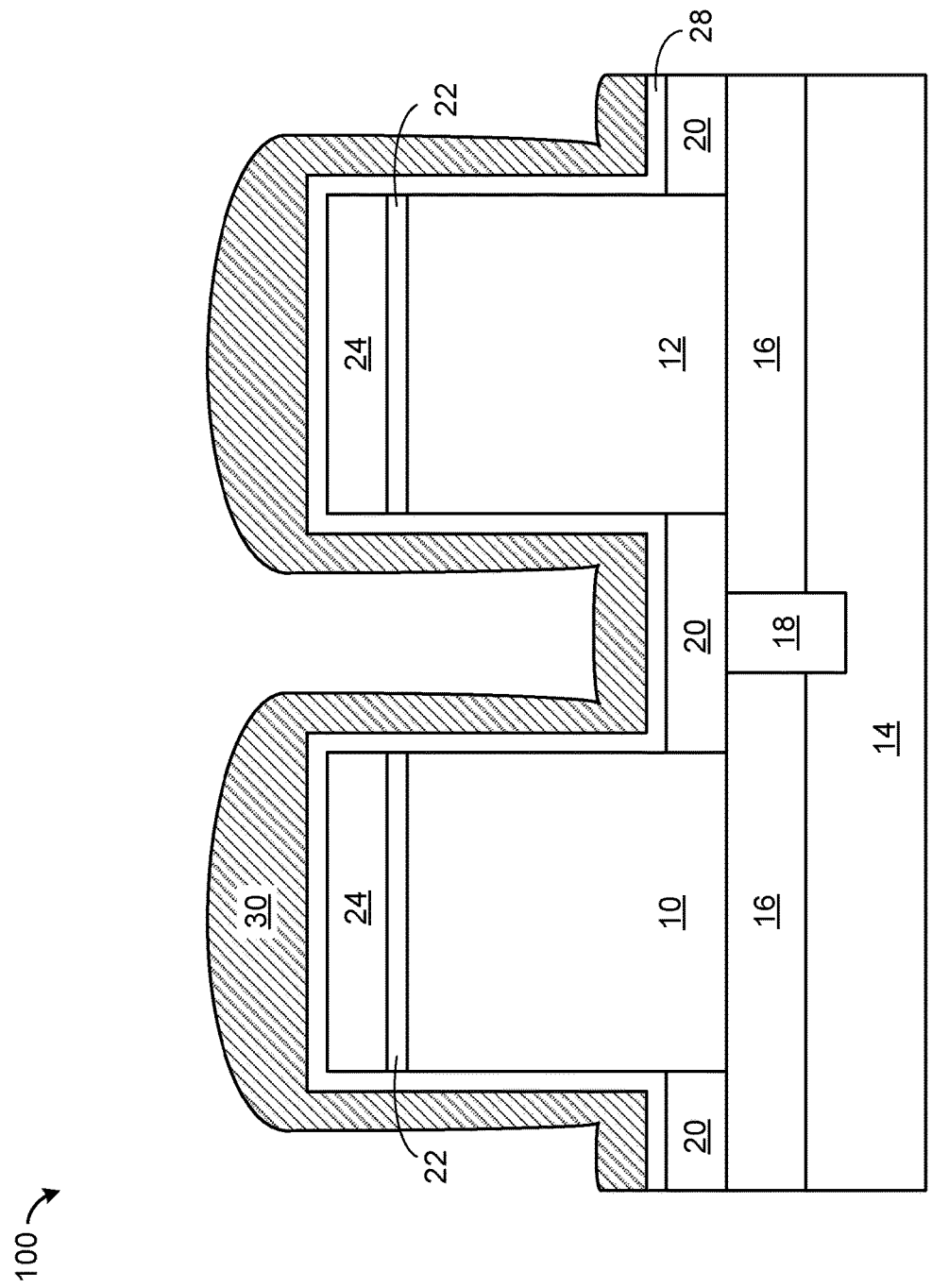
FIG. 4 illustrates a cross-sectional view of the semiconductor structure and illustrates forming a work function metal layer, according to an exemplary embodiment.

Referring to FIG. 4, a PFET work function metal layer (hereinafter "PFET WFM") 30 may be formed on exposed top surfaces of the structure 100, according to an exemplary embodiment. The PFET WFM 30 may have a non-conformal top surface with a greater thickness above the fin 10 and above the fin 12 compared to a thickness between the fins 10, 12. The PFET WFM 30 may be deposited using typical physical vapor deposition (PVD). In an embodiment, a combination of deposition techniques, such as conventional PVD and modified PVD derivatives, for example directional PVD deposition, may be used. In an embodiment, the PFET WFM 30 may include one or more layers. The PFET WFM 30 may be deposited on a top surface of the insulator 28. In an embodiment, the PFET WFM 30 may include a work function metal, including a metal nitride, for example, titanium nitride or tantalum nitride, titanium carbide or titanium aluminum carbide. In an embodiment, the PFET WFM 28 may have a thickness ranging from about 3 nm to about 8 nm, and ranges there between, although a thickness less than 3 nm and greater than 8 nm may be acceptable.

Figure 5:
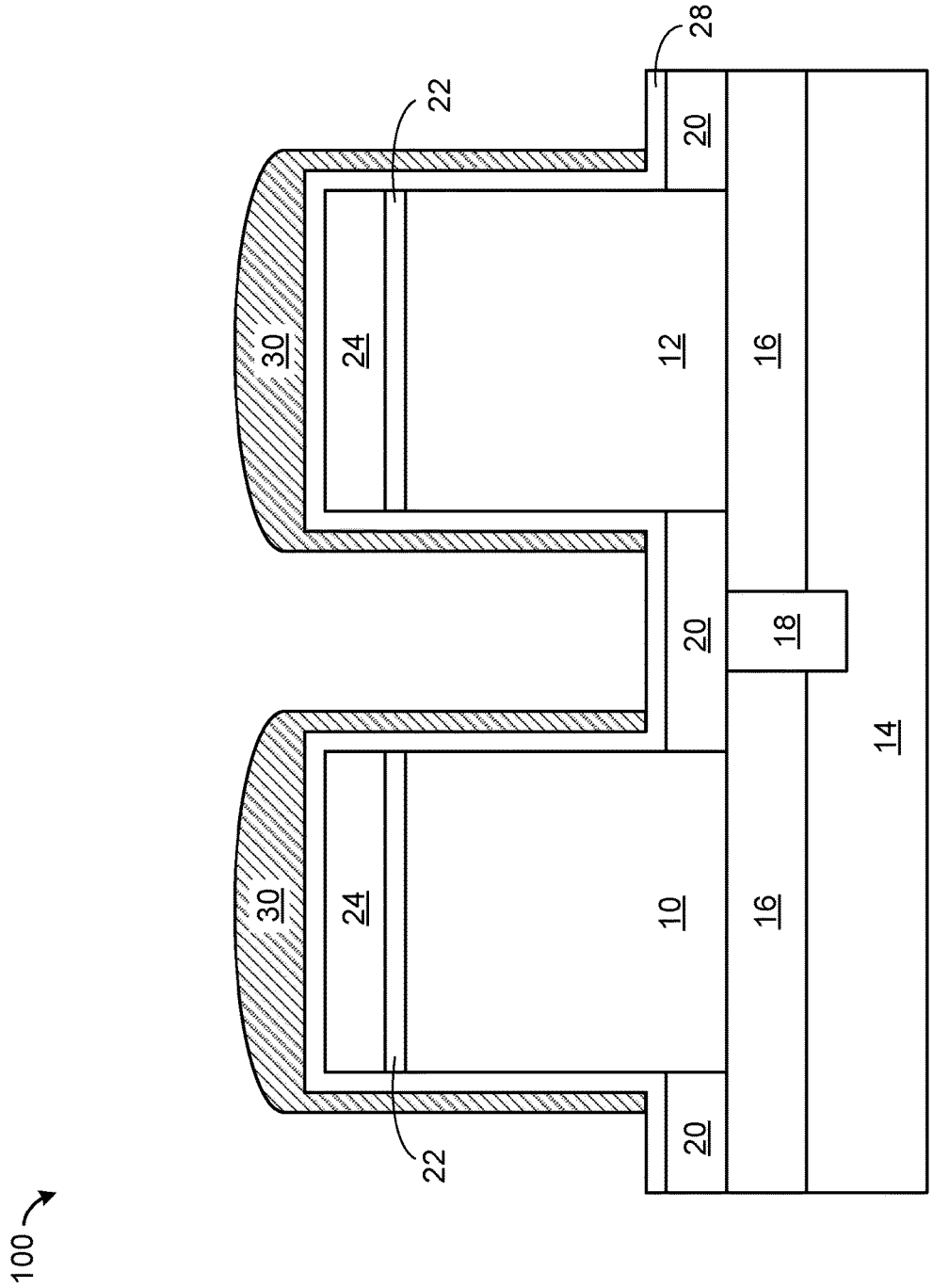
FIG. 5 illustrates a cross-sectional view of the semiconductor structure and illustrates reducing the work function metal layer, according to an exemplary embodiment.

Referring to FIG. 5, the PFET WFM 30 may be recessed/etched, according to an exemplary embodiment. The PFET WFM 30 may be etched using an anisotropic vertical etch process such as a reactive ion etch (RIE), wets, or any suitable etch process. Due to the greater thickness of the PFET WFM 30 above the fin 10 and above the fin 12 compared to the thickness between the fins 10, 12, the PFET WFM 30 may be removed only in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the PFET WFM 30, and the insulator 28 may remain alongside a portion of a vertical sidewall of the fin 10 and alongside a portion of a vertical sidewall of the fin 12. The PFET WFM 30 may remain on a horizontal top surface of the fin 10, and on a horizontal top surface of the fin 12.

Figure 6:
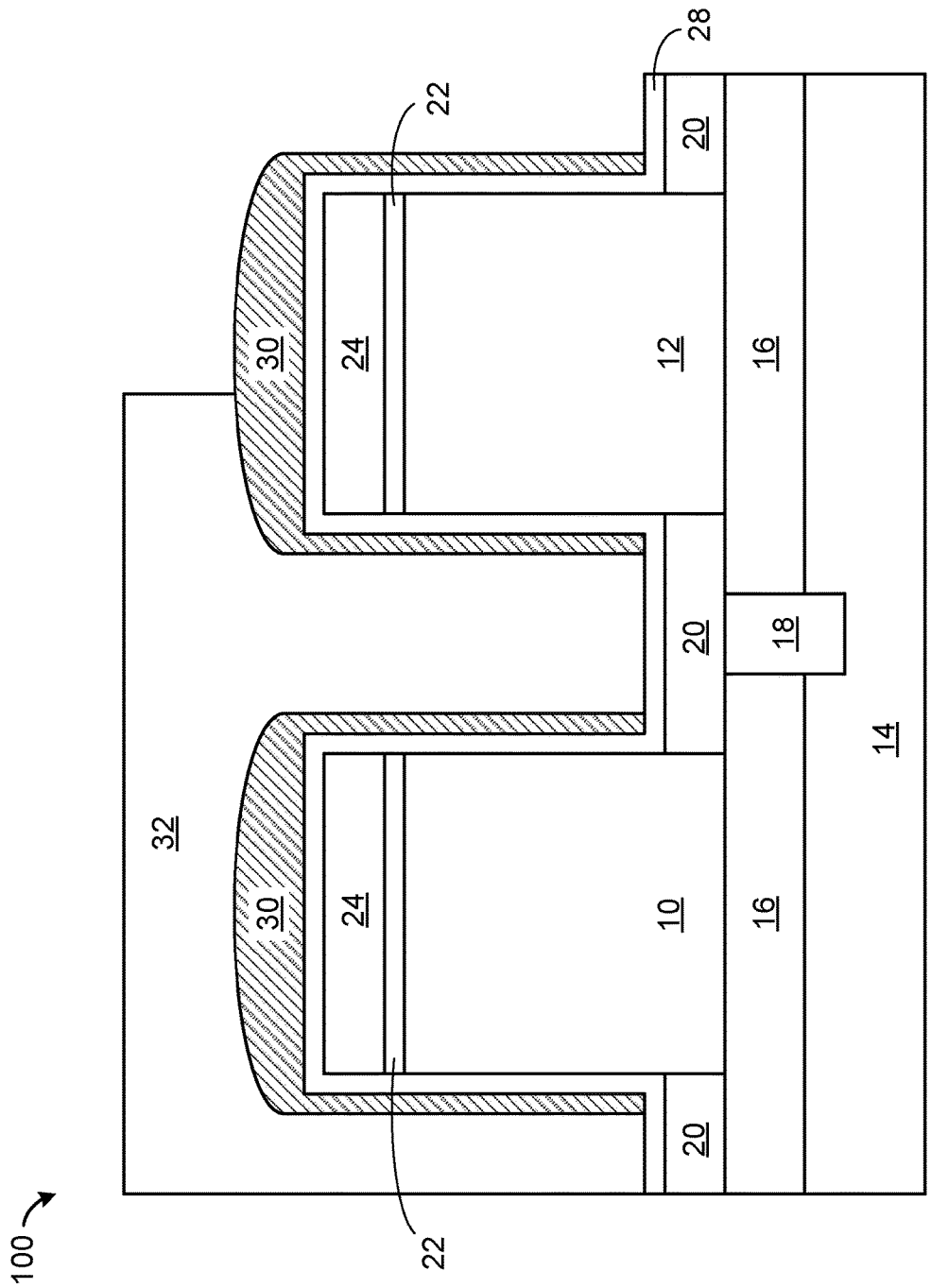
FIG. 6 illustrates a cross-sectional view of the semiconductor structure and illustrates forming a photo resist mask, according to an exemplary embodiment.

Referring to FIG. 6, an organic planarization layer 32 may be deposited and patterned on the structure 100, according to an exemplary embodiment. The organic planarization layer 32 may be formed on the PFET WFM 30. In an embodiment, the organic planarization layer 32 may completely cover the PFET WFM 30 along the top and the vertical sidewalls of the fin 10 and may partially cover the PFET WFM 30 along the top and the vertical sidewalls of the fin 12. In an alternate embodiment, the organic planarization layer 32 may completely cover the PFET WFM 30 along the top and the vertical sidewalls of the fin 10 and may not cover the PFET WFM 30 along the top and the vertical sidewalls of the fin 12. The organic planarization layer 32 may be spin coated and optionally polished using a chemical mechanical polishing (CMP) technique. In an embodiment, the organic planarization layer 32 may include a three-layer stack, including an organic planarization layer (OPL), a hard mask, and a photo resist. The hard mask deposition may be deposited on the organic planarization layer 32. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 32 by reactive ion beam etching. The organic planarization layer 32 may protect an area over the fin 10 from subsequent processing steps, allowing separate processing in the area surrounding the fin 10 and an area surrounding the fin 12. The organic planarization layer 32 may have a height ranging from about 100 nm to 300 nm, and ranges there between, although a thickness less than 100 nm and greater than 300 nm may be acceptable.

Figure 7:
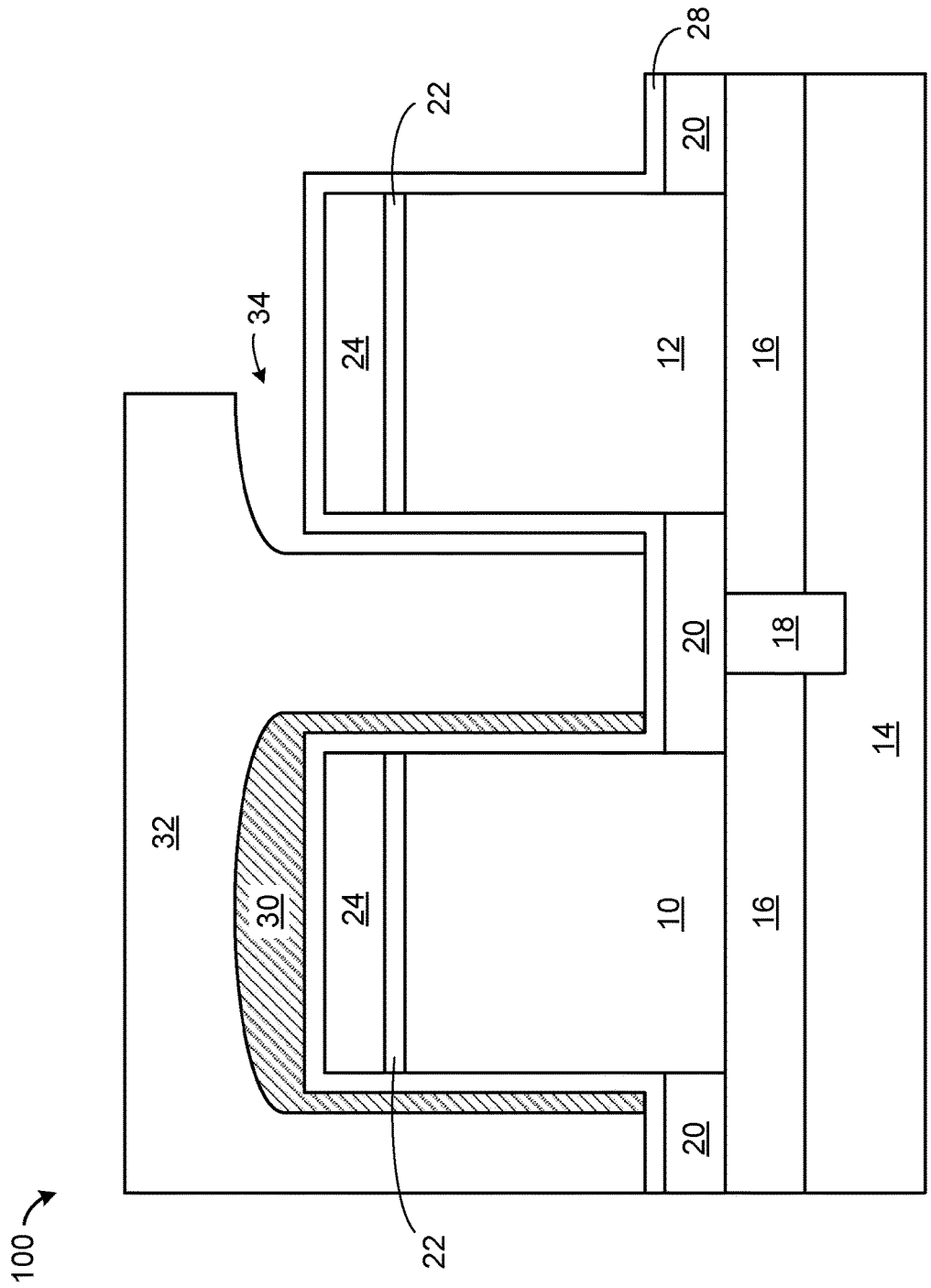
FIG. 7 illustrates a cross-sectional view of the semiconductor structure and illustrates partially removing the work function metal layer, according to an exemplary embodiment.

Referring to FIG. 7, a first opening 34 may be formed by recessing/etching the PFET WFM 30 selective to the organic planarization layer 32 and a portion of the insulator 28, according to an exemplary embodiment. Specifically, the PFET WFM 30 may be laterally removed from the top and along the vertical sidewalls of the fin 12. The first opening 34 may be formed using an etch chemistry selective to the organic planarization layer 32 and the insulator 28. The organic planarization layer 32 may protect a portion of the PFET WFM 30 in an area above and surrounding a portion of the vertical sidewalls of the fin 10. This allows the PFET WFM 30 to remain on the fin 10, which is a PFET fin, and be removed from the fin 12, which is an NFET fin. The PFET WFM 30 may be removed in an area between the fin 10 and the fin 12. A top surface of the insulator 28 may be exposed along a portion of a vertical sidewall of the fin 12 and in an area between the fin 10 and the fin 12. A portion of the insulator 28 may remain alongside a portion of the vertical sidewall of the fin 12.

The organic planarization layer 32 may be subsequently removed after etching according to known techniques.

Figure 8:
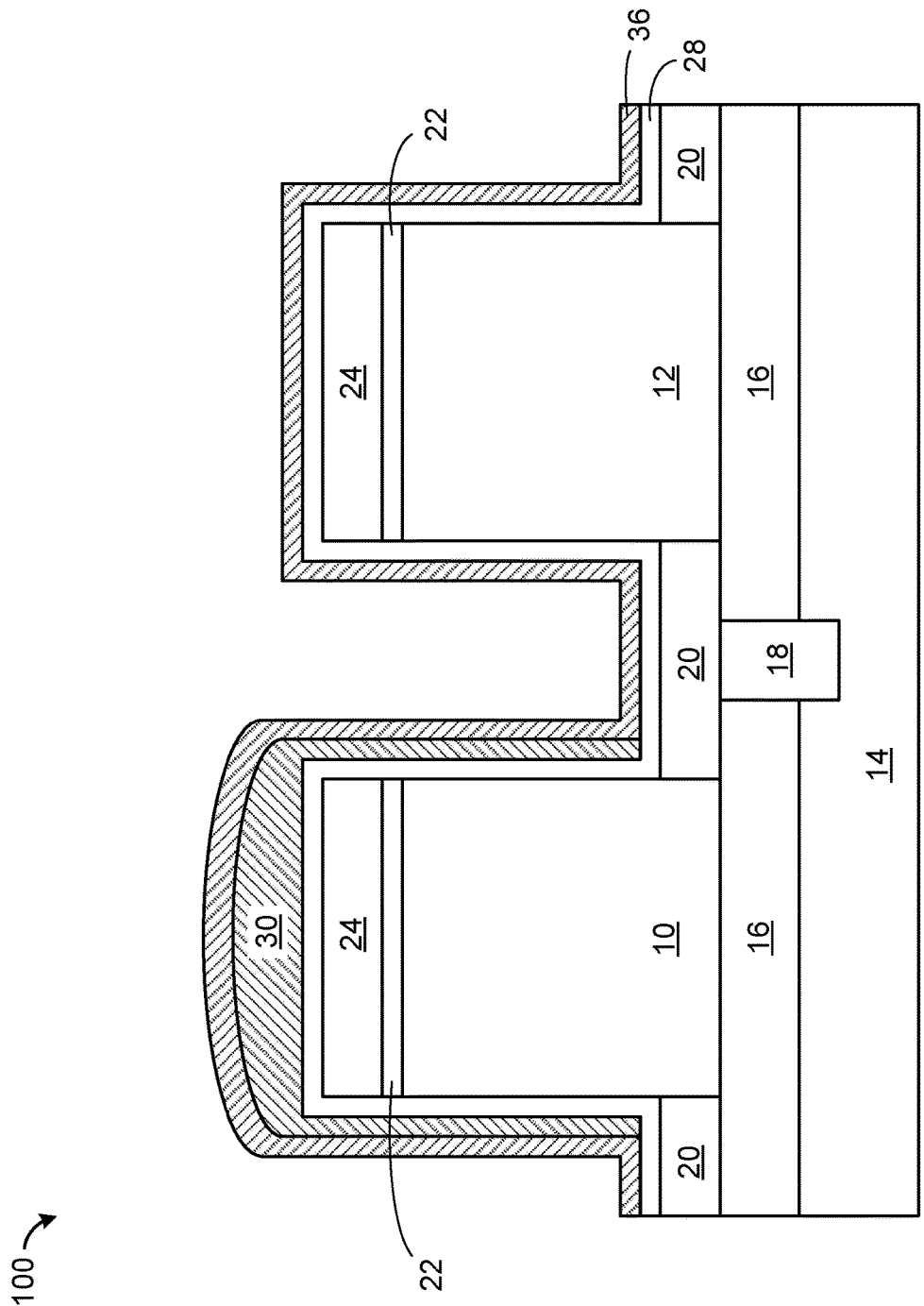
FIG. 8 illustrates a cross-sectional view of the semiconductor structure and illustrates forming a second work function metal layer, according to an exemplary embodiment.

Referring to FIG. 8, an NFET work function metal layer (hereinafter "NFET WFM") 36 may be conformally formed on the structure 100, according to an exemplary embodiment. The NFET WFM 36 may be deposited using typical deposition techniques, for example, atomic layer deposition (ALD), molecular layer deposition (MLD), and chemical vapor deposition (CVD). In an embodiment, the NFET WFM 36 may include one or more layers. The NFET WFM 36 may be deposited on a top surface of the insulator 28 along the horizontal top surface and a portion of the vertical side walls of the fin 12. The NFET WFM 36 may be deposited on a top surface of the PFET WFM 30 along the top surface and a portion of the vertical side walls of the fin 10. The NFET WFM 36 may be deposited on a portion of the horizontal top surface of the insulator 28 between the fins 10 and 12. In an embodiment, the NFET WFM 36 may include a work function metal including titanium aluminum carbide and may include a different work function metal than the PFET WFM 30. In an embodiment, the NFET WFM 36 may have a conformal thickness ranging from about 3 nm to about 8 nm, and ranges there between, although a thickness less than 3 nm and greater than 8 nm may be acceptable.

Figure 9:
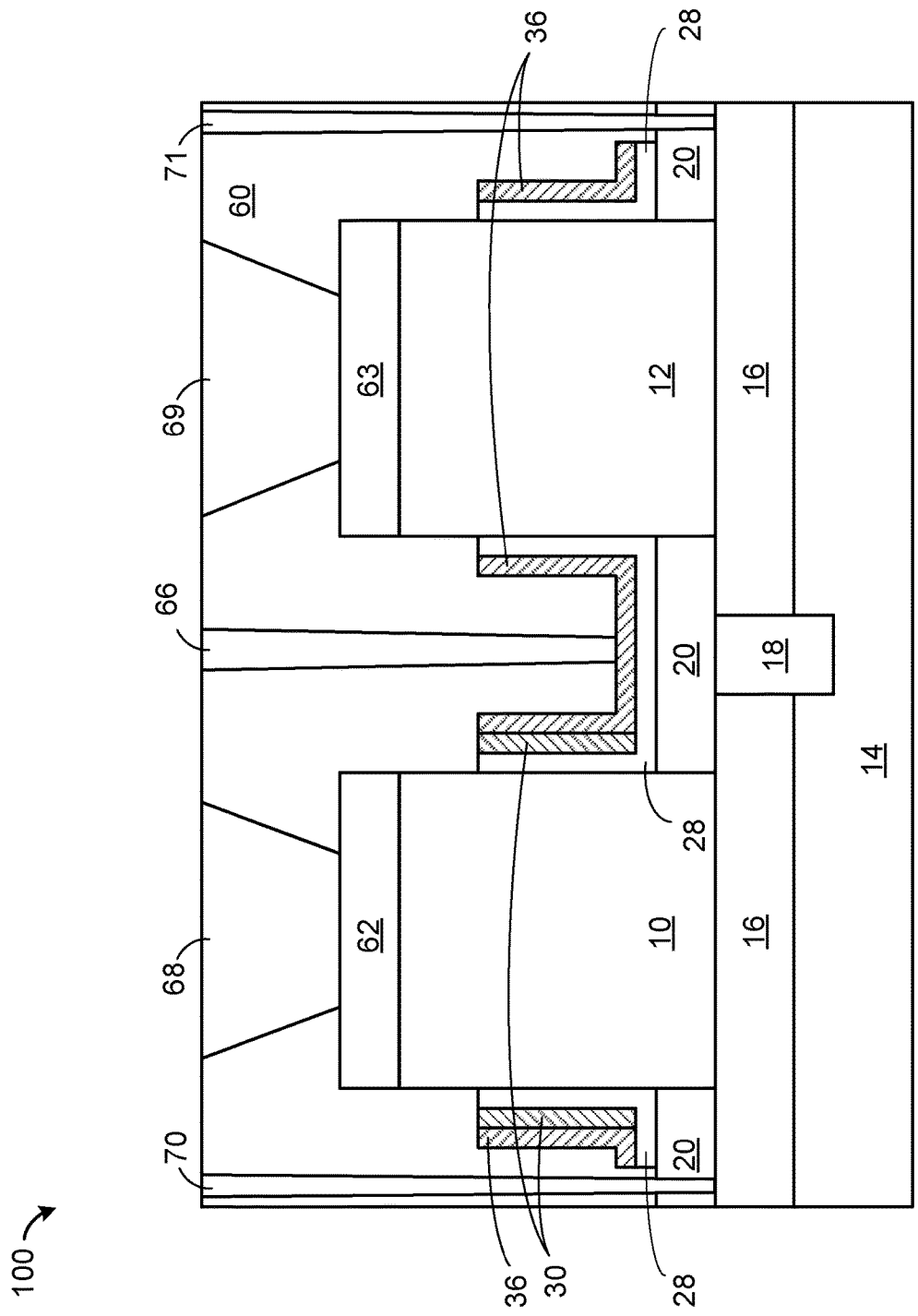
FIG. 9 illustrates a cross-sectional view of the semiconductor structure, and illustrates a complete structure, according to an exemplary embodiment.

Referring to FIG. 9, subsequent processing of the structure 100 may be performed, according to an exemplary embodiment. The subsequent processing may include selective etching/recessing to remove materials. In the area surrounding the fin 10, a portion of the NFET WFM 36, a portion of the PFET WFM 30, and a portion of the insulator 28 may be removed from a horizontal top surface of the fin 10 and may be removed from a portion of the vertical side wall of the fin 10. A remaining portion of the NFET WFM 36, a remaining portion of the PFET WFM 30, and a remaining portion of the insulator 28 may remain along a portion of the vertical side wall of the fin 10. In the area surrounding the fin 12, a portion of the NFET WFM 36 and a portion of the insulator 28 may be removed from a horizontal top surface of the fin 12 and may be removed from a portion of the vertical side wall of the fin 12. A remaining portion of the NFET WFM 36 and a remaining portion of the insulator 28 may remain along a portion of the vertical side wall of the fin 12. An additional remaining portion of the NFET WFM 36 may remain over the horizontal top surface of the insulator 28 between the fin 10 and the fin 12. The hard mask 24 and the insulator 22 may be removed from the horizontal top surface of the fins 10 and 12.

A PFET top epitaxy 62 may be formed on the horizontal top surface of the fin 10 and an NFET top epitaxy 63 may be formed on the horizontal top surface of the fin 12. A dielectric 60 may be formed over the structure 100, covering a top surface and a vertical side surface of the PFET top epitaxy 62, covering a top surface and a vertical side surface of the NFET top epitaxy 63, a portion of a horizontal side wall of the fin 10 and the fin 12, a portion of the top surface of the insulator 28, a portion of the top surface of the PFET WFM 30, and a portion of the top surface of the NFET WFM 36. Openings may be made in the dielectric 60, in which contacts may be formed. A PFET top source drain contact 68 may be formed which connects to the PFET top epitaxy 62. An NFET top source drain contact 69 may be formed which connects to the NFET top epitaxy 63. A gate contact 66 may be formed which connects to the NFET WFM 36. A PFET bottom source drain contact 70 may be formed connecting to the epitaxy 16 which is adjacent to the fin 10. An NFET bottom source drain contact 71 may be formed connecting to the epitaxy 16 which is adjacent to the fin 12. Each of the steps illustrated and described in regards to FIG. 9 may be performed in one or more steps, may be performed simultaneously, may be performed in an alternate sequence, and may be performed using known semiconductor manufacturing processes.

The gate contact 66 may be electrically connected to both the PFET WFM 30 and the NFET WFM 36. The PFET WFM 30 surrounding a portion of the vertical sidewalls of the fin 10 may operate as a PFET gate of a first vertical FET device, and the electrically isolated NFET WFM 36 surrounding a portion of the vertical sidewalls of the fin 12 may operate as an NFET gate for a second vertical FET device. The NFET WFM 36 may surround the PFET WFM 30, and may have minimal effect of the operation of the first vertical FET device. The first vertical FET device and the second vertical FET device may have different operating thresholds, due to different materials used in the WFM of each device, different epitaxies used in each of the bottom source drain regions and the top source drain regions, and other material and structural differences.

Figure 10:
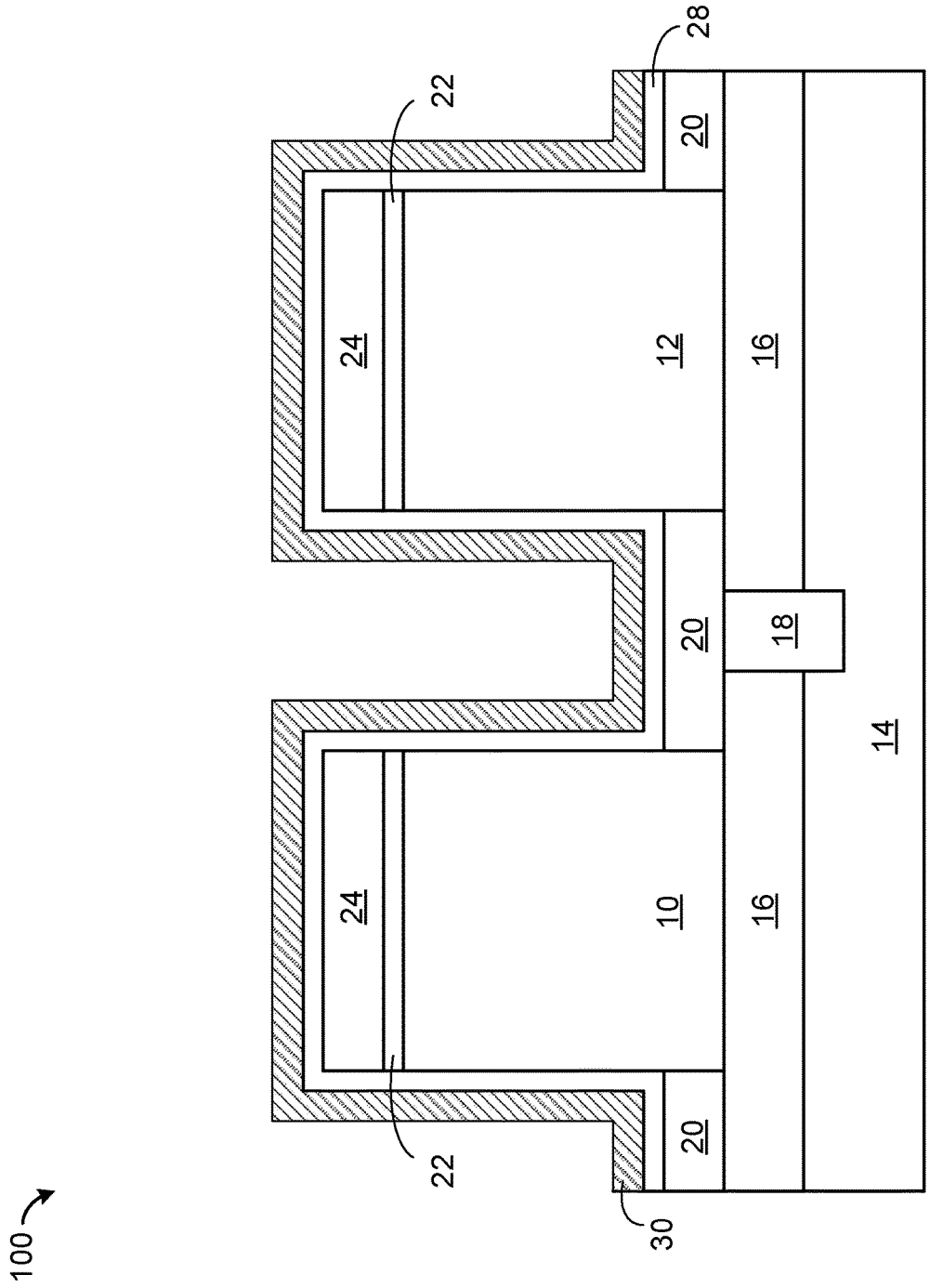
FIG. 10 illustrates a cross-sectional view of the semiconductor structure and illustrates forming a work function metal layer, according to an exemplary embodiment.

An alternate embodiment of forming different work function metal gates on adjacent fins is shown starting with FIG. 2 and continuing with FIG. 10.

Referring to FIG. 10, a PFET work function metal layer (hereinafter "PFET WFM") 30 may be conformally formed on exposed top surfaces of the structure 100, according to an exemplary embodiment. The PFET WFM 30 may be deposited using typical deposition techniques, for example, atomic layer deposition (ALD), molecular layer deposition (MLD), and chemical vapor deposition (CVD). In an embodiment, the PFET WFM 30 may include one or more layers. The PFET WFM 30 may be deposited on a top surface of the insulator 28. The PFET WFM 30 may be deposited on a top surface of the insulator 28 along the horizontal top surface and a portion of the vertical side walls of the fin 12 and the fin 10. The PFET WFM 30 may be deposited on a portion of the horizontal top surface of the insulator 28 between the fins 10 and 12. In an embodiment, the PFET WFM 30 may include a work function metal, including a metal nitride, for example, titanium nitride or tantalum nitride, titanium carbide or titanium aluminum carbide. In an embodiment, the WFM 30 may have a conformal thickness ranging from about 3 nm to about 8 nm, and ranges there between, although a thickness less than 3 nm and greater than 8 nm may be acceptable.

Figure 11:
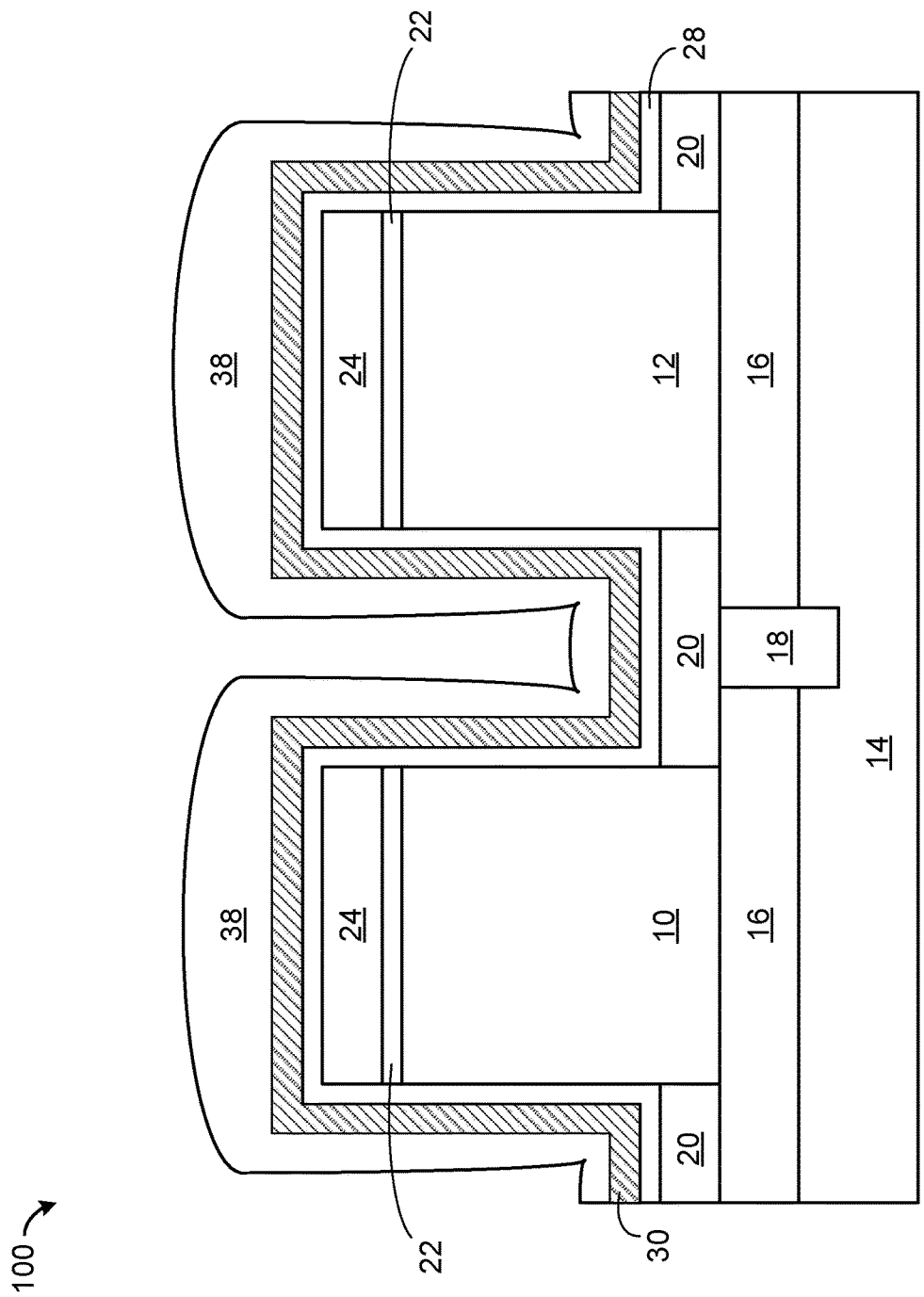
FIG. 11 illustrates a cross-sectional view of the semiconductor structure and illustrates forming a sacrificial material, according to an exemplary embodiment.

Referring to FIG. 11, a sacrificial layer 38 may be formed on exposed top surfaces of the structure 100, according to an exemplary embodiment. The sacrificial layer 38 may be deposited on a top surface of the PFET WMF 30. The sacrificial layer 38 may have a non-conformal top surface with a greater thickness above the fin 10 and above the fin 12 compared to a thickness between the fins 10, 12. The sacrificial layer 38 may include silicon germanium, any suitable silicon or polysilicon, and other sacrificial materials able to be selectively removed relative to other materials used in this embodiment. In an embodiment, the sacrificial layer 38 may be deposited by PVD and/or by CVD. In an embodiment, a combination of deposition techniques, such as conventional PVD and modified PVD derivatives, for example directional PVD deposition, and CVD, may be used. In an embodiment, the sacrificial layer 38 may have a vertical thickness, or height, above the cap layer 42 ranging from about 3 nm to about 20 nm.

Figure 12:
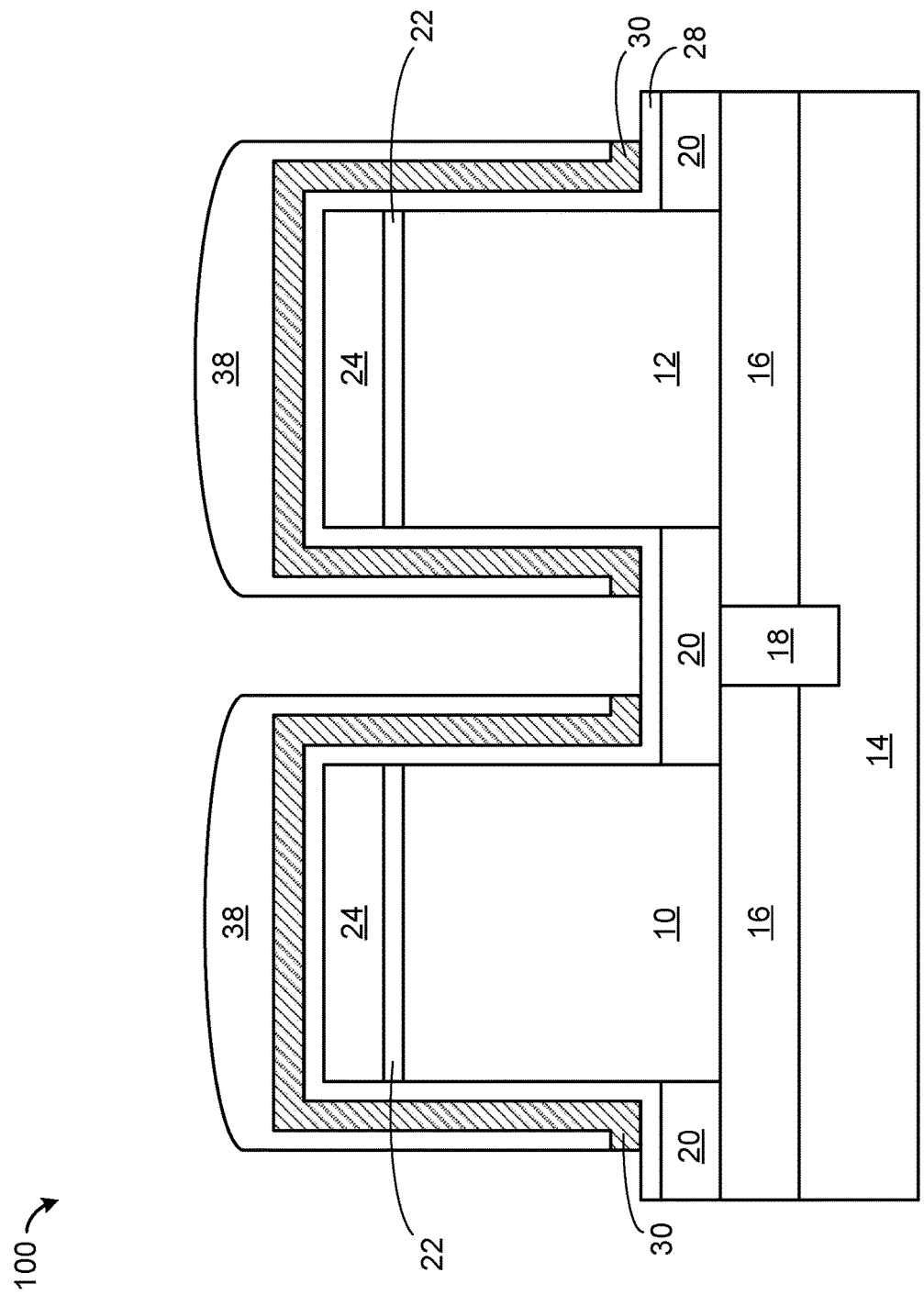
FIG. 12 illustrates a cross-sectional view of the semiconductor structure and illustrates reducing the sacrificial material and the work function metal layer, according to an exemplary embodiment.

Referring to FIG. 12, the sacrificial layer 38 and the PFET WFM 30 may be recessed/etched, according to an exemplary embodiment. The sacrificial layer 38 and the PFET WFM 30 may be etched using an anisotropic vertical etch process such as a reactive ion etch (RIE), wets, or any suitable etch process. This may be performed in one or more steps. Due to the greater thickness of the sacrificial layer 38 above the fin 10 and above the fin 12 compared to the thickness between the fins 10, 12, the sacrificial layer 38 and the PFET WFM 30 may be removed only in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the sacrificial layer 38 and the PFET WFM 30, and the insulator 28 may remain alongside a portion of a vertical sidewall of the fin 10 and alongside a portion of a vertical sidewall of the fin 12. The sacrificial layer 38 and the PFET WFM 30 may remain on a horizontal top surface of the fin 10, and on a horizontal top surface of the fin 12.

Figure 13:
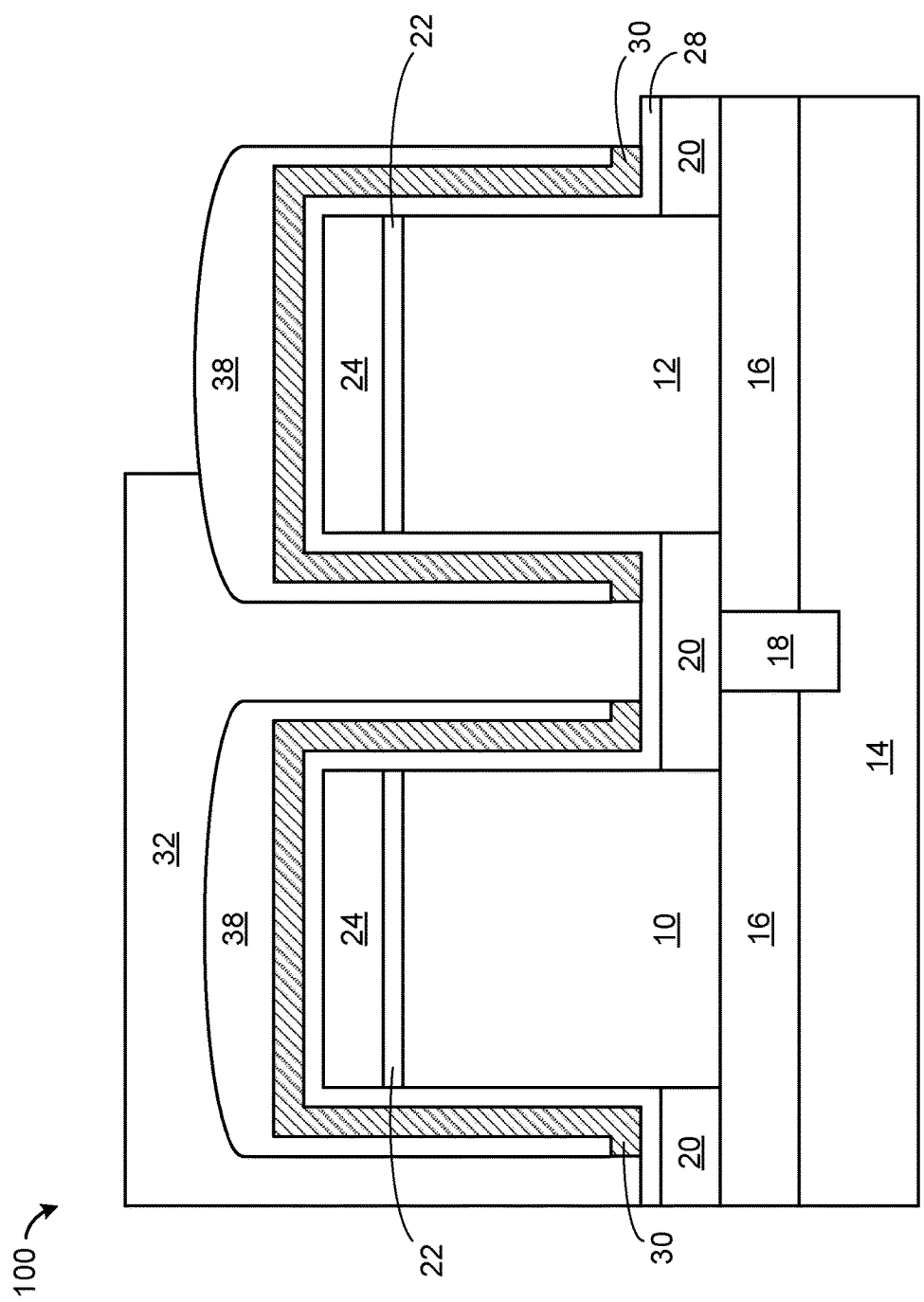
FIG. 13 illustrates a cross-sectional view of the semiconductor structure and illustrates forming a photo resist mask, according to an exemplary embodiment.

Referring to FIG. 13, an organic planarization layer 32 may be deposited and patterned on the structure 100, according to an exemplary embodiment. In an embodiment, the organic planarization layer 32 may be formed on the sacrificial layer 38 over the fin 10 and partially over the fin 12. The organic planarization layer 32 may be formed on a portion of the PFET WFM 30, all along a portion of the sidewall of the fin 10, and all along a portion of the sidewall of the fin 12. In an alternate embodiment, the organic planarization layer 32 may be formed on the sacrificial layer 38 over the fin 10, and may not be formed on the sacrificial layer 38 over the fin 12. The organic planarization layer 32 may be spin coated and optionally polished using a chemical mechanical polishing (CMP) technique. In an embodiment, the organic planarization layer 32 may include a three-layer stack, including an organic planarization layer (OPL), a hard mask, and a photo resist. The hard mask deposition may be deposited on the organic planarization layer 32. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 32 by reactive ion beam etching. The organic planarization layer 32 may protect an area over the fin 10 from subsequent processing steps, allowing separate processing in the area surrounding the fin 10 and an area surrounding the fin 12. The organic planarization layer 32 may have a height ranging from about 100 nm to 300 nm, and ranges there between, although a thickness less than 100 nm and greater than 300 nm may be acceptable.

Figure 14:
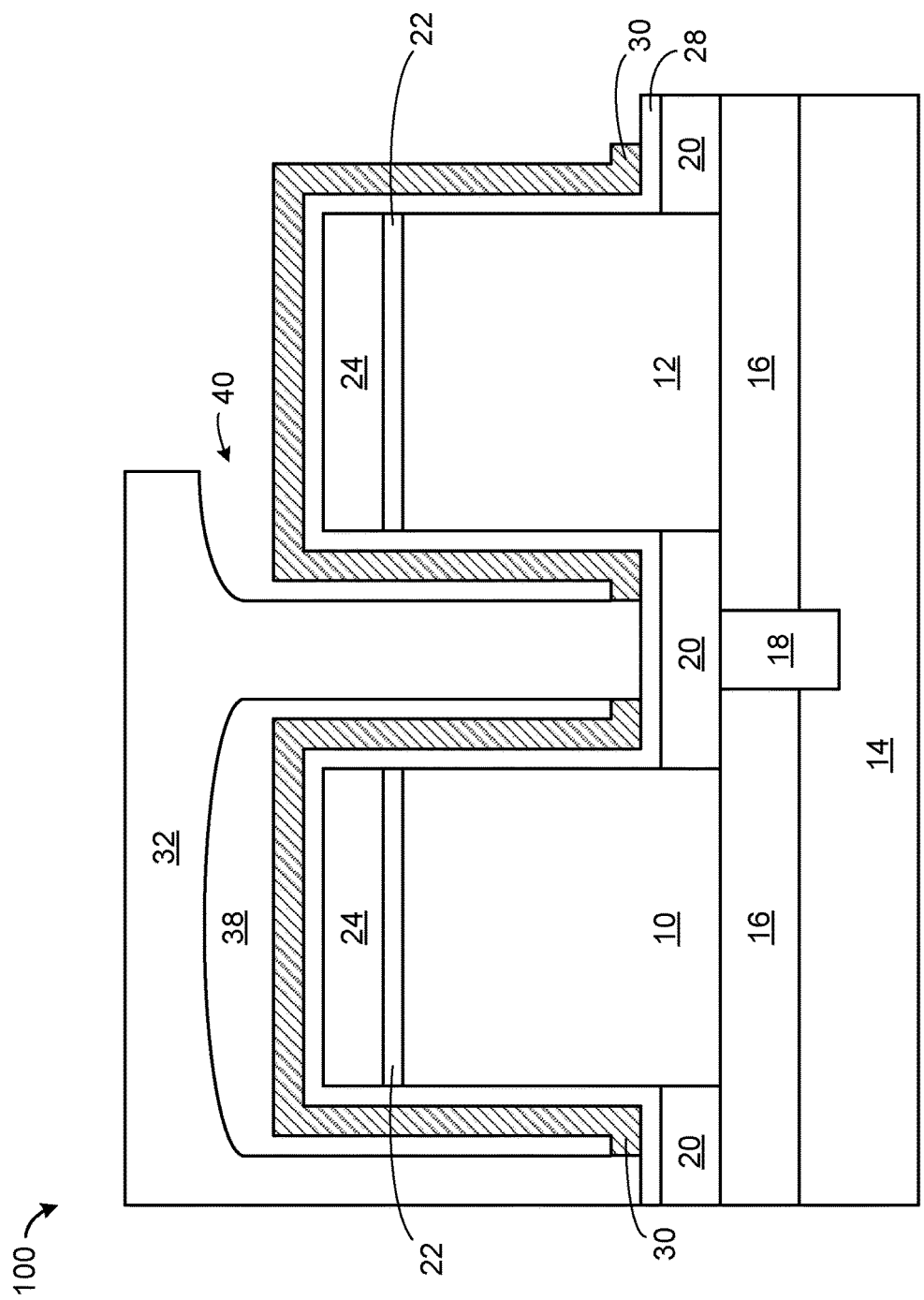
FIG. 14 illustrates a cross-sectional view of the semiconductor structure and illustrates partially removing the sacrificial material, according to an exemplary embodiment.

Referring to FIG. 14, a second opening 40 may be formed by recessing/etching the sacrificial layer 38 selective to the organic planarization layer 32 and a portion of the PFET WFM 30 over the fin 12, according to an exemplary embodiment. Specifically, the sacrificial layer 38 may be laterally removed from the top and along the vertical sidewalls of the fin 12. The second opening 40 may be formed using an etch chemistry selective to the organic planarization layer 32 and the PFET WFM 30, to laterally remove the sacrificial material 39 on the top and along the vertical sidewalls of the fin 12. The organic planarization layer 32 may protect a portion of the PFET WFM 30 in an area above and surrounding a portion of the vertical sidewalls of the fin 10.

Figure 15:
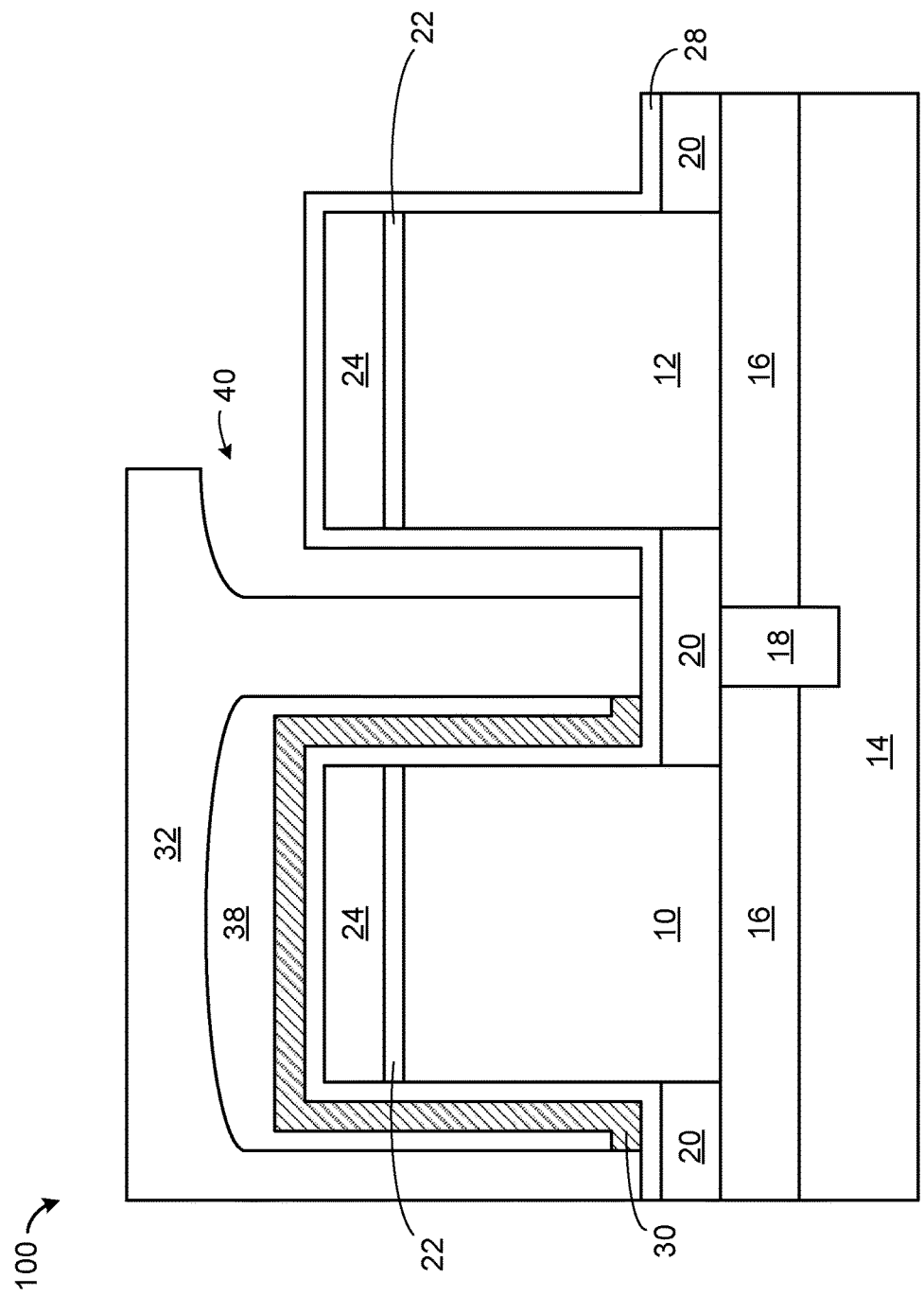
FIG. 15 illustrates a cross-sectional view of the semiconductor structure and illustrates partially removing the work function metal layer, according to an exemplary embodiment.

Referring to FIG. 15, the second opening 40 may be enlarged by recessing/etching the PFET WFM 30, selective to the organic planarization layer 32 and a portion of the insulator 28, according to an exemplary embodiment. Specifically, the PFET WFM 30 may be laterally removed from the top and along the vertical sidewalls of the fin 12. The second opening 40 may be enlarged using an etch chemistry selective to the organic planarization layer 32 and the insulator 28, to laterally remove the PFET WFM 30 on the top and along the vertical sidewalls of the fin 12. The etch chemistry used to enlarge the second opening 40 may be different than used when forming the first opening 40. The organic planarization layer 32 may protect a portion of the PFET WFM 30 in an area above and surrounding a portion of the vertical sidewalls of the fin 10. A top surface of the insulator 28 may be exposed along a portion of a vertical sidewall of the fin 12 and in an area between the fin 10 and the fin 12. A portion of the insulator 28 may remain alongside a portion of the vertical sidewall of the fin 12.

The organic planarization layer 32 may be subsequently removed after etching according to known techniques.

Figure 16:
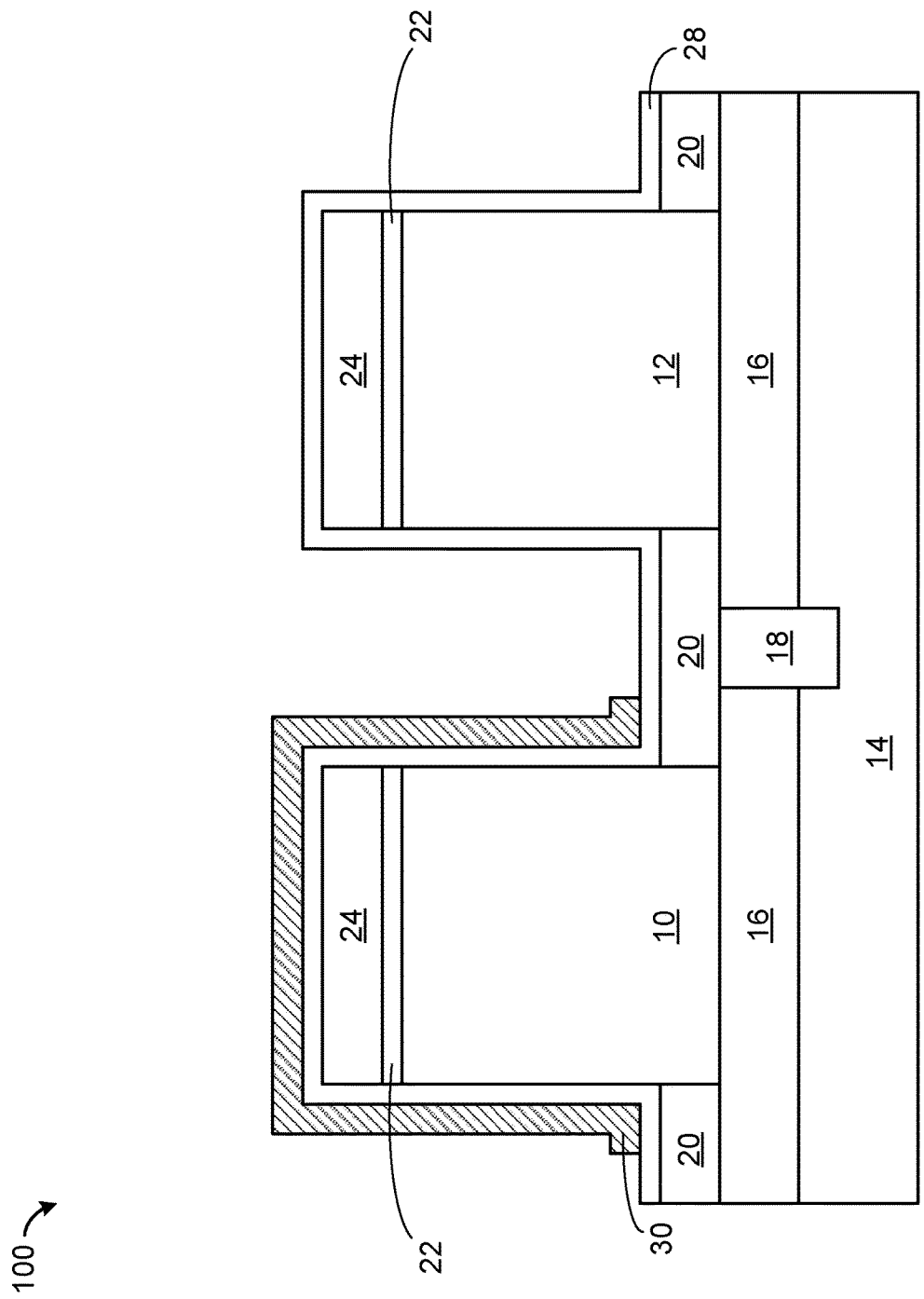
FIG. 16 illustrates a cross-sectional view of the semiconductor structure and illustrates removing remaining portions of the sacrificial material, according to an exemplary embodiment.

Referring to FIG. 16, the sacrificial material 38 may be removed, according to an exemplary embodiment. The sacrificial material 38 may be removed by recessing/etching the sacrificial material 38 selective to the insulator 28 and a portion of the PFET WFM 30 over the fin 10. The sacrificial material 38 may be removed using an anisotropic vertical etch process such as a reactive ion etch (RIE), wets, or any suitable etch process.

Figure 17:
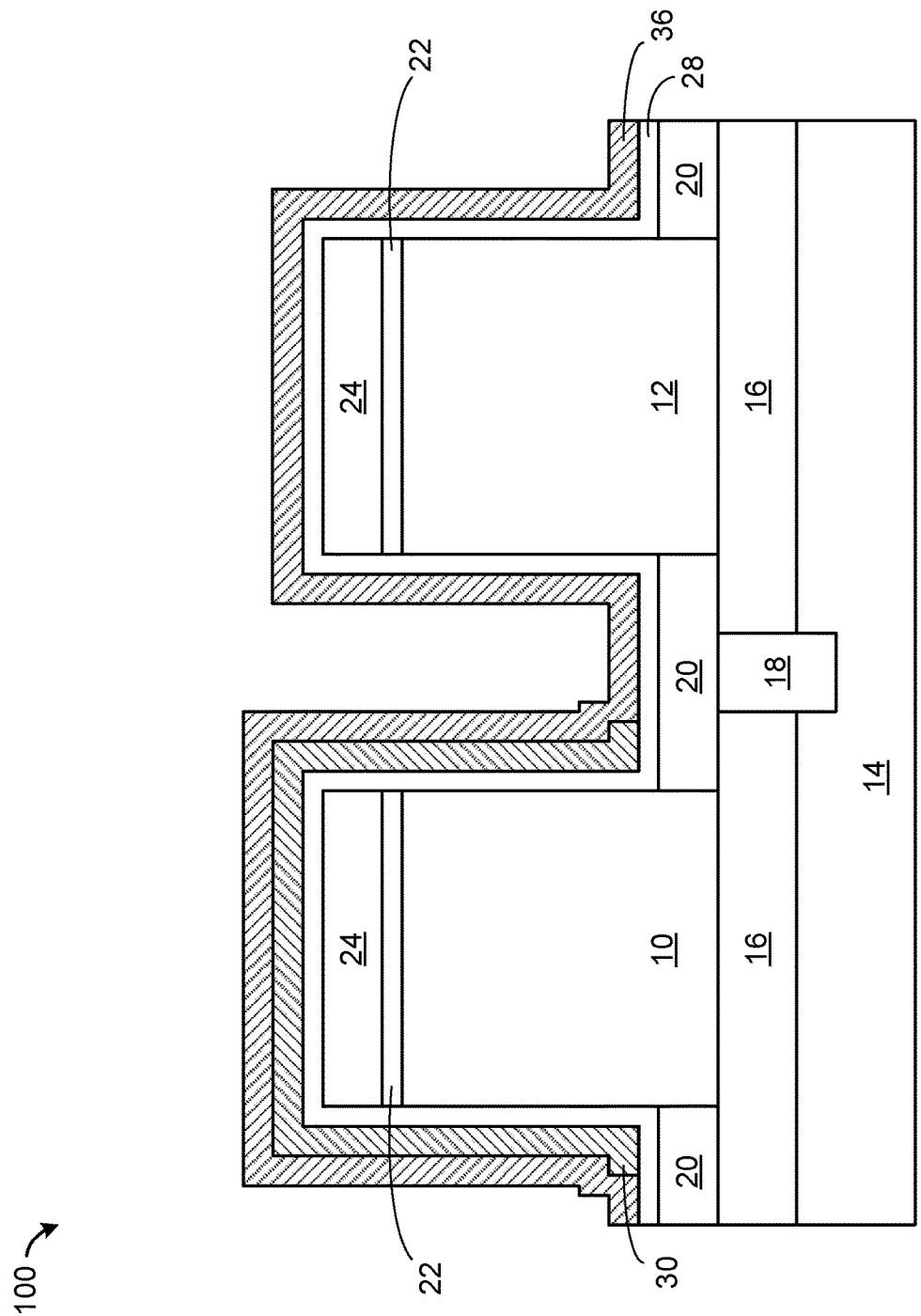
FIG. 17 illustrates a cross-sectional view of the semiconductor structure and illustrates forming a second work function metal layer, according to an exemplary embodiment.

Referring to FIG. 17, an NFET work function metal layer (hereinafter "NFET WFM") 36 may be conformally formed on the structure 100, according to an exemplary embodiment. The NFET WFM 36 may be deposited using typical deposition techniques, for example, atomic layer deposition (ALD), molecular layer deposition (MLD), and chemical vapor deposition (CVD). In an embodiment, the NFET WFM 36 may include one or more layers. The NFET WFM 36 may be deposited on a top surface of the insulator 28 along the horizontal top surface and a portion of the vertical side walls of the fin 12. The NFET WFM 36 may be deposited on a top surface of the sacrificial material 38 along the top surface and a portion of the vertical side walls of the fin 10. The NFET WFM 36 may be deposited on a portion of the horizontal top surface of the PFET WFM 30 between the fins 10 and 12. In an embodiment, the NFET WFM 36 may include a work function metal including titanium aluminum carbide and may include a different work function metal than the PFET WFM 30. In an embodiment, the NFET WFM 36 may have a conformal thickness ranging from about 3 nm to about 8 nm, and ranges there between, although a thickness less than 3 nm and greater than 8 nm may be acceptable.

Figure 18:
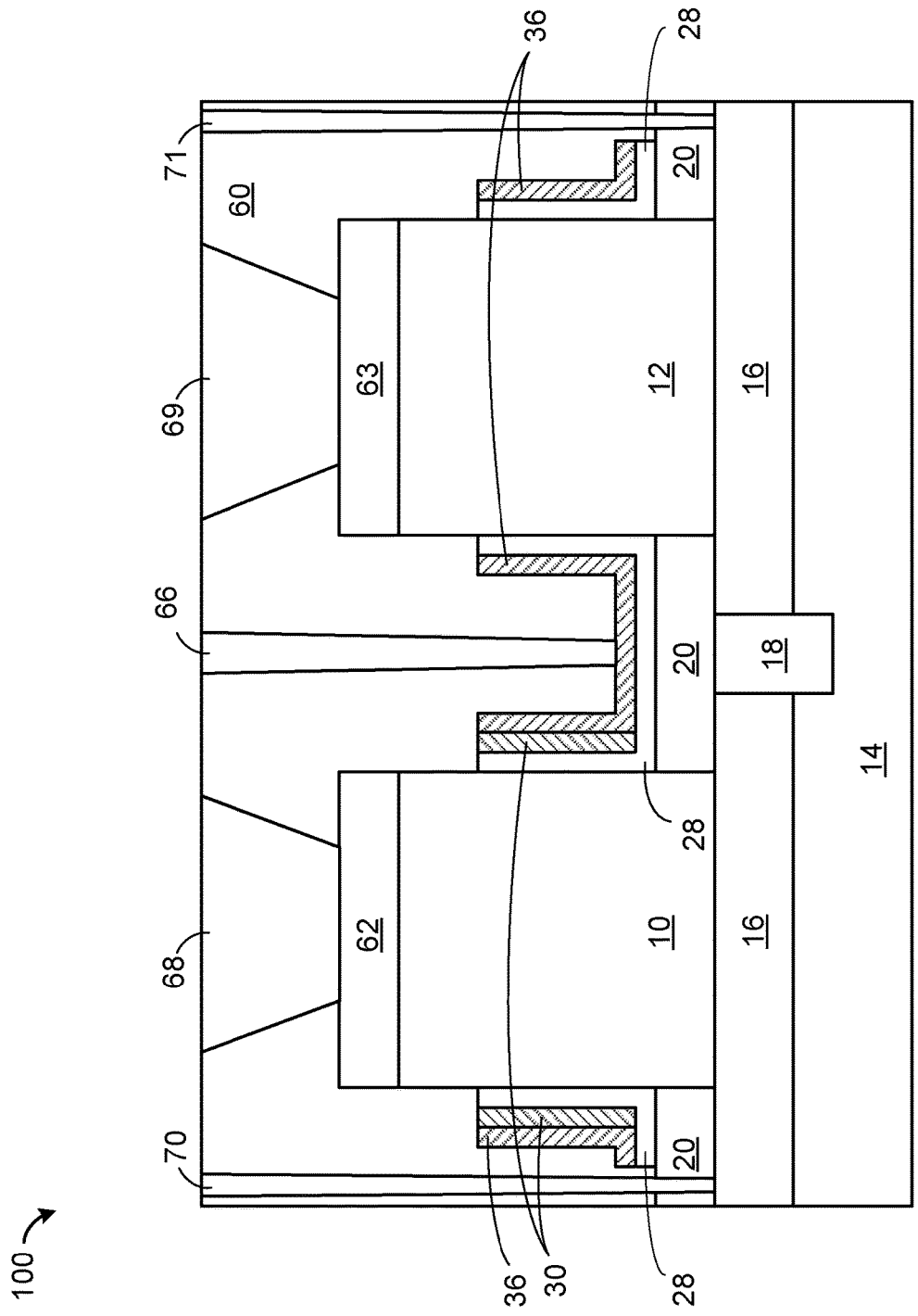
FIG. 18 illustrates a cross-sectional view of the semiconductor structure, and illustrates a complete structure, according to an exemplary embodiment.

Referring to FIG. 18, subsequent processing of the structure 100 may be performed, according to an exemplary embodiment. The subsequent processing may include selective etching/recessing to remove materials. In the area surrounding the fin 10, a portion of the NFET WFM 36, a portion of the PFET WFM 30, and a portion of the insulator 28 may be removed from the horizontal top surface of the fin 10 and may be removed from a portion of the vertical side wall of the fin 10. A remaining portion of the NFET WFM 36, a remaining portion of the PFET WFM 30, and a remaining portion of the insulator 28 may remain along a portion of the vertical side wall of the fin 10. In the area surrounding the fin 12, a portion of the NFET WFM 36 and a portion of the insulator 28 may be removed from a horizontal top surface of the fin 12 and may be removed from a portion of the vertical side wall of the fin 12. A remaining portion of the NFET WFM 36 and a remaining portion of the insulator 28 may remain along a portion of the vertical side wall of the fin 12. An additional remaining portion of the NFET WFM 36 may remain over the horizontal top surface of the insulator 28 between the fin 10 and the fin 12. The hard mask 24 and the insulator 22 may be removed from the horizontal top surface of the fins 10 and 12.

A PFET top epitaxy 62 may be formed on the horizontal top surface of the fin 10 and an NFET top epitaxy 63 may be formed on the horizontal top surface of the fin 12. A dielectric 60 may be formed over the structure 100, covering a top surface and a vertical side surface of the PFET top epitaxy 62, covering a top surface and a vertical side surface of the NFET top epitaxy 63, a portion of a horizontal side wall of the fin 10 and the fin 12, a portion of the top surface of the insulator 28, a portion of the top surface of the PFET WFM 30, and a portion of the top surface of the NFET WFM 36. Openings may be made in the dielectric 60, in which contacts may be formed. A PFET top source drain contact 68 may be formed which connects to the PFET top epitaxy 62. An NFET top source drain contact 69 may be formed which connects to the NFET top epitaxy 63. A gate contact 66 may be formed which connects to the NFET WFM 36. A PFET bottom source drain contact 70 may be formed connecting to the epitaxy 16 which is adjacent to the fin 10. An NFET bottom source drain contact 71 may be formed connecting to the epitaxy 16 which is adjacent to the fin 12. Each of the steps illustrated and described in regards to FIG. 18 may be performed in one or more steps, may be performed simultaneously, may be performed in an alternate sequence, and may be performed using known semiconductor manufacturing processes.

The gate contact 66 may be electrically connected to both the PFET WFM 30 and the NFET WFM 36. The PFET WFM 30 surrounding a portion of the vertical sidewalls of the fin 10 may operate as a PFET gate of a first vertical FET device, and the electrically isolated NFET WFM 36 surrounding a portion of the vertical sidewalls of the fin 12 may operate as an NFET gate for a second vertical FET device. The NFET WFM 36 may surround the PFET WFM 30, and may have minimal effect of the operation of the first vertical FET device. The first vertical FET device and the second vertical FET device may have different operating thresholds, due to different materials used in the WFM of each device, different epitaxies used in each of the bottom source drain regions and the top source drain regions, and other material and structural differences.

Figure 19:
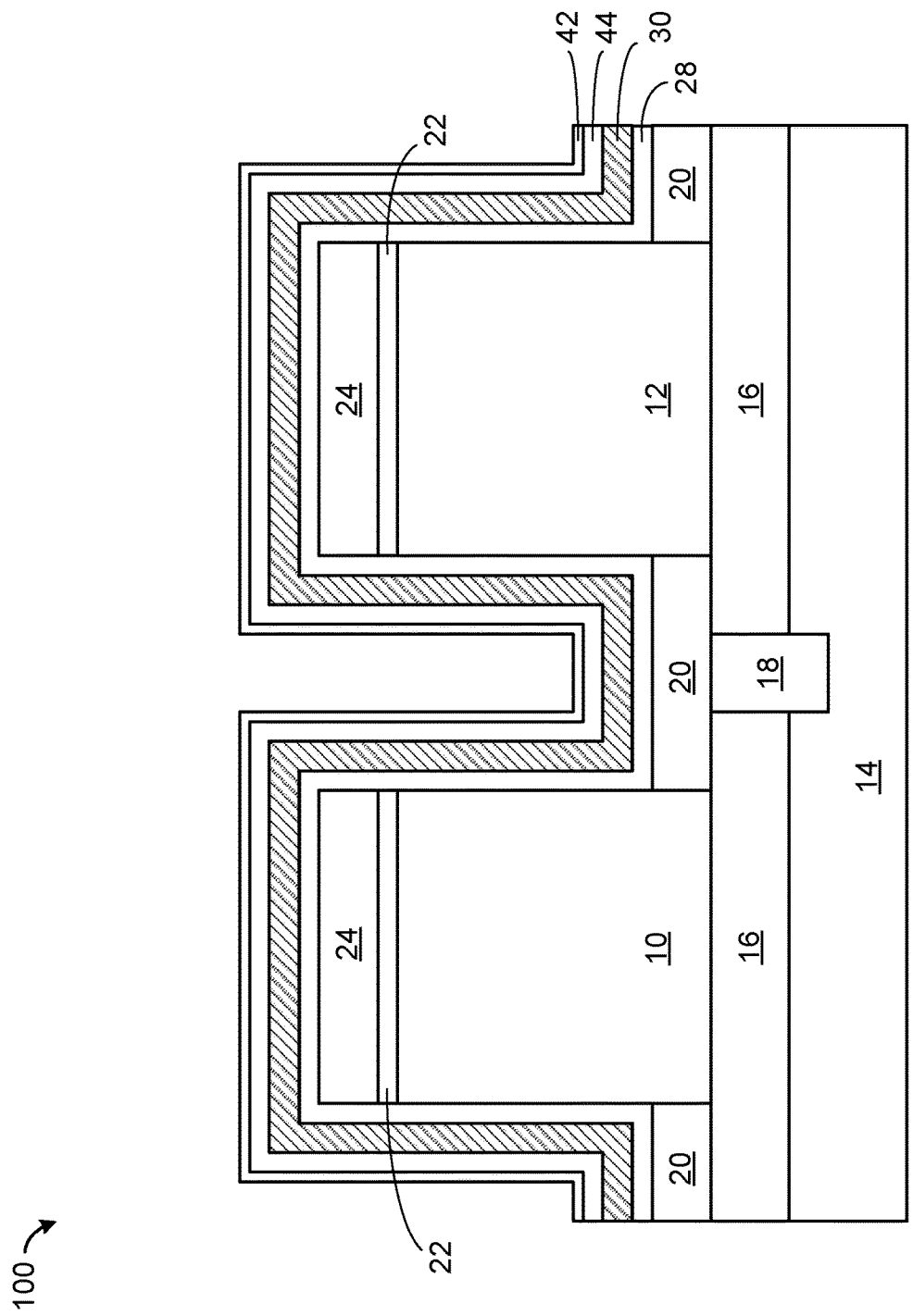
FIG. 19 illustrates a cross-sectional view of the semiconductor structure and illustrates forming a work function metal layer and a sacrificial material, according to an exemplary embodiment.

An alternate embodiment of forming different work function metal gates on adjacent fins is now shown starting with FIG. 2 and continuing with FIG. 19.

Referring to FIG. 19, a PFET work function metal layer (hereinafter "PFET WFM") 30 may be conformally formed on exposed top surfaces of the structure 100, according to an exemplary embodiment. The PFET WFM 30 may be deposited using typical deposition techniques, for example, atomic layer deposition (ALD), molecular layer deposition (MLD), and chemical vapor deposition (CVD). In an embodiment, the PFET WFM 30 may include one or more layers. The PFET WFM 30 may be deposited on a top surface of the insulator 28. The PFET WFM 30 may be deposited on a top surface of the insulator 28 along the horizontal top surface and a portion of the vertical side walls of the fins 12 and 10. The PFET WFM 30 may be deposited on a portion of the horizontal top surface of the insulator 28 between the fins 10 and 12. In an embodiment, the PFET WFM 30 may include a work function metal, including a metal nitride, for example, titanium nitride or tantalum nitride, titanium carbide or titanium aluminum carbide. In an embodiment, the WFM 30 may have a conformal thickness ranging from about 3 nm to about 8 nm, and ranges there between, although a thickness less than 3 nm and greater than 8 nm may be acceptable.

A sacrificial buffer 44 may be conformally formed on exposed top surfaces of the structure 100, according to an exemplary embodiment. The sacrificial buffer 44 may be deposited on a top surface of the PFET WFM 30. The sacrificial buffer 44 may include any material able to be selectively removed relative to other materials used in this embodiment. In an embodiment, the sacrificial buffer 44 may include aluminum oxide and lanthanum oxide. The sacrificial buffer 44 may be deposited using typical deposition techniques, for example, atomic layer deposition (ALD), molecular layer deposition (MLD), and chemical vapor deposition (CVD). The sacrificial buffer 44 may be recessed/etched, according to an exemplary embodiment. The sacrificial buffer 44 may be recessed using an anisotropic vertical etch process such as a reactive ion etch (RIE), or any suitable etch process. The sacrificial buffer 44 may be thinned to a uniform thickness on the top surface of the PFET WFM 30 of about 1 nm, although a thickness less than 1 nm or above 1 nm may be acceptable.

A cap layer 42 may be conformally formed on exposed top surfaces of the structure 100, according to an exemplary embodiment. The cap layer 42 may be deposited on a top surface of the sacrificial buffer 44. The cap layer may include a metal nitride, for example TiN, and may be used as a protecting layer for subsequent patterning. The cap layer 42 may be deposited using typical deposition techniques, for example, atomic layer deposition (ALD), molecular layer deposition (MLD), and chemical vapor deposition (CVD). The cap layer 42 may be recessed/etched, according to an exemplary embodiment. The cap layer 42 may be recessed using an anisotropic vertical etch process such as a reactive ion etch (RIE), or any suitable etch process. The cap layer 42 may be thinned to a uniform thickness on the top surface of sacrificial buffer 44 of about 1 nm, although a thickness less than 1 nm or above 1 nm may be acceptable.

Figure 20:
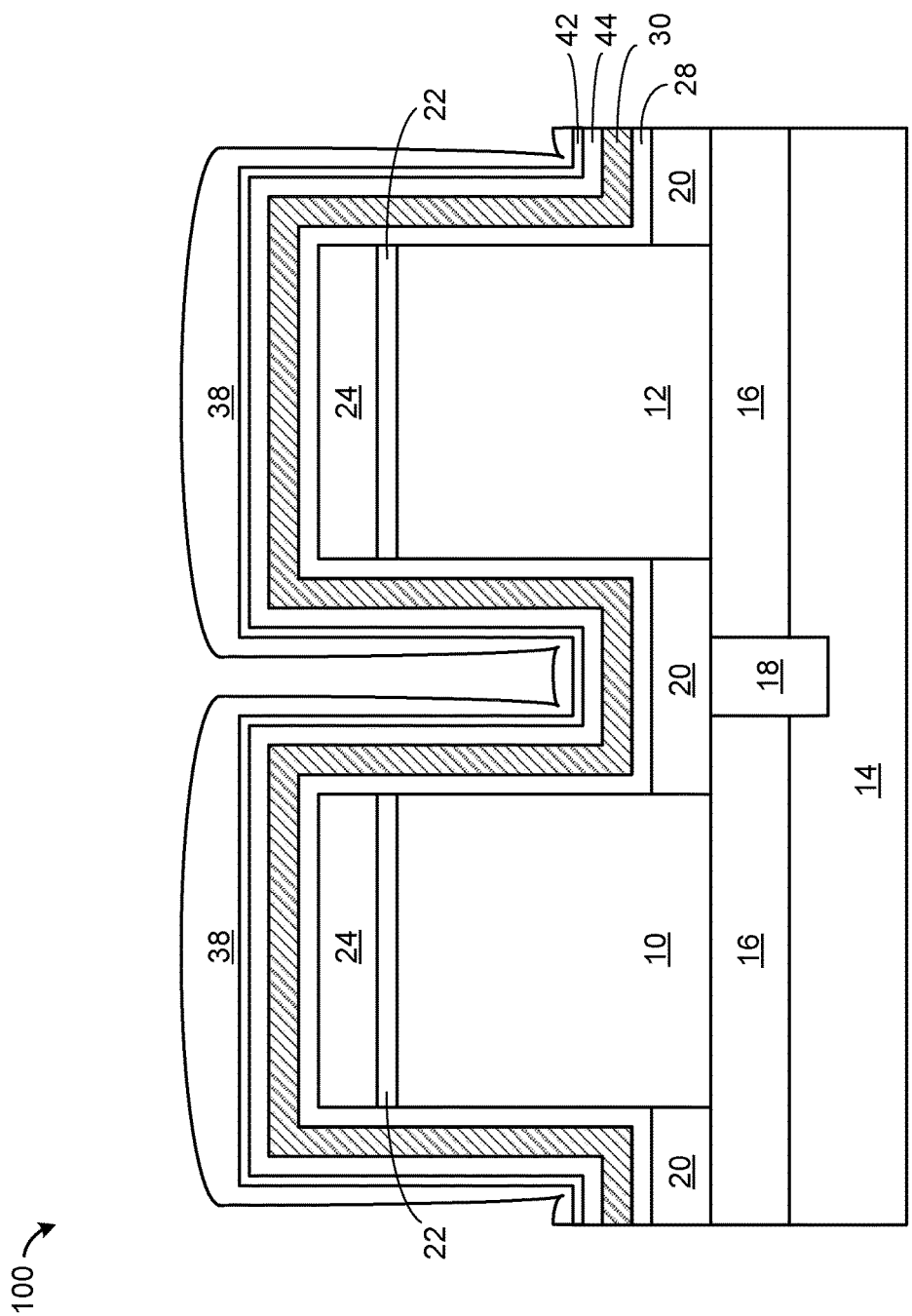
FIG. 20 illustrates a cross-sectional view of the semiconductor structure and illustrates forming a sacrificial material, according to an exemplary embodiment.

Referring now to FIG. 20, a sacrificial layer 38 may be formed on exposed top surfaces of the structure 100, according to an exemplary embodiment. The sacrificial layer 38 may be deposited on a top surface of the cap layer 42. The sacrificial layer 38 may have a non-conformal top surface with a greater thickness above the fin 10 and above the fin 12 compared to a thickness between the fins 10, 12. The sacrificial layer 38 may include silicon germanium, any suitable silicon or polysilicon, and other sacrificial materials able to be selectively removed relative to other materials used in this embodiment. In an embodiment, the sacrificial layer 38 may be deposited by PVD and/or by CVD. In an embodiment, a combination of deposition techniques, such as conventional PVD and modified PVD derivatives, for example directional PVD deposition, and CVD, may be used. In an embodiment, the sacrificial layer 38 may have a vertical thickness, or height, above the cap layer 42 ranging from about 3 nm to about 20 nm.

Figure 21:
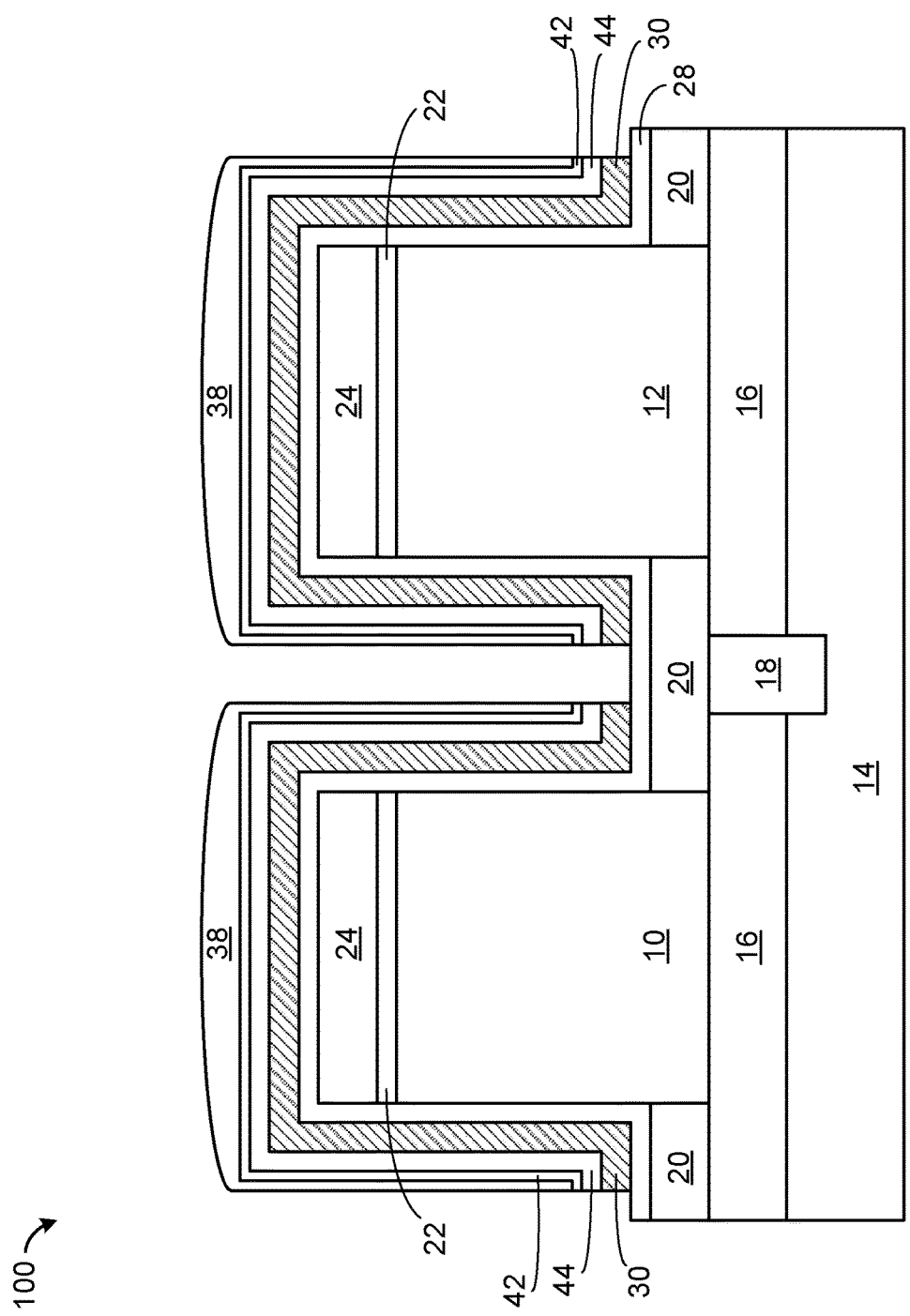
FIG. 21 illustrates a cross-sectional view of the semiconductor structure and illustrates reducing the sacrificial material and the work function metal layer, according to an exemplary embodiment.

Referring to FIG. 21, the sacrificial layer 38, the cap layer 42, the sacrificial buffer 44, and the PFET WFM 30 may be recessed/etched, according to an exemplary embodiment. The sacrificial layer 38, the cap layer 42, the sacrificial buffer 44, and the PFET WFM 30 may be etched using an anisotropic vertical etch process such as a reactive ion etch (RIE), or any suitable etch process. This may be performed in one or more steps. Due to the greater thickness of the sacrificial layer 38 above the fin 10 and above the fin 12 compared to the thickness between the fins 10, 12, the sacrificial layer 38, the cap layer, the sacrificial buffer 44, and the PFET WFM 30 may be removed in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the sacrificial layer 38, the cap layer 42, the sacrificial buffer 44, and the PFET WFM 30, and the insulator 28 may remain alongside a portion of a vertical sidewall of the fin 10 and alongside a portion of a vertical sidewall of the fin 12. The sacrificial layer 38, the cap layer 42, the sacrificial buffer 44, and the PFET WFM 30 may remain on a horizontal top surface of the fin 10, and on a horizontal top surface of the fin 12.

Figure 22:
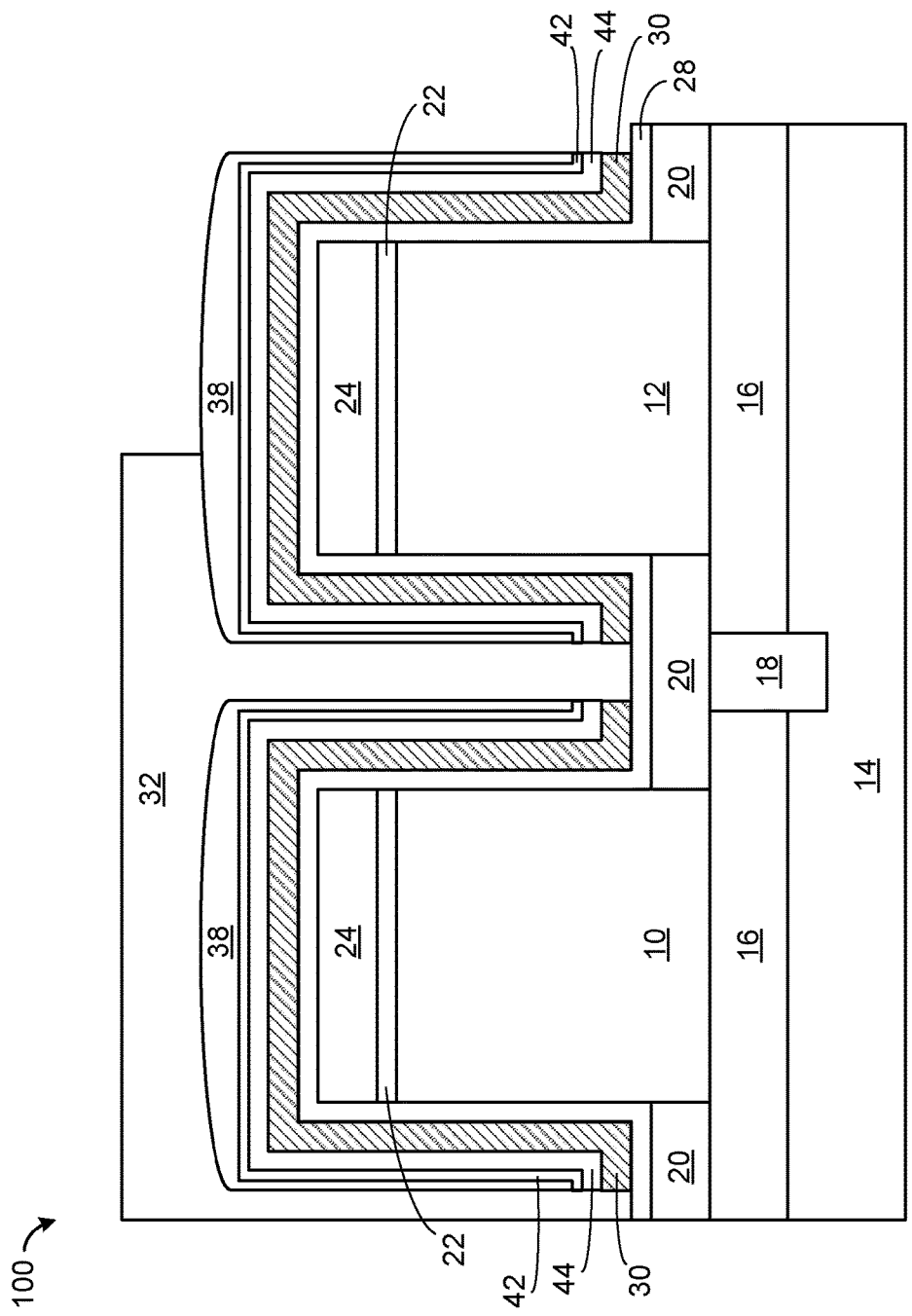
FIG. 22 illustrates a cross-sectional view of the semiconductor structure and illustrates forming a photo resist mask, according to an exemplary embodiment.

Referring to FIG. 22, an organic planarization layer 32 may be deposited and patterned on the structure 100, according to an exemplary embodiment. In an embodiment, the organic planarization layer 32 may be formed on the sacrificial layer 38 over the fin 10 and partially over the fin 12. The organic planarization layer 32 may be formed on a portion of the cap layer 42, on a portion of the sacrificial buffer 44, and on a portion of the PFET WFM 30, all along a portion of the sidewall of the fin 10, and all along a portion of the sidewall of the fin 12. In an alternate embodiment, the organic planarization layer 32 may be formed on the sacrificial layer 38 over the fin 10, and may not be formed on the sacrificial layer 38 over the fin 12. The organic planarization layer 32 may be spin coated and optionally polished using a chemical mechanical polishing (CMP) technique. In an embodiment, the organic planarization layer 32 may include a three-layer stack, including an organic planarization layer (OPL), a hard mask, and a photo resist. The hard mask deposition may be deposited on the organic planarization layer 32. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 32 by reactive ion beam etching. The organic planarization layer 32 may protect an area over the fin 10 from subsequent processing steps, allowing separate processing in the area surrounding the fin 10 and an area surrounding the fin 12. The organic planarization layer 32 may have a height ranging from about 100 nm to 300 nm, and ranges there between, although a thickness less than 100 nm and greater than 300 nm may be acceptable.

Figure 23:
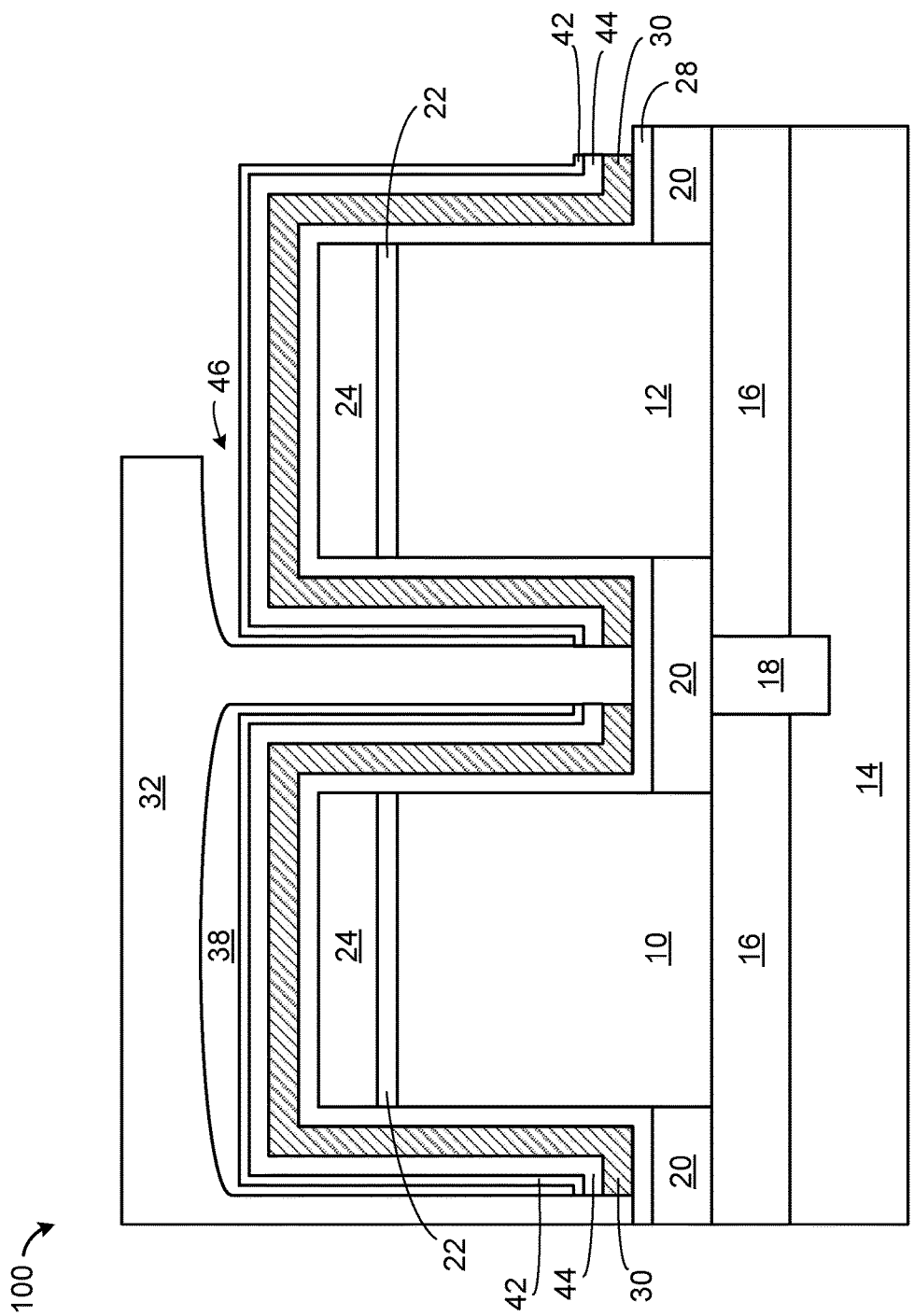
FIG. 23 illustrates a cross-sectional view of the semiconductor structure and illustrates reducing the sacrificial material, according to an exemplary embodiment.

Referring to FIG. 23, a third opening 46 may be formed by recessing/etching the sacrificial layer 38 on the top and along the vertical sidewalls of the fin 12, selective to the organic planarization layer 32 and a portion of the sacrificial buffer 44 over the fin 12, according to an exemplary embodiment. Specifically, the sacrificial layer 38 may be laterally removed from the top and along the vertical sidewalls of the fin 12. The third opening 46 may be formed using an etch chemistry selective to the organic planarization layer 32 and the sacrificial buffer 44, to laterally remove the sacrificial layer 38 on the top and along the vertical sidewalls of the fin 12. The organic planarization layer 32 may protect a portion of the sacrificial layer 38 in an area above and surrounding a portion of the vertical sidewalls of the fin 10.

Figure 24:
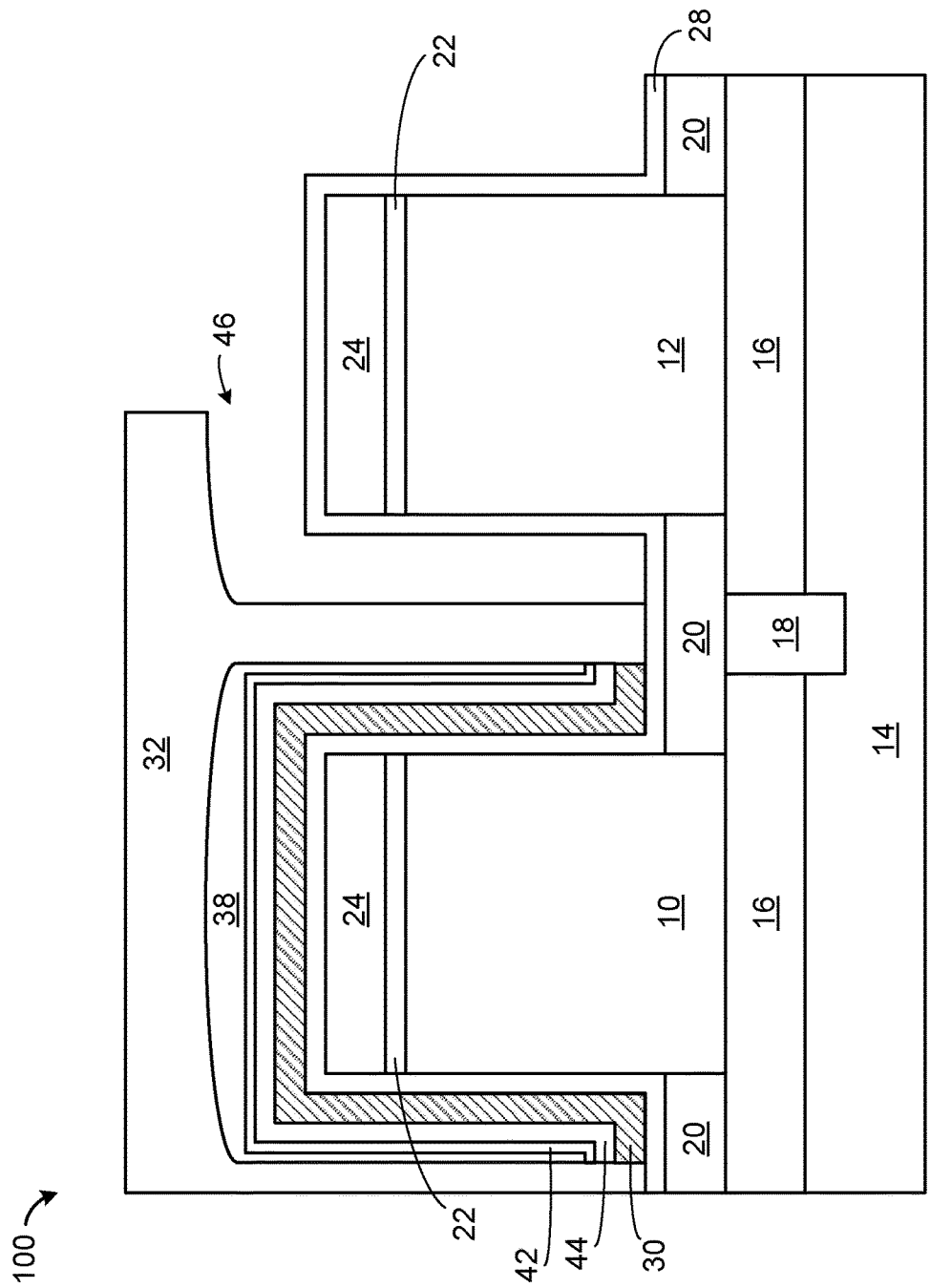
FIG. 24 illustrates a cross-sectional view of the semiconductor structure and illustrates removing a portion of the work function metal layer, according to an exemplary embodiment.

Referring to FIG. 24, the third opening 46 may be enlarged by recessing/etching the sacrificial buffer 44 and PFET WFM 30, selective to the organic planarization layer 32 and a portion of the insulator 28, according to an exemplary embodiment. Specifically, the sacrificial buffer 44 and PFET WFM 30 may be laterally removed from the top and along the vertical sidewalls of the fin 12. This may be performed in one or more steps. The third opening 46 may be enlarged using an etch chemistry selective to the organic planarization layer 32 and the insulator 28, to laterally remove the sacrificial buffer 44 and the PFET WFM 30 on the top and along the vertical sidewalls of the fin 12. The etch chemistry used to enlarge the third opening 46 may be different than used when forming the third opening 46. The organic planarization layer 32 may protect a portion of the sacrificial material 38 in area above and surrounding a portion of the vertical sidewalls of the fin 10. A top surface of the insulator 28 may be exposed along a portion of a vertical sidewall of the fin 12 and in an area between the fin 10 and the fin 12. A portion of the insulator 28 may remain alongside a portion of the vertical sidewall of the fin 12.

The organic planarization layer 32 may be subsequently removed after etching according to known techniques.

Figure 25:
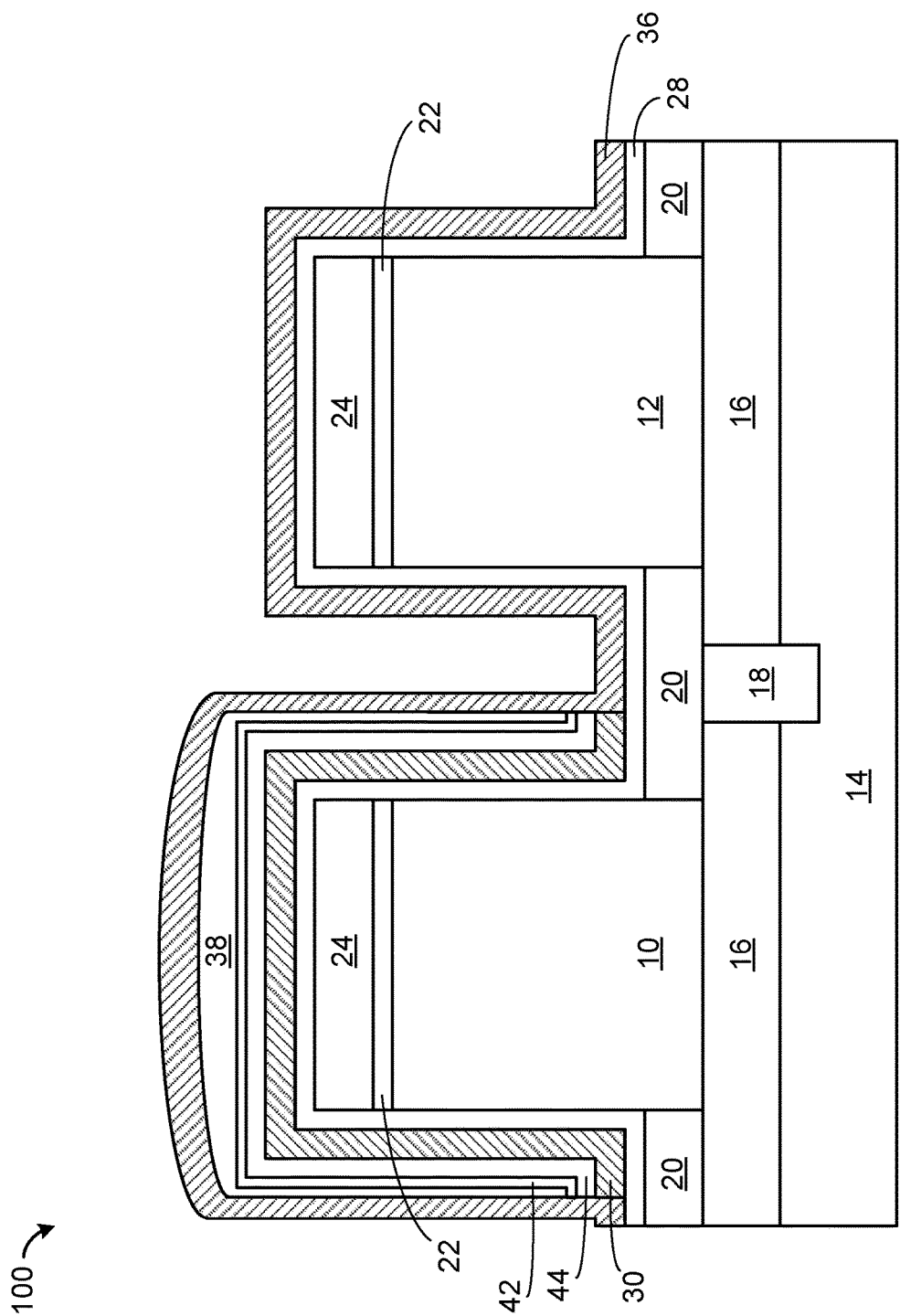
FIG. 25 illustrates a cross-sectional view of the semiconductor structure and illustrates removing the photo resist mask, according to an exemplary embodiment.

Referring to FIG. 25, an NFET work function metal layer (hereinafter "NFET WFM") 36 may be conformally formed on the structure 100, according to an exemplary embodiment. The NFET WFM 36 may be deposited using typical deposition techniques, for example, atomic layer deposition (ALD), molecular layer deposition (MLD), and chemical vapor deposition (CVD). In an embodiment, the NFET WFM 36 may include one or more layers. The NFET WFM 36 may be deposited on a top surface of the insulator 28 along the horizontal top surface and a portion of the vertical side walls of the fin 12. The NFET WFM 36 may be deposited on a top surface of the sacrificial material 38 along the top surface and a portion of the vertical side walls of the fin 10. The NFET WFM 36 may be deposited on a portion of the cap layer 42, a portion of the sacrificial buffer 44, and a portion of the PFET WFM 30, along a portion of the vertical side of the fin 10. The NFET WFM 36 may be deposited on a portion of the horizontal top surface of the insulator 28 between the fins 10 and 12. In an embodiment, the NFET WFM 36 may include a work function metal including titanium aluminum carbide and may include a different work function metal than the PFET WFM 30. In an embodiment, the NFET WFM 36 may have a conformal thickness ranging from about 3 nm to about 8 nm, and ranges there between, although a thickness less than 3 nm and greater than 8 nm may be acceptable.

Figure 26:
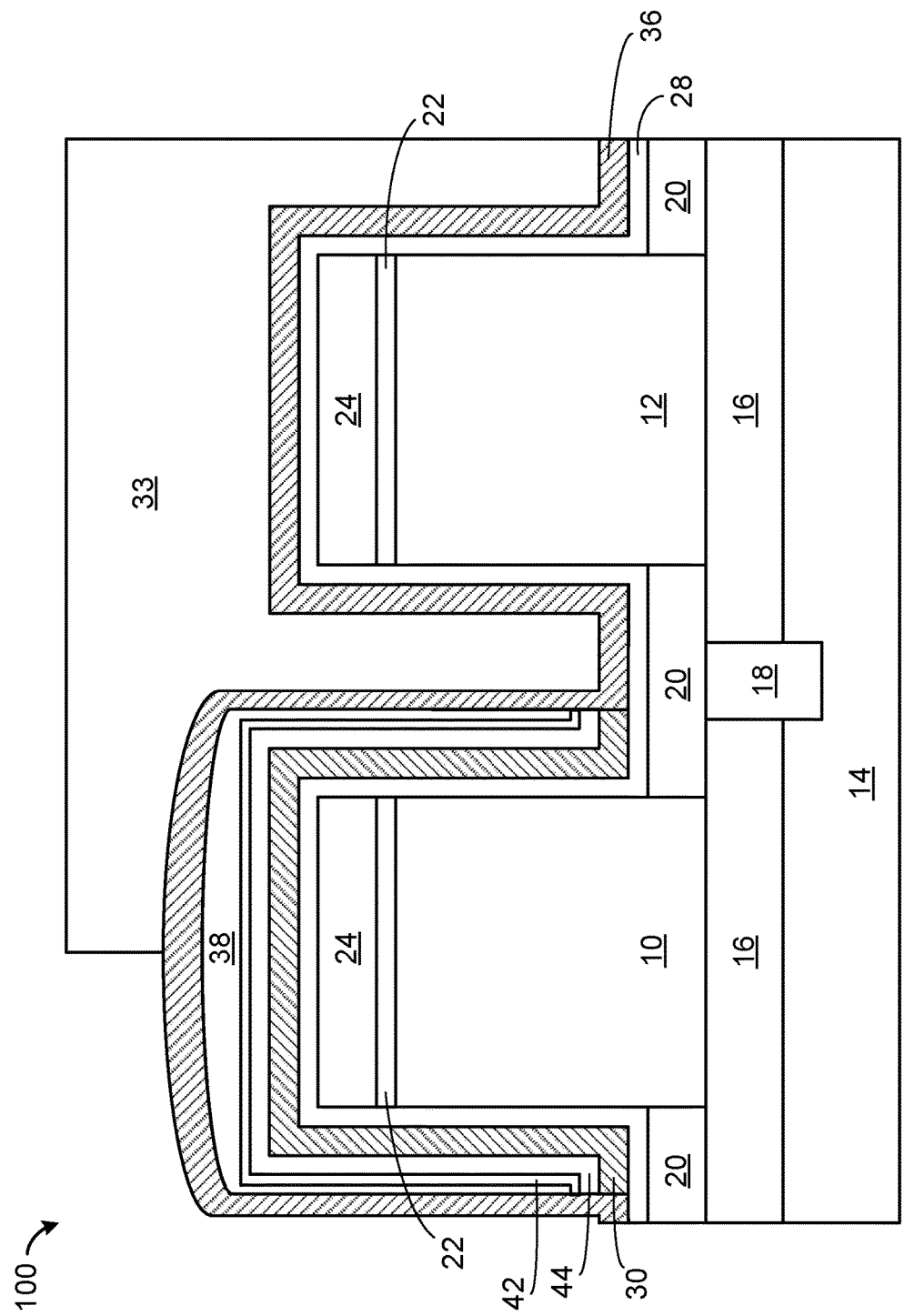
FIG. 26 illustrates a cross-sectional view of the semiconductor structure and illustrates forming a second photo resist mask, according to an exemplary embodiment.

Referring to FIG. 26, an organic planarization layer 33 may be deposited and patterned on the structure 100, according to an exemplary embodiment. The organic planarization layer 33 may be formed on the NFET WFM 36. In an embodiment, the organic planarization layer 33 may completely cover the NFET WFM 36 along the top and the vertical sidewalls of the fin 12 and may partially cover the NFET WFM 36 along the top and the vertical sidewalls of the fin 10. In an alternate embodiment, the organic planarization layer 33 may completely cover the NFET WFM 36 along the top and the vertical sidewalls of the fin 12 and may not cover the NFET WFM 36 along the top and the vertical sidewalls of the fin 10. The organic planarization layer 33 may be spin coated and optionally polished using a chemical mechanical polishing (CMP) technique. In an embodiment, the organic planarization layer 33 may include a three-layer stack, including an organic planarization layer (OPL), a hard mask, and a photo resist. The hard mask deposition may be deposited on the organic planarization layer 33. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 33 by reactive ion beam etching. The organic planarization layer 33 may protect an area over the fin 10 from subsequent processing steps, allowing separate processing in the area surrounding the fin 10 and an area surrounding the fin 12. The organic planarization layer 33 may have a height ranging from about 100 nm to 300 nm, and ranges there between, although a thickness less than 100 nm and greater than 300 nm may be acceptable.

Figure 27:
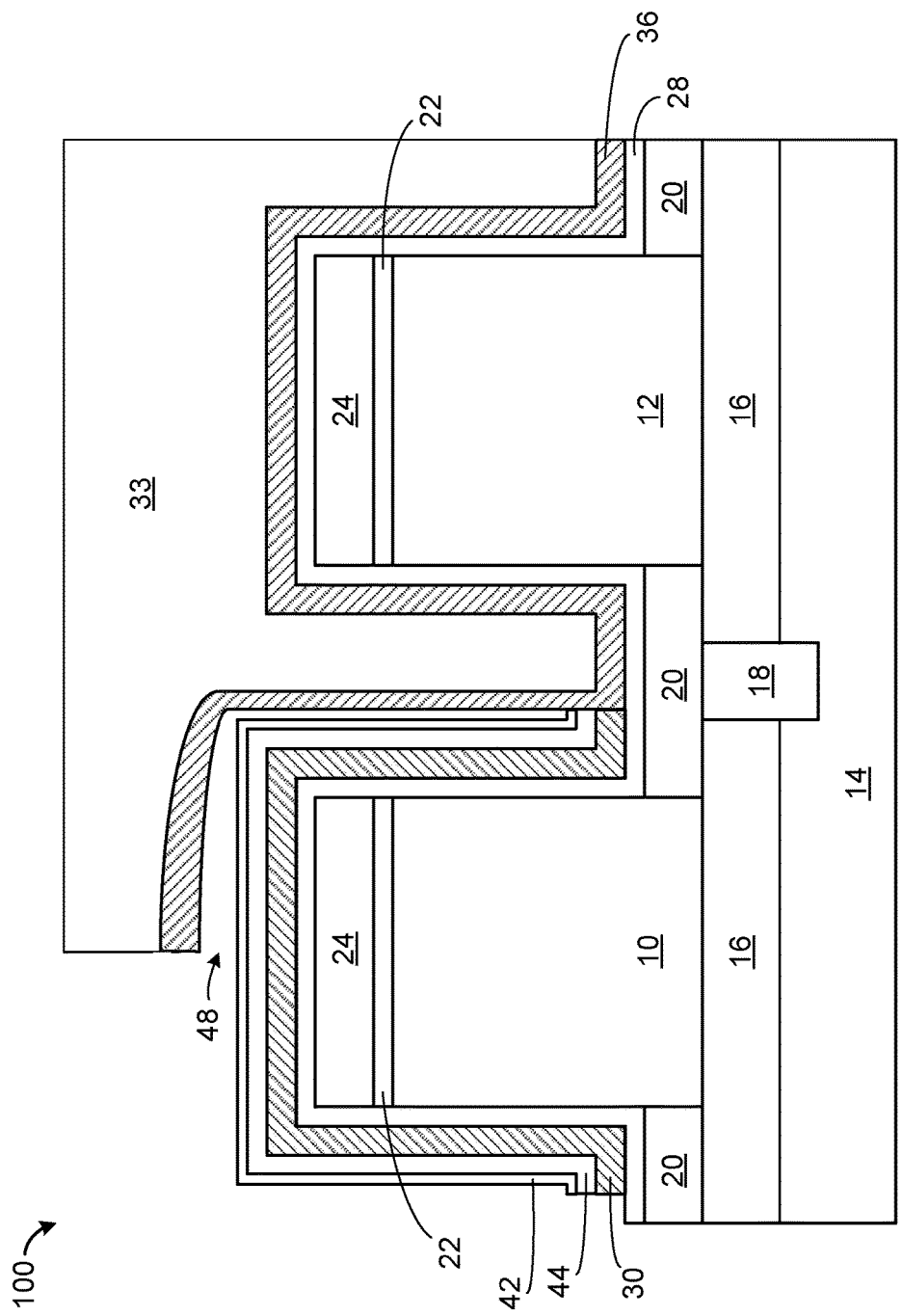
FIG. 27 illustrates a cross-sectional view of the semiconductor structure and illustrates removing a portion of the sacrificial material and a portion of the work function metal layer, according to an exemplary embodiment.

Referring to FIG. 27, a fourth opening 48 may be formed by recessing/etching a portion of the sacrificial layer 38, according to an exemplary embodiment. Specifically, the sacrificial layer 38 may be laterally removed from the top and along the vertical sidewalls of the fin 10. The portion of the sacrificial layer 38 may be etched selective to the organic planarization layer 33, where the portion of the NFET WFM 36 not covered by the organic planarization layer 33 in an area over the fin 10 may be removed. The portion of the sacrificial layer 38 may be etched selective to a remaining portion of the NFET WFM 36 and the cap layer 42 in an area over the fin 10. The cap layer 42 may be exposed along a horizontal top surface of the fin 10, and along a portion of the vertical sidewalls of the fin 10. A portion of a vertical side surface of the cap layer 42 and of a portion of a vertical side surface of the NFET WFM 36 may be exposed. A portion of a top layer of the insulator 28 may be exposed. The fourth opening 48 may be formed using an anisotropic vertical etch process such as a reactive ion etch (RIE), wets, or any suitable etch process.

Figure 28:
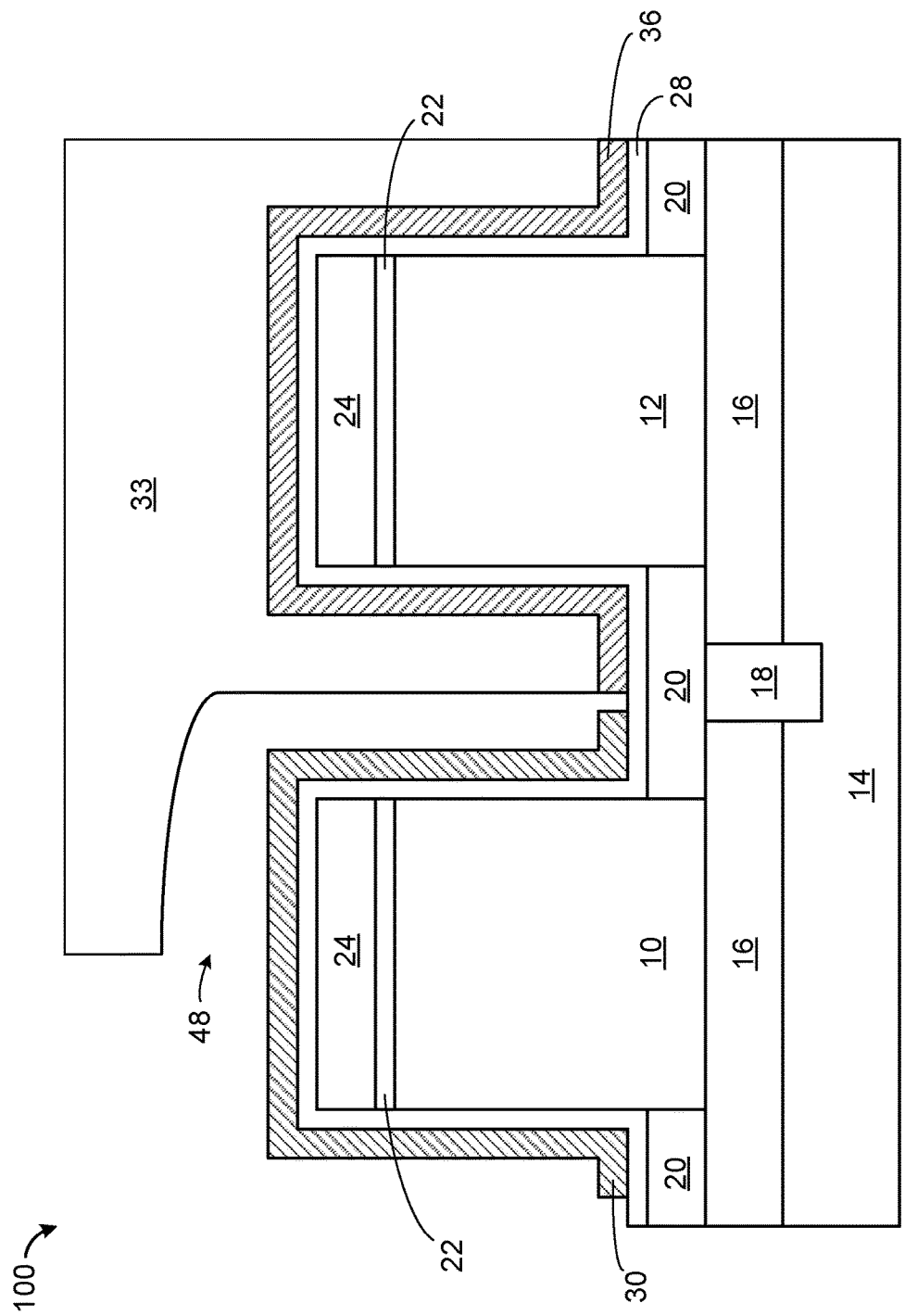
FIG. 28 illustrates a cross-sectional view of the semiconductor structure and illustrates removing a portion of the sacrificial material and a portion of the work function metal layer, according to an exemplary embodiment.

Referring to FIG. 28, the fourth opening 48 may be enlarged by recessing/etching the cap layer 42, the sacrificial buffer 44 and the NFET WFM 36, according to an exemplary embodiment. Specifically, the cap layer 42, the sacrificial buffer 44 and the NFET WFM 36 may be laterally removed from the horizontal top and along the vertical sidewalls of the fin 10, selective to the PFET WFM 30. The NFET WFM 36 may be removed selective to the organic planarization layer 33 and the PFET WFM 30 and a portion of the insulator 28. A remaining portion of the NFET WFM 36 may remain along a horizontal top surface of the fin 12 and along a portion of the sidewalls of the fin 12. The fourth opening 48 may be enlarged using an etch chemistry selective to the organic planarization layer 33, the cap layer 42, the PFET WFM 30, and the insulator 28, to laterally remove the NFET WFM 36 along the fourth opening 48. This may be performed in one or more steps. The etch chemistry used to enlarge the fourth opening 48 may be different than used when forming the fourth opening 48. The organic planarization layer 33 may protect a portion of the NFET WFM 36 in an area above and surrounding a portion of the vertical sidewalls of the fin 12. A top surface of the insulator 28 may be exposed in an area between the fin 10 and the fin 12.

The organic planarization layer 33 may be subsequently removed after etching according to known techniques.

Figure 29:
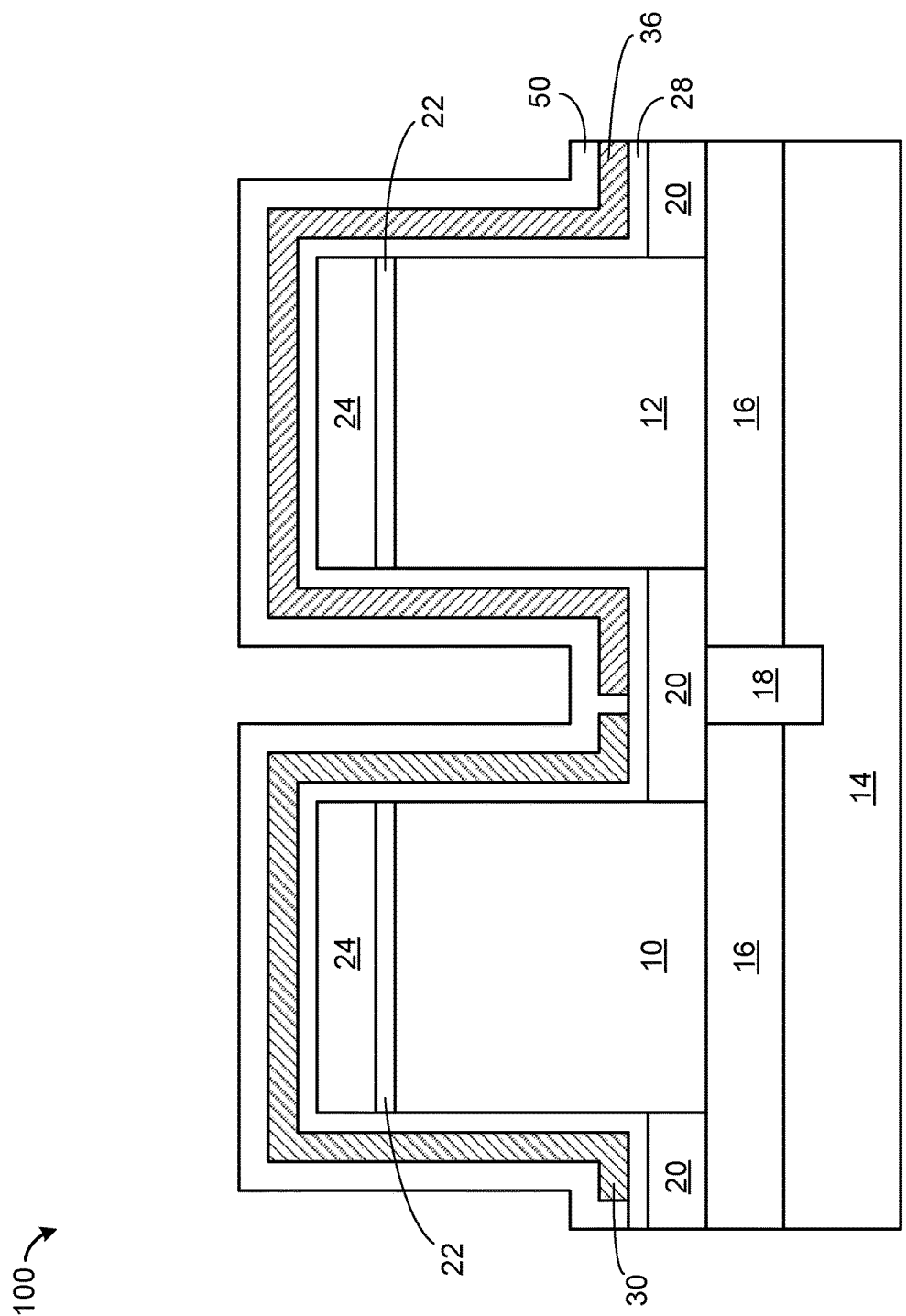
FIG. 29 illustrates a cross-sectional view of the semiconductor structure and illustrates removing the second photo resist mask, according to an exemplary embodiment.

Referring to FIG. 29, an electrode 50 may be conformally formed on exposed top surfaces of the structure 100, according to an exemplary embodiment. The electrode 50 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the electrode 50 may include one or more layers. The electrode 50 may be deposited on a top surface of the PFET WFM 30 along the top surface and a portion of the vertical side walls of the fin 10. The electrode 50 may be deposited on a top surface of the NFET WFM 36 along the top surface and a portion of the vertical side walls of the fin 10. The electrode 50 may be deposited on a portion of the top surface of the insulator 28. In an embodiment, the electrode 50 may include a conformal conductive material, for example, titanium nitride, TiN. The electrode 50 may provide a conductive path between a gate of a device, for example the electrode 50 may be connected to the PFET WFM 30 and the NFET WFM 36. In an embodiment, the electrode 50 may have a thickness ranging from about 3 nm to about 8 nm, and ranges there between, although a thickness less than 3 nm and greater than 8 nm may be acceptable.

Figure 30:
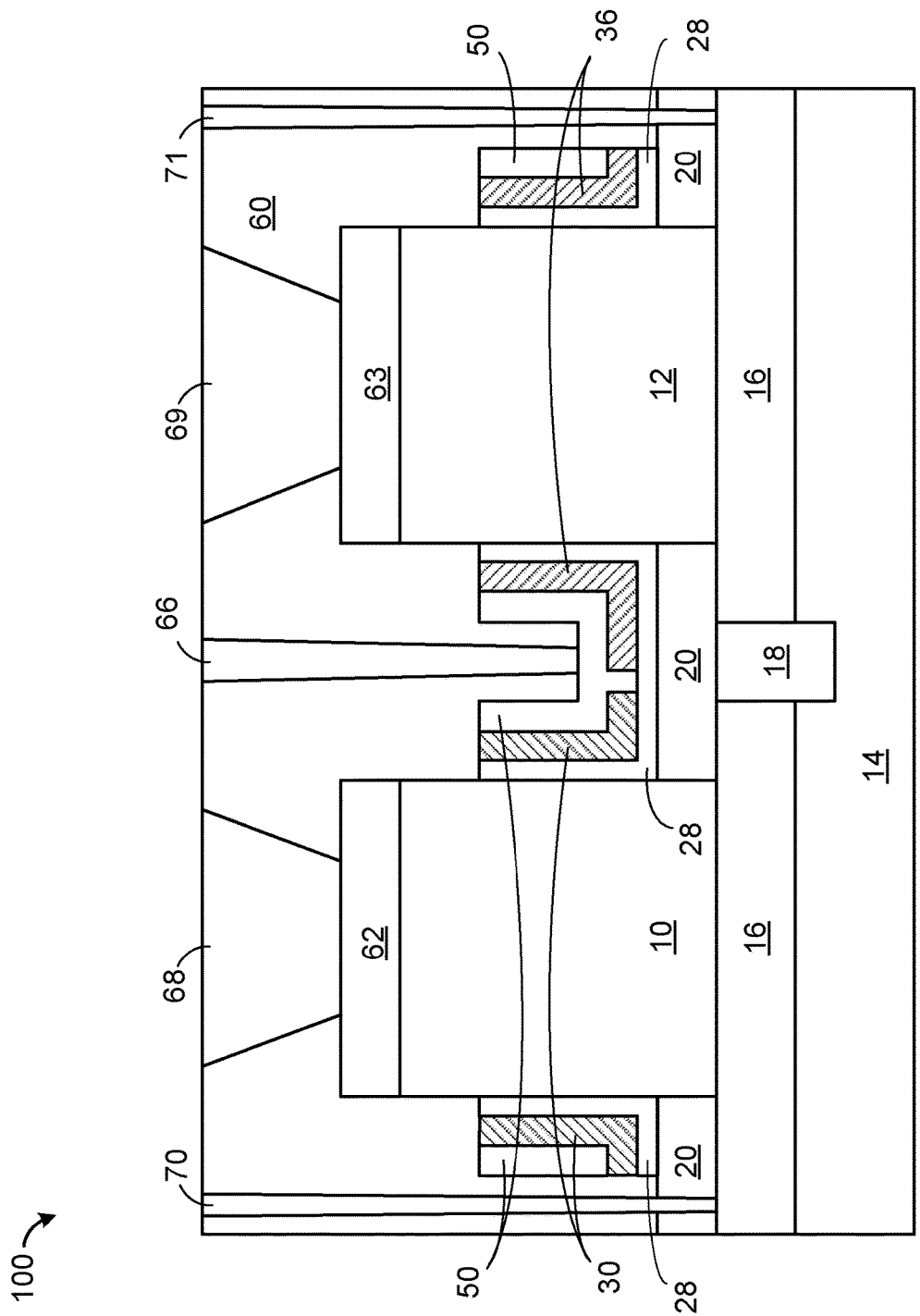
FIG. 30 illustrates a cross-sectional view of the semiconductor structure semiconductor, and illustrates a complete structure, according to an exemplary embodiment.

Referring to FIG. 30, subsequent processing of the structure 100 may be performed, according to an exemplary embodiment. The subsequent processing may include selective etching/recessing to remove materials. In the area surrounding the fin 10, a portion of the electrode 50, a portion of the PFET WFM 30, and a portion of the insulator 28 may be removed from the horizontal top surface of the fin 10 and may be removed from a portion of the vertical side wall of the fin 10. A remaining portion of the electrode 50, a remaining portion of the PFET WFM 30, and a remaining portion of the insulator 28 may remain along a portion of the vertical side wall of the fin 10. In the area surrounding the fin 12, a portion of the electrode 50, a portion of the NFET WFM 36 and a portion of the insulator 28 may be removed from a horizontal top surface of the fin 12 and may be removed from a portion of the vertical side wall of the fin 12. A remaining portion of the electrode 50, a remaining portion of the NFET WFM 36 and a remaining portion of the insulator 28 may remain along a portion of the vertical side wall of the fin 12. An additional remaining portion of the electrode 50 may remain over the horizontal top surface of the insulator 28 between the fin 10 and the fin 12. The hard mask 24 and the insulator 22 may be removed from the horizontal top surface of the fins 10 and 12.

A PFET top epitaxy 62 may be formed on the horizontal top surface of the fin 10 and an NFET top epitaxy 63 may be formed on the horizontal top surface of the fin 12. A dielectric 60 may be formed over the structure 100, covering a top surface and a vertical side surface of the PFET top epitaxy 62, covering a top surface and a vertical side surface of the NFET top epitaxy 63, a portion of a horizontal side wall of the fin 10 and the fin 12, a portion of the top surface of the insulator 28, a portion of the top surface of the PFET WFM 30, and a portion of the top surface of the NFET WFM 36. Openings may be made in the dielectric 60, in which contacts may be formed. A PFET top source drain contact 68 may be formed which connects to the PFET top epitaxy 62. An NFET top source drain contact 69 may be formed which connects to the NFET top epitaxy 63. A gate contact 66 may be formed which connects to the electrode 50. A PFET bottom source drain contact 70 may be formed connecting to the epitaxy 16 which is adjacent to the fin 10. An NFET bottom source drain contact 71 may be formed connecting to the epitaxy 16 which is adjacent to the fin 12. Each of the steps illustrated and described in regards to FIG. 30 may be performed in one or more steps, may be performed simultaneously, may be performed in an alternate sequence, and may be performed using known semiconductor manufacturing processes.

The gate contact 66 may be electrically connected to the electrode 50, the PFET WFM 30 and the NFET WFM 36. The PFET WFM 30 surrounding a portion of the vertical sidewalls of the fin 10 may operate as a PFET gate of a first vertical FET device, and the electrically isolated NFET WFM 36 surrounding a portion of the vertical sidewalls of the fin 12 may operate as an NFET gate for a second vertical FET device. The NFET WFM 36 may surround the PFET WFM 30, and may have minimal effect of the operation of the first vertical FET device. The first vertical FET device and the second vertical FET device may have different operating thresholds, due to different materials used in the WFM of each device, different epitaxies used in each of the bottom source drain regions and the top source drain regions, and other material and structural differences.

In this embodiment, the electrode 50 may serve as a gate contact and is connected to both the PFET WFM 30 and the NFET WFM 36. In a prior embodiment, the PFET WFM 30 and the NFET WFM 36 were adjacent and served as a gate contact.

Figure 31:
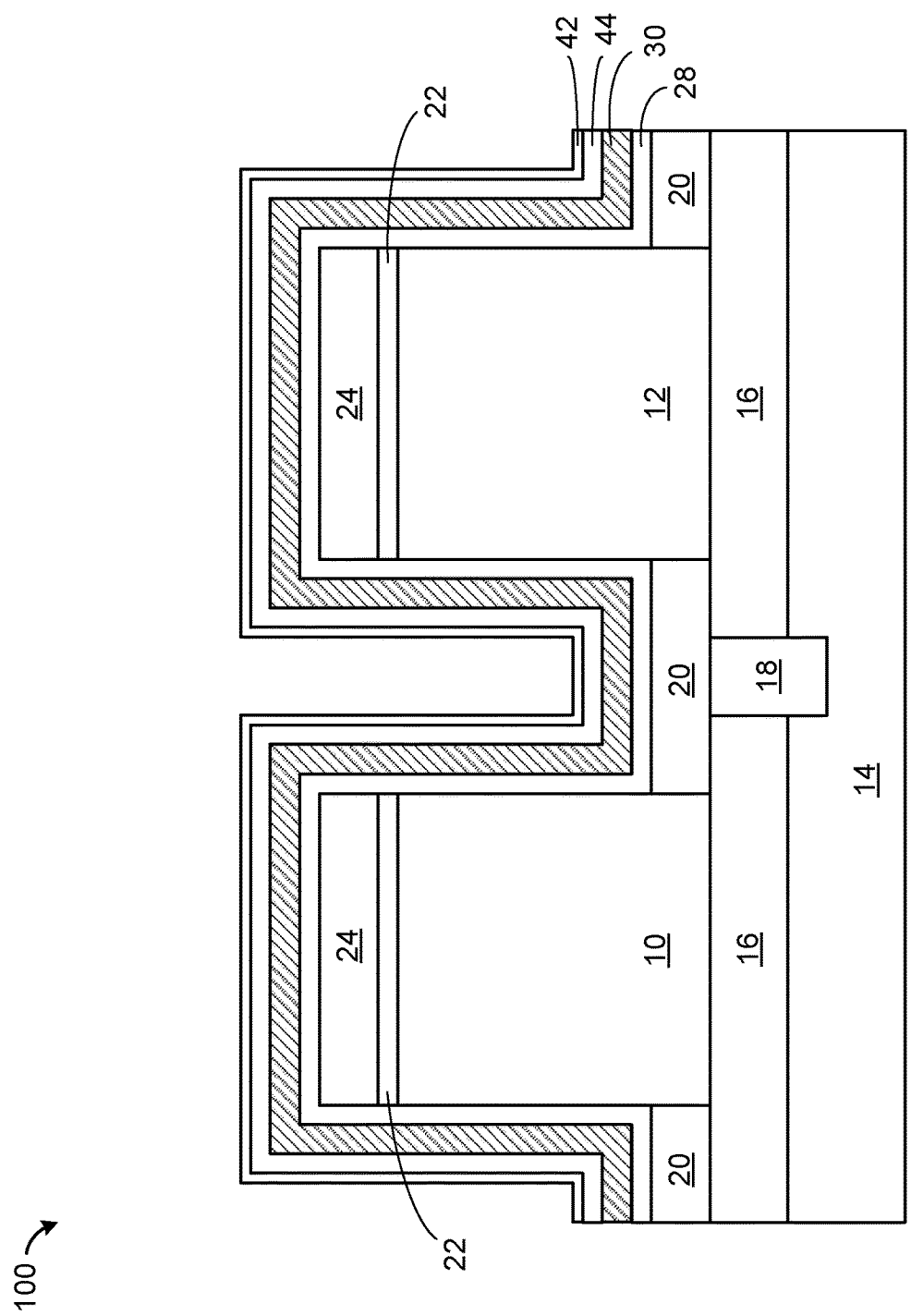
FIG. 31 illustrates a cross-sectional view of the semiconductor structure and illustrates forming a work function metal layer and a sacrificial buffer, according to an exemplary embodiment.

An alternate embodiment of forming different work function metal gates on adjacent fins is now shown starting with FIG. 2 and continuing with FIG. 31.

Referring to FIG. 31, a PFET work function metal layer (hereinafter "PFET WFM") 30 may be conformally formed on exposed top surfaces of the structure 100, according to an exemplary embodiment. The PFET WFM 30 may be deposited using typical deposition techniques, for example, atomic layer deposition (ALD), molecular layer deposition (MLD), and chemical vapor deposition (CVD). In an embodiment, the PFET WFM 30 may include one or more layers. The PFET WFM 30 may be deposited on a top surface of the insulator 28. The PFET WFM 30 may be deposited on a top surface of the insulator 28 along the horizontal top surface and a portion of the vertical side walls of the fin 12 and the fin 10. The PFET WFM 30 may be deposited on a portion of the horizontal top surface of the insulator 28 between the fins 10 and 12. In an embodiment, the PFET WFM 30 may include a work function metal, including a metal nitride, for example, titanium nitride or tantalum nitride, titanium carbide or titanium aluminum carbide. In an embodiment, the WFM 30 may have a conformal thickness ranging from about 3 nm to about 8 nm, and ranges there between, although a thickness less than 3 nm and greater than 8 nm may be acceptable.

A sacrificial buffer 44 may be conformally formed on exposed top surfaces of the structure 100, according to an exemplary embodiment. The sacrificial buffer 44 may be deposited on a top surface of the PFET WFM 30. The sacrificial buffer 44 may include any material able to be selectively removed relative to other materials used in this embodiment. In an embodiment, the sacrificial buffer 44 may include aluminum oxide and lanthanum oxide. The sacrificial buffer 44 may be deposited using typical deposition techniques, for example, atomic layer deposition (ALD), molecular layer deposition (MLD), and chemical vapor deposition (CVD). The sacrificial buffer 44 may be recessed/etched, according to an exemplary embodiment. The sacrificial buffer 44 may be recessed using an anisotropic vertical etch process such as a reactive ion etch (RIE), or any suitable etch process. The sacrificial buffer 44 may be thinned to a uniform thickness on the top surface of the PFET WFM 30 of about 1 nm, although a thickness less than 1 nm or above 1 nm may be acceptable.

A cap layer 42 may be conformally formed on exposed top surfaces of the structure 100, according to an exemplary embodiment. The cap layer 42 may be deposited on a top surface of the sacrificial buffer 44. The cap layer may include a metal nitride, for example TiN, and may be used as a protecting layer for subsequent patterning. The cap layer 42 may be deposited using typical deposition techniques, for example, atomic layer deposition (ALD), molecular layer deposition (MLD), and chemical vapor deposition (CVD). The cap layer 42 may be recessed/etched, according to an exemplary embodiment. The cap layer 42 may be recessed using an anisotropic vertical etch process such as a reactive ion etch (RIE), or any suitable etch process. The cap layer 42 may be thinned to a uniform thickness on the top surface of sacrificial buffer 44 of about 1 nm, although a thickness less than 1 nm or above 1 nm may be acceptable.

Figure 32:
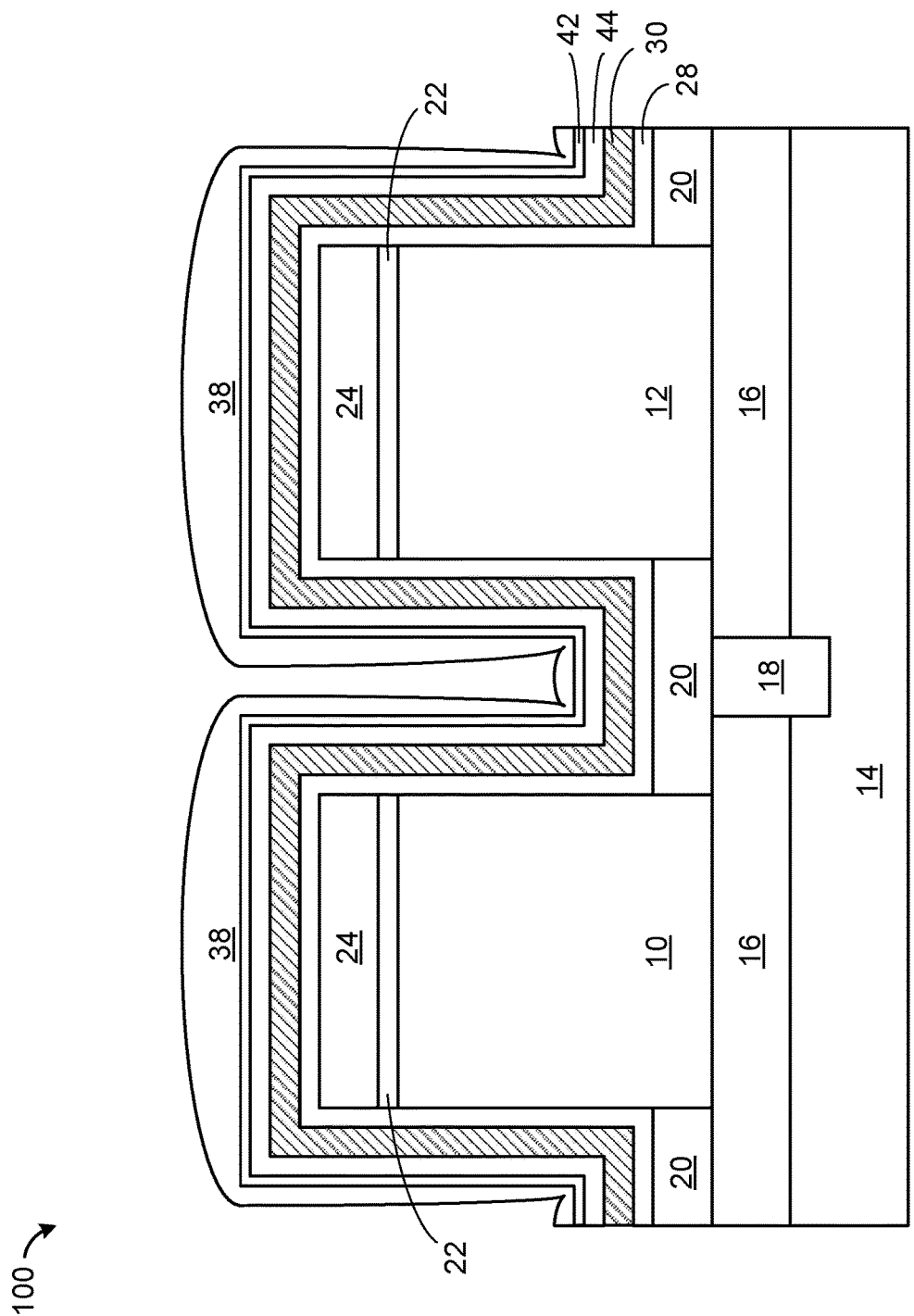
FIG. 32 illustrates a cross-sectional view of the semiconductor structure and illustrates forming a sacrificial material, according to an exemplary embodiment.

Referring to FIG. 32, a sacrificial layer 38 may be formed on exposed top surfaces of the structure 100, according to an exemplary embodiment. The sacrificial layer 38 may be deposited on a top surface of the cap layer 42. The sacrificial layer 38 may have a non-conformal top surface with a greater thickness above the fin 10 and above the fin 12 compared to a thickness between the fins 10, 12. The sacrificial layer 38 may include silicon germanium, any suitable silicon or polysilicon, and other sacrificial materials able to be selectively removed relative to other materials used in this embodiment. In an embodiment, the sacrificial layer 38 may be deposited by PVD and/or by CVD. In an embodiment, a combination of deposition techniques, such as conventional PVD and modified PVD derivatives, for example directional PVD deposition, and CVD, may be used. In an embodiment, the sacrificial layer 38 may have a vertical thickness, or height, above the cap layer 42 ranging from about 3 nm to about 20 nm.

Figure 33:
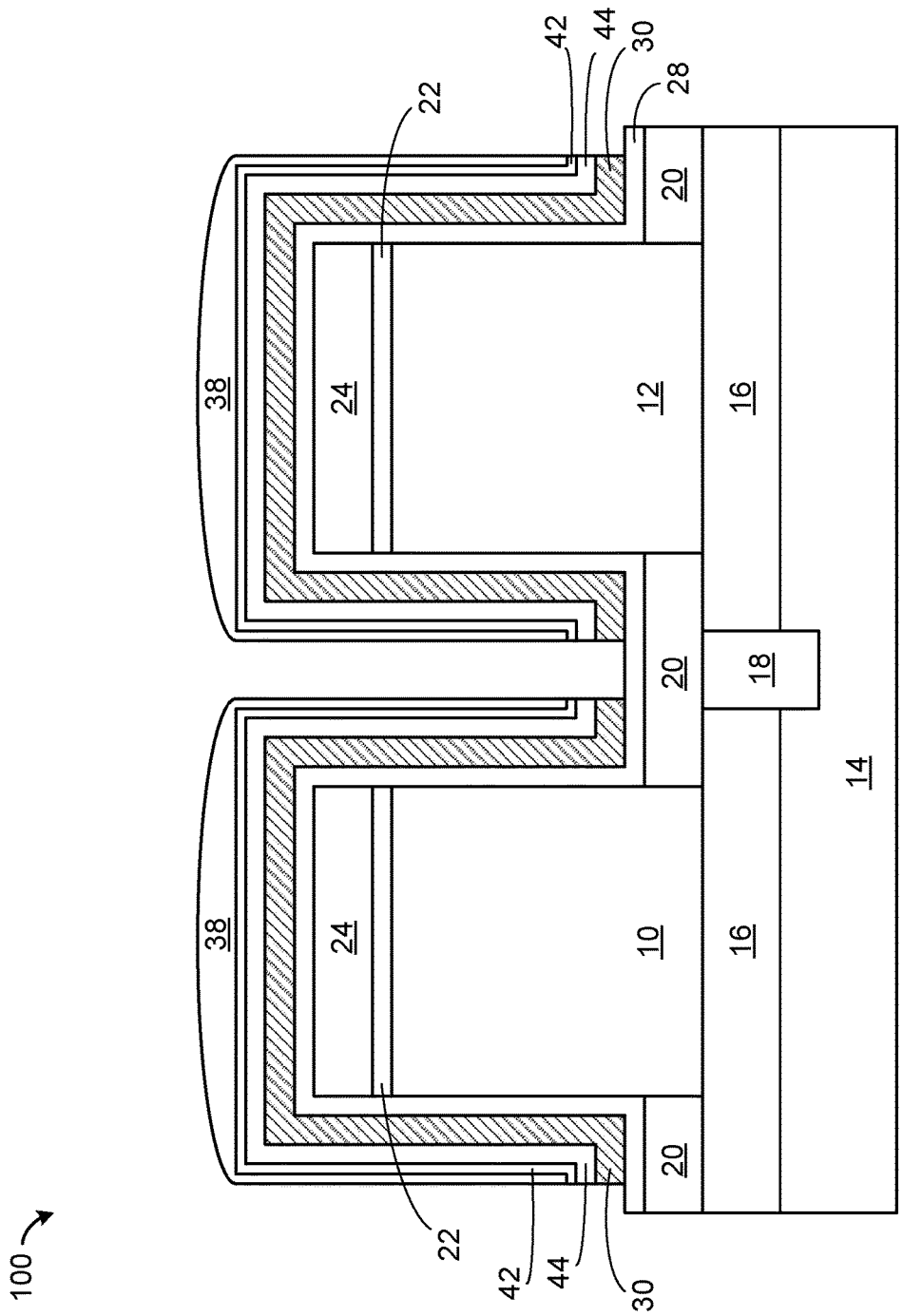
FIG. 33 illustrates a cross-sectional view of the semiconductor structure and illustrates reducing the sacrificial buffer, the sacrificial material and the work function metal layer, according to an exemplary embodiment.

Referring to FIG. 33, the sacrificial layer 38, the cap layer 42, the sacrificial buffer 44, and the PFET WFM 30 may be recessed/etched, according to an exemplary embodiment. The sacrificial layer 38, the cap layer 42, the sacrificial buffer 44, and the PFET WFM 30 may be etched using an anisotropic vertical etch process such as a reactive ion etch (RIE), wets, or any suitable etch process. This may be performed in one or more steps. Due to the greater thickness of the sacrificial layer 38 above the fin 10 and above the fin 12 compared to the thickness between the fins 10, 12, the sacrificial layer 38, the cap layer, the sacrificial buffer 44, and the PFET WFM 30 may be removed in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the sacrificial layer 38, the cap layer 42, the sacrificial buffer 44, and the PFET WFM 30, and the insulator 28 may remain alongside a portion of a vertical sidewall of the fin 10 and alongside a portion of a vertical sidewall of the fin 12. The sacrificial layer 38, the cap layer 42, the sacrificial buffer 44, and the PFET WFM 30 may remain on a horizontal top surface of the fin 10, and on a horizontal top surface of the fin 12.

Figure 34:
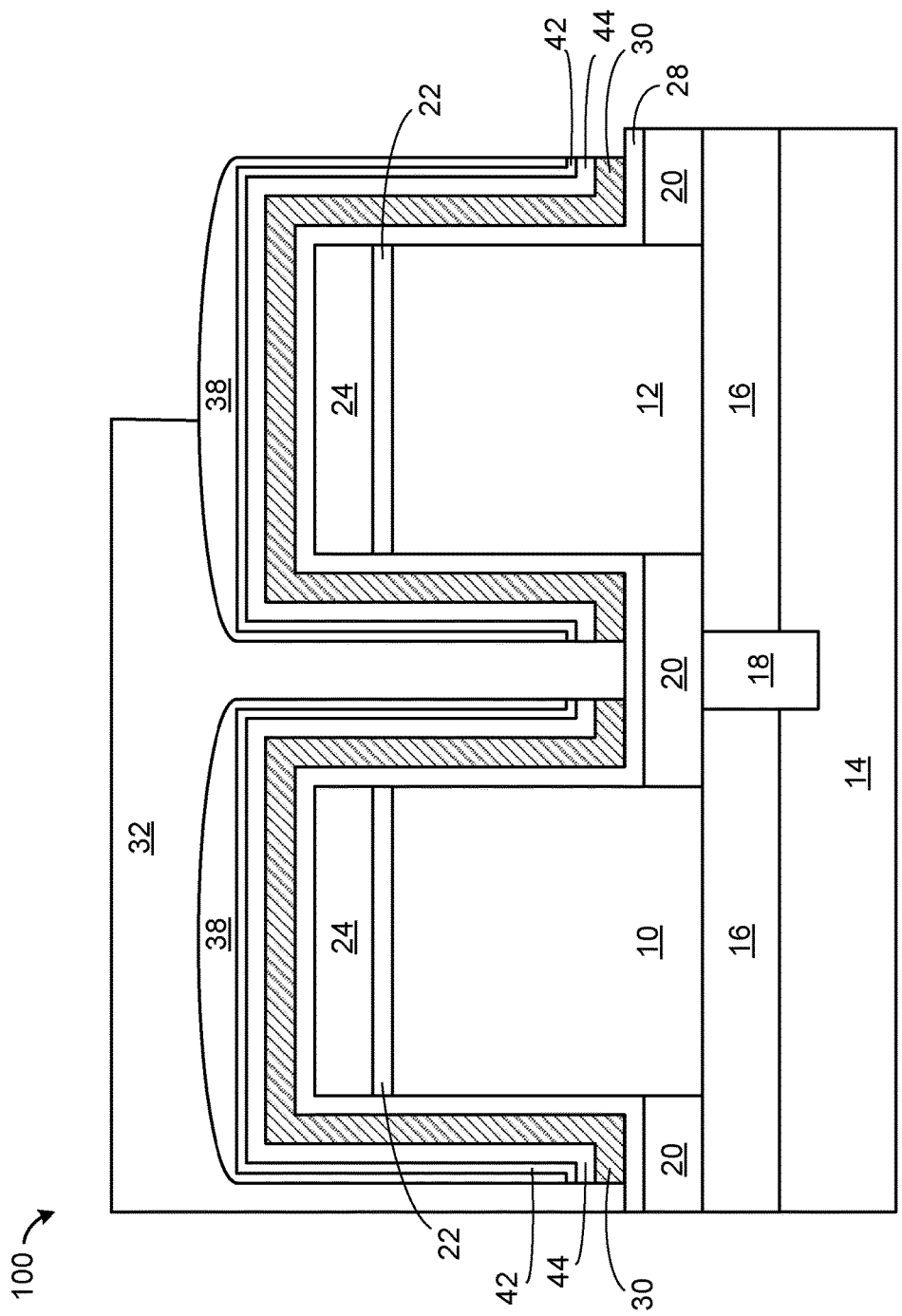
FIG. 34 illustrates a cross-sectional view of the semiconductor structure and illustrates forming a photo resist mask, according to an exemplary embodiment.

Referring to FIG. 34, an organic planarization layer 32 may be deposited and patterned on the structure 100, according to an exemplary embodiment. In an embodiment, the organic planarization layer 32 may be formed on the sacrificial layer 38 over the fin 10 and partially over the fin 12. The organic planarization layer 32 may be formed on a portion of the cap layer 42, on a portion of the sacrificial buffer 44, and on a portion of the PFET WFM 30, all along a portion of the sidewall of the fin 10, and all along a portion of the sidewall of the fin 12. In an alternate embodiment, the organic planarization layer 32 may be formed on the sacrificial layer 38 over the fin 10, and may not be formed on the sacrificial layer 38 over the fin 12. The organic planarization layer 32 may be spin coated and optionally polished using a chemical mechanical polishing (CMP) technique. In an embodiment, the organic planarization layer 32 may include a three-layer stack, including an organic planarization layer (OPL), a hard mask, and a photo resist. The hard mask deposition may be deposited on the organic planarization layer 32. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 32 by reactive ion beam etching. The organic planarization layer 32 may protect an area over the fin 10 from subsequent processing steps, allowing separate processing in the area surrounding the fin 10 and an area surrounding the fin 12. The organic planarization layer 32 may have a height ranging from about 100 nm to 300 nm, and ranges there between, although a thickness less than 100 nm and greater than 300 nm may be acceptable.

Figure 35:
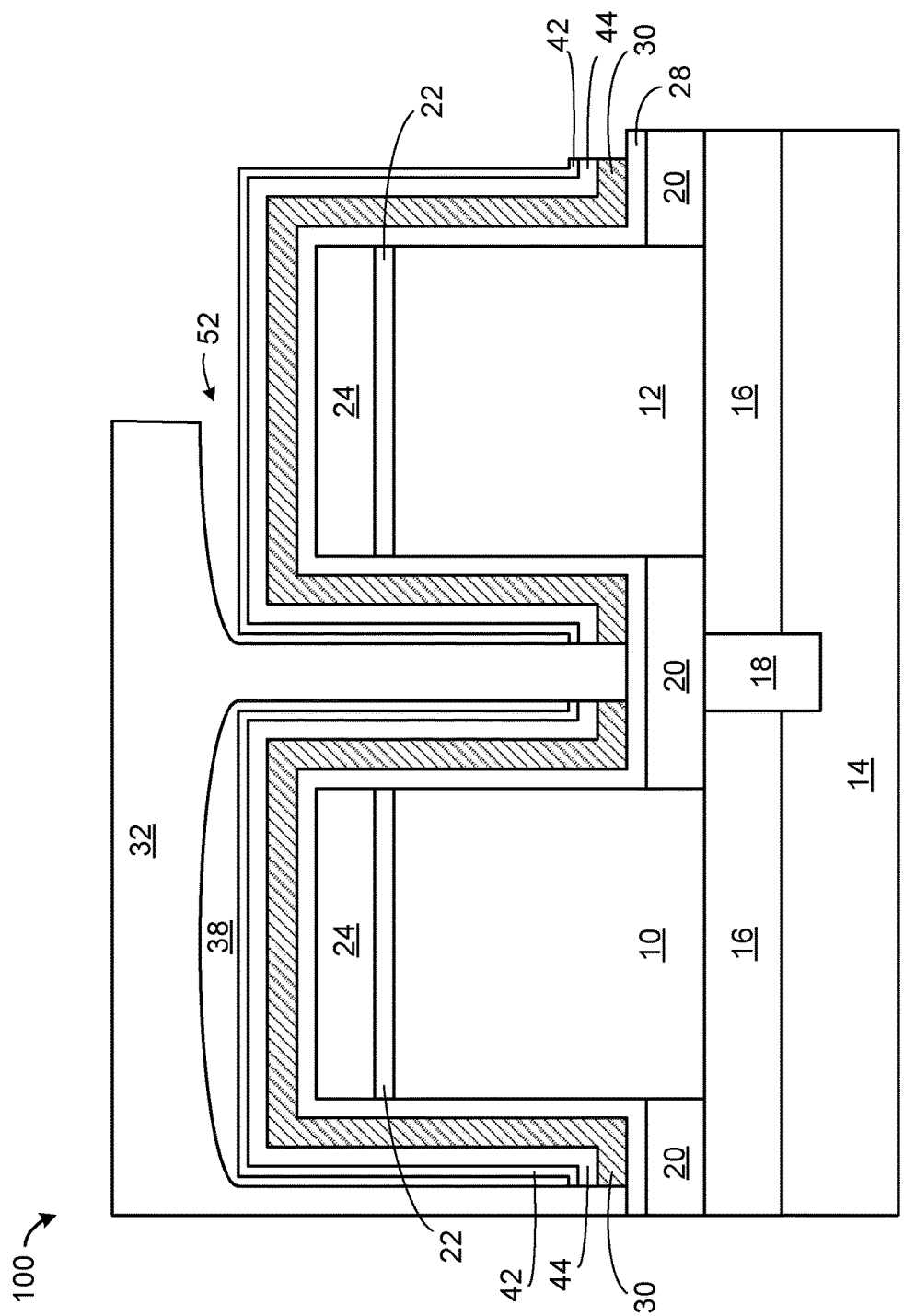
FIG. 35 illustrates a cross-sectional view of the semiconductor structure and illustrates reducing the sacrificial material, according to an exemplary embodiment.

Referring to FIG. 35, a fifth opening 52 may be formed by recessing/etching the sacrificial layer 38, selective to the organic planarization layer 32 and a portion of the cap layer 42 over the fin 12, according to an exemplary embodiment. Specifically, the sacrificial layer 38 may be laterally removed from the top and along the vertical sidewalls of the fin 12. The fifth opening 52 may be formed using an etch chemistry selective to the organic planarization layer 32 and the cap layer 42, to laterally remove the sacrificial buffer 44 on the top and along the vertical sidewalls of the fin 12. The organic planarization layer 32 may protect a portion of the sacrificial layer 38 in an area above and surrounding a portion of the vertical sidewalls of the fin 10. A portion of a top layer of the insulator 28 may be exposed. The fifth opening 52 may be formed using an anisotropic vertical etch process such as a reactive ion etch (RIE), wets, or any suitable etch process.

Figure 36:
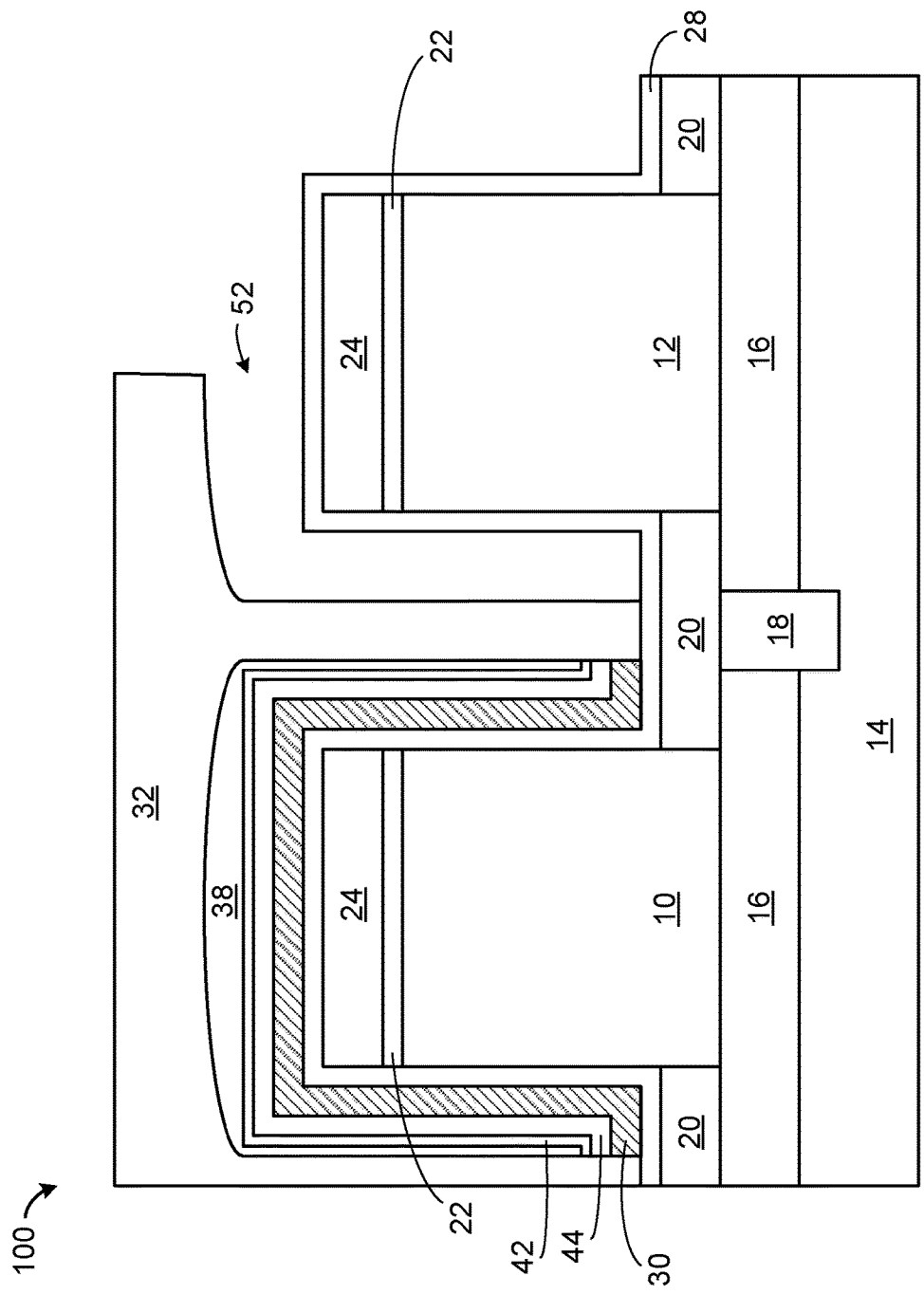
FIG. 36 illustrates a cross-sectional view of the semiconductor structure and illustrates removing a portion of the work function metal layer, according to an exemplary embodiment.

Referring to FIG. 36, the fifth opening 52 may be enlarged by recessing/etching the cap layer 42, the sacrificial buffer 44 and PFET WFM 30, selective to the organic planarization layer 32 and a portion of the insulator 28, according to an exemplary embodiment. Specifically, sacrificial buffer 44 and PFET WFM 30 may be laterally removed from the top and along the vertical sidewalls of the fin 12. This may be performed in one or more steps. The second opening 40 may be enlarged using an etch chemistry selective to the organic planarization layer 32 and the insulator 28, to laterally remove the cap layer 42, the sacrificial buffer 44, and the PFET WFM 30 on the top and along the vertical sidewalls of the fin 12. The organic planarization layer 32 may protect a portion of the sacrificial material 38 in area above and surrounding a portion of the vertical sidewalls of the fin 10. A top surface of the insulator 28 may be exposed along a portion of a vertical sidewall of the fin 12 and in an area between the fin 10 and the fin 12. A portion of the insulator 28 may remain along a portion of the vertical sidewall of the fin 12, and on a horizontal top surface of the fin 12.

Figure 37:
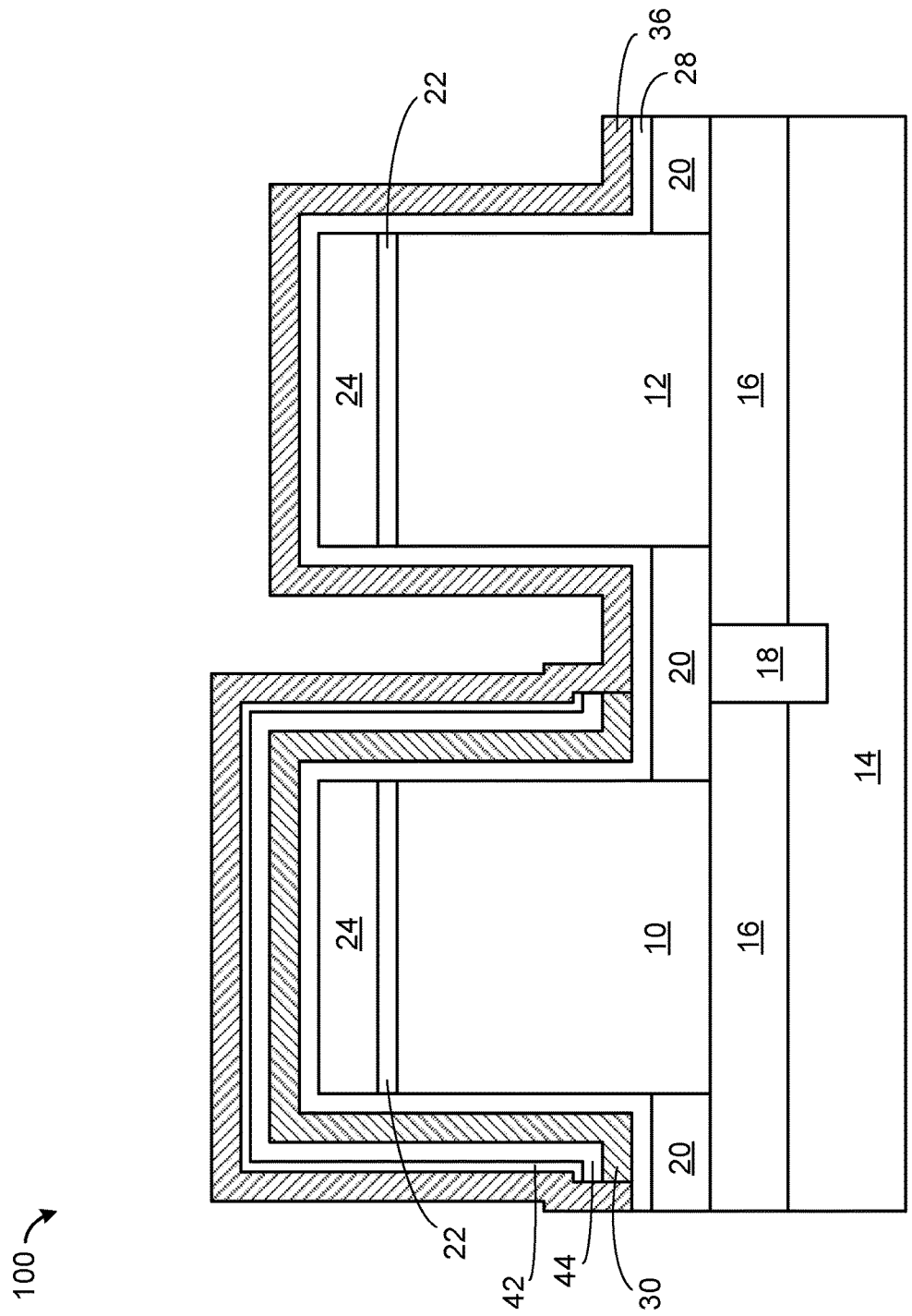
FIG. 37 illustrates a cross-sectional view of the semiconductor structure and illustrates removing the photo resist mask and forming a second work function metal layer, according to an exemplary embodiment.

Referring to FIG. 37, an NFET work function metal layer (hereinafter "NFET WFM") 36 may be conformally formed on the structure 100, according to an exemplary embodiment. The NFET WFM 36 may be deposited using typical deposition techniques, for example, atomic layer deposition (ALD), molecular layer deposition (MLD), and chemical vapor deposition (CVD). In an embodiment, the NFET WFM 36 may include one or more layers. The NFET WFM 36 may be deposited on a top surface of the insulator 28 along the horizontal top surface and a portion of the vertical side walls of the fin 12. The NFET WFM 36 may be deposited on a top surface of the cap layer 42 along the top surface and a portion of the vertical side walls of the fin 10. The NFET WFM 36 may be deposited on a portion of the cap layer 42, a portion of the sacrificial buffer 44, and a portion of the PFET WFM 30, along a portion of the vertical side of the fin 10. The NFET WFM 36 may be deposited on a portion of the horizontal top surface of the insulator 28 between the fins 10 and 12. In an embodiment, the NFET WFM 36 may include a work function metal including titanium aluminum carbide and may include a different work function metal than the PFET WFM 30. In an embodiment, the NFET WFM 36 may have a conformal thickness ranging from about 3 nm to about 8 nm, and ranges there between, although a thickness less than 3 nm and greater than 8 nm may be acceptable.

Figure 38:
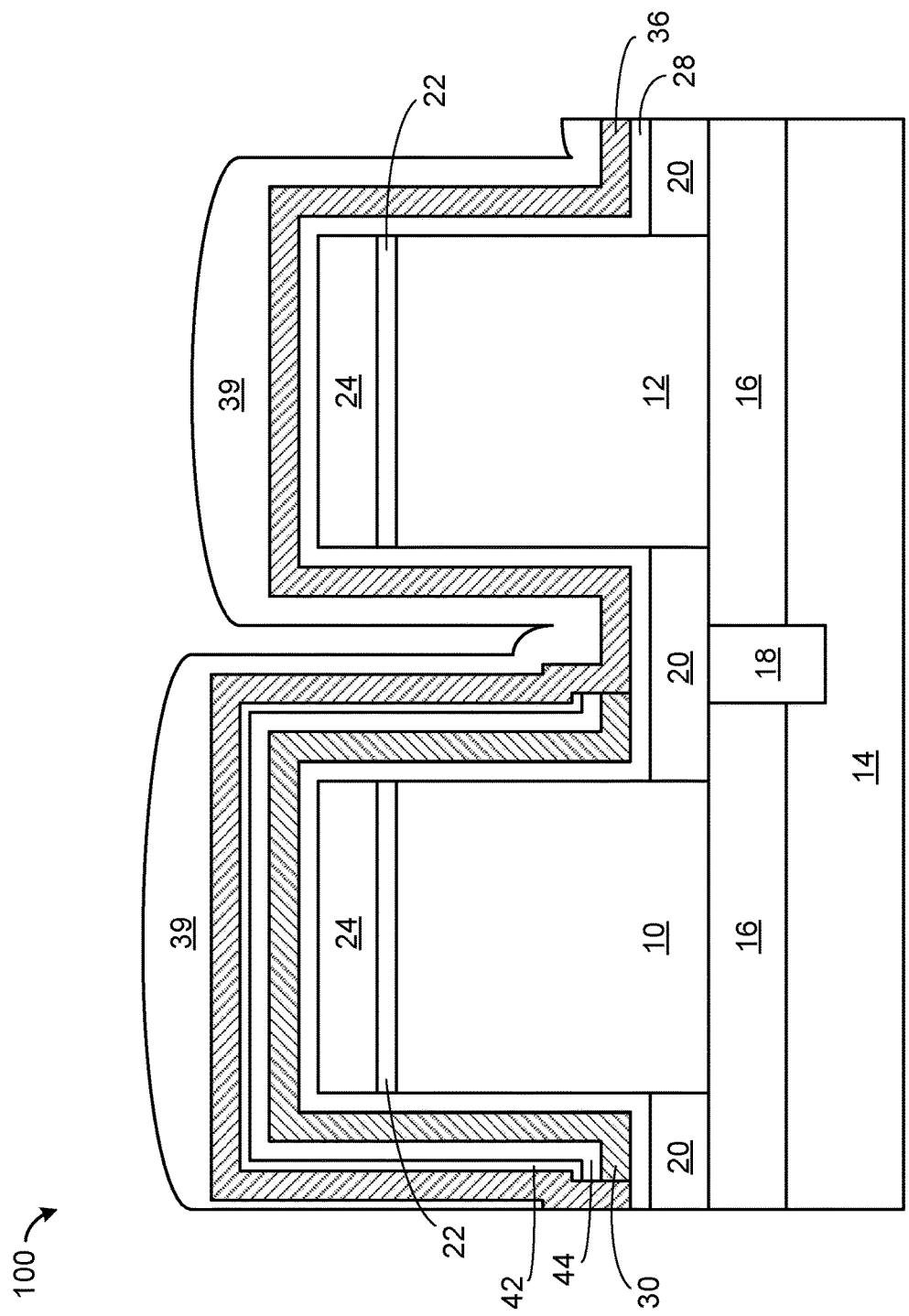
FIG. 38 illustrates a cross-sectional view of the semiconductor structure and illustrates forming a third sacrificial material, according to an exemplary embodiment.

Referring to FIG. 38, a sacrificial layer 39 may be formed on exposed top surfaces of the structure 100, according to an exemplary embodiment. The sacrificial layer 39 may be deposited on a top surface of the sacrificial buffer 44. The sacrificial layer 39 may have a non-conformal top surface with a greater thickness above the fin 10 and above the fin 12 compared to a thickness between the fins 10, 12. The sacrificial layer 39 may include silicon germanium, any suitable silicon or polysilicon, and other sacrificial materials able to be selectively removed relative to other materials used in this embodiment. In an embodiment, the sacrificial layer 39 may be deposited by PVD and/or by CVD. In an embodiment, a combination of deposition techniques, such as conventional PVD and modified PVD derivatives, for example directional PVD deposition, and CVD, may be used. In an embodiment, the sacrificial layer 39 may have a vertical thickness, or height, above the NFET WFM 36 ranging from about 3 nm to about 20 nm.

Figure 39:
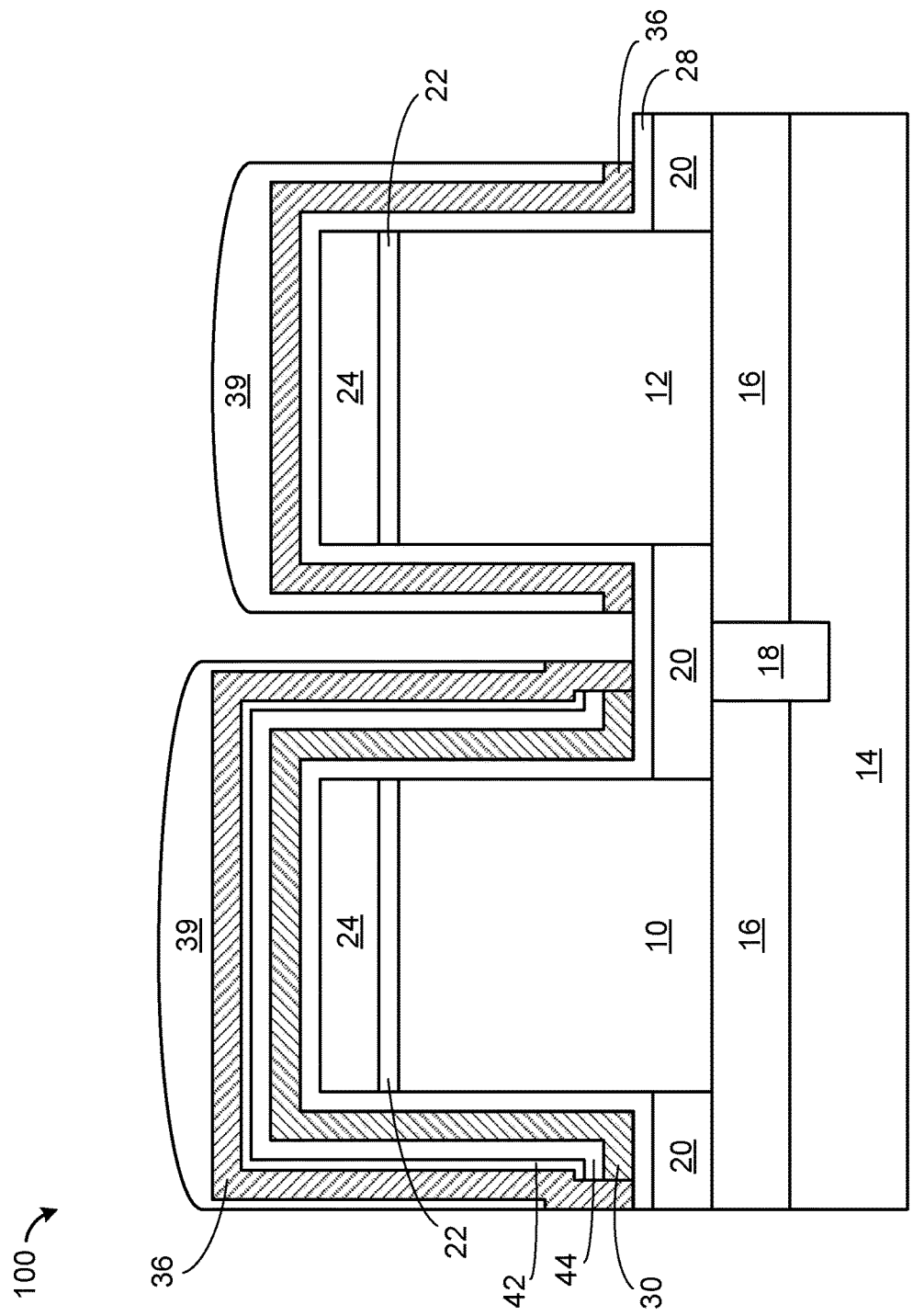
FIG. 39 illustrates a cross-sectional view of the semiconductor structure and illustrates removing a portion of the second work function metal layer, according to an exemplary embodiment.

Referring to FIG. 39, the sacrificial layer 39 and the NFET WFM 36 may be recessed/etched, according to an exemplary embodiment. The sacrificial layer 39 and the NFET WFM 36 may be recessed using an anisotropic vertical etch process such as a reactive ion etch (RIE), wets, or any suitable etch process. This may be performed in one or more steps. Due to the greater thickness of the sacrificial layer 39 above the fin 10 and above the fin 12 compared to the thickness between the fins 10, 12, the sacrificial layer 39 and the NFET WFM 36 may be removed in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the sacrificial layer 39, the cap layer 42, the sacrificial buffer 44, and the PFET WFM 30, and the insulator 28 may remain alongside a portion of a vertical sidewall of the fin 10 and on the horizontal top surface of the fin 10. The sacrificial layer 39, and the NFET WFM 36 may remain on a horizontal top surface of the fin 12 and on a portion of the vertical side surface of the fin 12.

Figure 40:
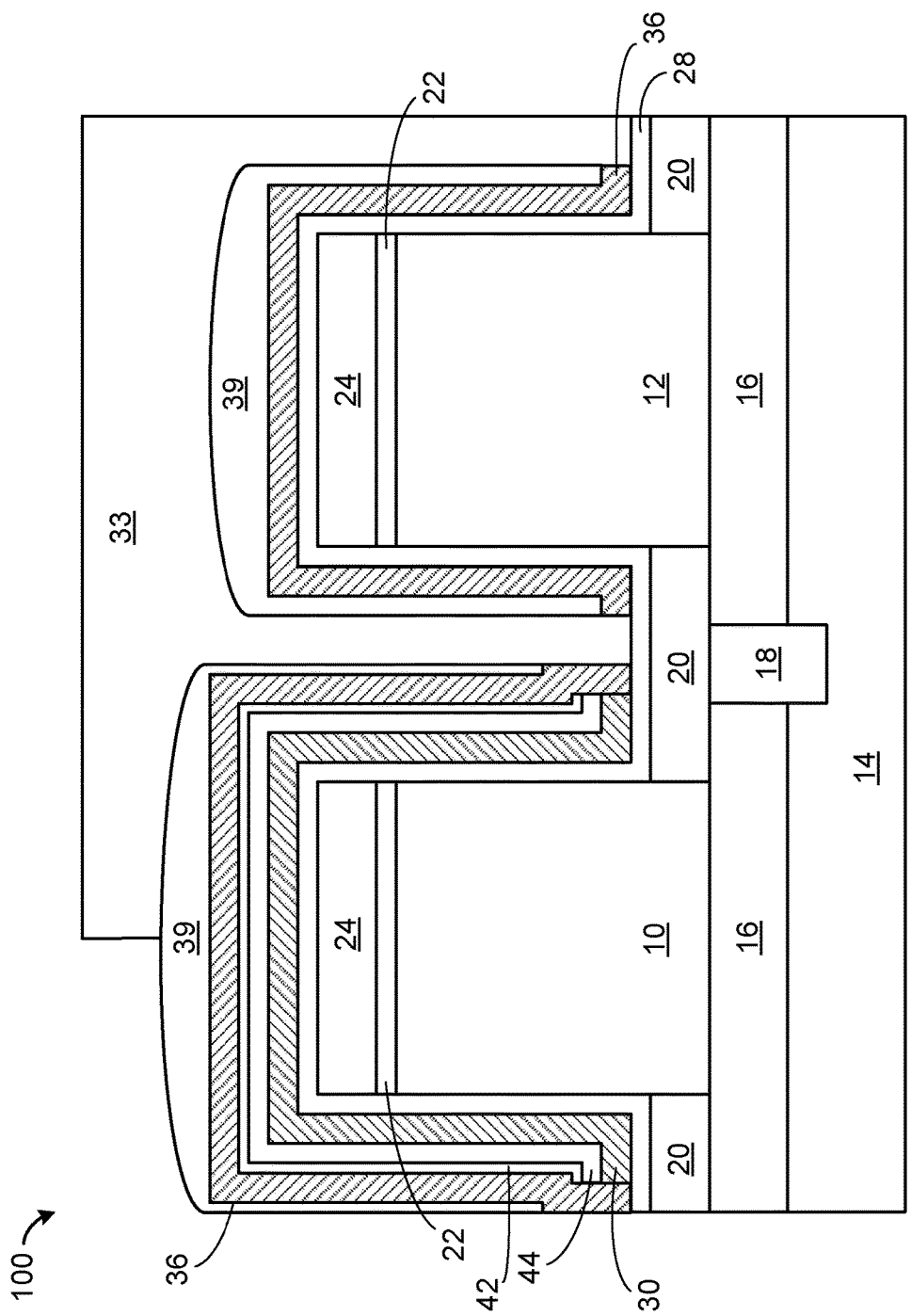
FIG. 40 illustrates a cross-sectional view of the semiconductor structure and illustrates forming a second photo resist mask, according to an exemplary embodiment.

Referring to FIG. 40, an organic planarization layer 33 may be deposited and patterned on the structure 100, according to an exemplary embodiment. In an embodiment, the organic planarization layer 33 may be formed on the sacrificial layer 39 over the fin 12 and partially over the fin 10. The organic planarization layer 33 may be formed on a portion of the NFET WFM 36 along a portion of the sidewall of the fin 12, and all along a portion of the sidewall of the fin 10. In an alternate embodiment, the organic planarization layer 33 may be formed on the sacrificial layer 39 over the fin 12, and may not be formed on the sacrificial layer 39 over the fin 10. The organic planarization layer 33 may be spin coated and optionally polished using a chemical mechanical polishing (CMP) technique. In an embodiment, the organic planarization layer 33 may include a three-layer stack, including an organic planarization layer (OPL), a hard mask, and a photo resist. The hard mask deposition may be deposited on the organic planarization layer 33. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 33 by reactive ion beam etching. The organic planarization layer 33 may protect an area over the fin 10 from subsequent processing steps, allowing separate processing in the area surrounding the fin 10 and an area surrounding the fin 12. The organic planarization layer 33 may have a height ranging from about 100 nm to 300 nm, and ranges there between, although a thickness less than 100 nm and greater than 300 nm may be acceptable.

Figure 41:
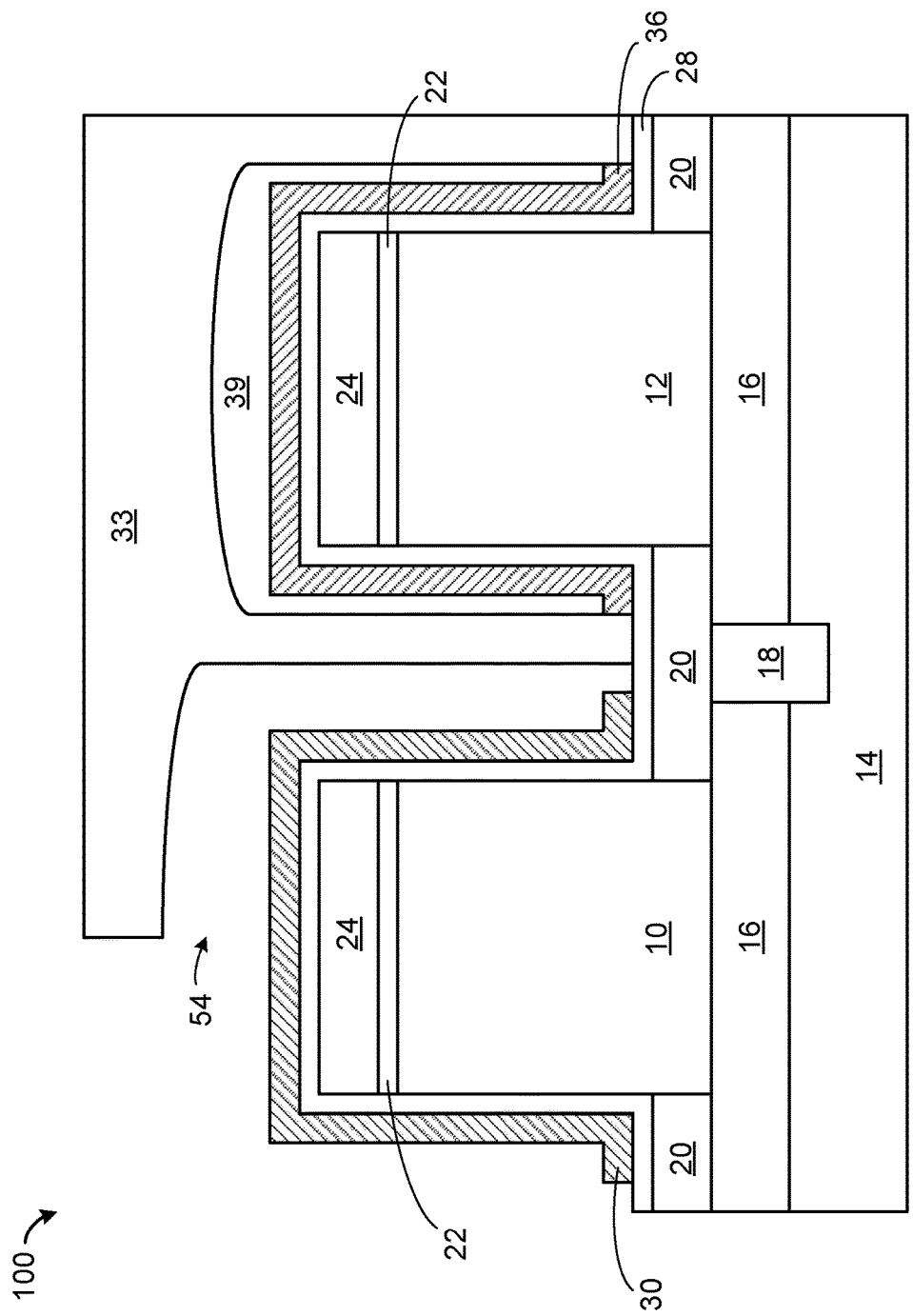
FIG. 41 illustrates a cross-sectional view of the semiconductor structure and illustrates removing a portion of the third sacrificial material and a portion of the second work function metal layer, according to an exemplary embodiment.

Referring to FIG. 41, a sixth opening 54 may be formed by recessing/etching the sacrificial layer 39, the NFET WFM 36, and the sacrificial buffer 44, selective to the organic planarization layer 33 and a portion of the PFET WFM 30 over the fin 12, according to an exemplary embodiment. Specifically, the sacrificial layer 39, the NFET WFM 36, and the sacrificial buffer 44 may be laterally removed from the top and along the vertical sidewalls of the fin 10. The sixth opening 54 may be formed using an etch chemistry selective to the organic planarization layer 33 and the second PFET WFM 30. This may be performed in one or more steps, using different etch chemistries. The organic planarization layer 33 may protect a portion of the NFET WFM 36 in an area above and surrounding a portion of the vertical sidewalls of the fin 12.

Subsequent processing may be performed to remove the organic planarization layer 33 and remaining portions of the sacrificial layer 39, according to known techniques, and may be performed in more than one step.

Figure 42:
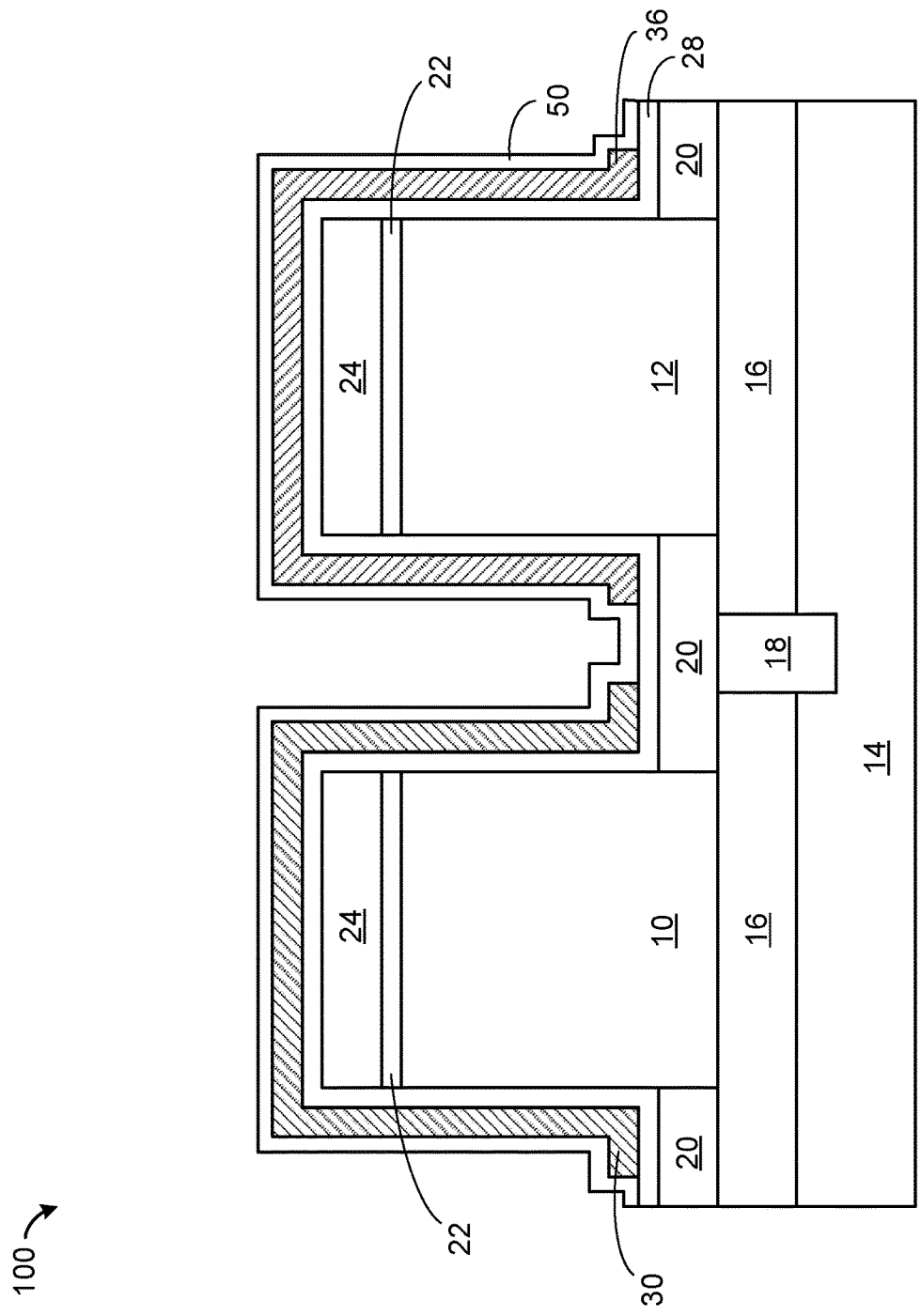
FIG. 42 illustrates a cross-sectional view of the semiconductor structure and illustrates removing a portion of the sacrificial material.

Referring to FIG. 42, an electrode 50 may be conformally formed on exposed top surfaces of the structure 100, according to an exemplary embodiment. The electrode 50 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the electrode 50 may include one or more layers. The electrode 50 may be deposited on a top surface of the PFET WFM 30 along the top surface and a portion of the vertical side walls of the fin 10. The electrode 50 may be deposited on a top surface of the NFET WFM 36 along the top surface and a portion of the vertical side walls of the fin 10. The electrode 50 may be deposited on a portion of the top surface of the insulator 28. In an embodiment, the electrode 50 may include a conductive material, for example, TiN. The electrode 50 may provide a conductive path between a gate of a device, for example the electrode 50 may be connected to the PFET WFM 30 and the NFET WFM 36. In an embodiment, the electrode 50 may have a thickness ranging from about 3 nm to about 8 nm, and ranges there between, although a thickness less than 3 nm and greater than 8 nm may be acceptable.

Figure 43:
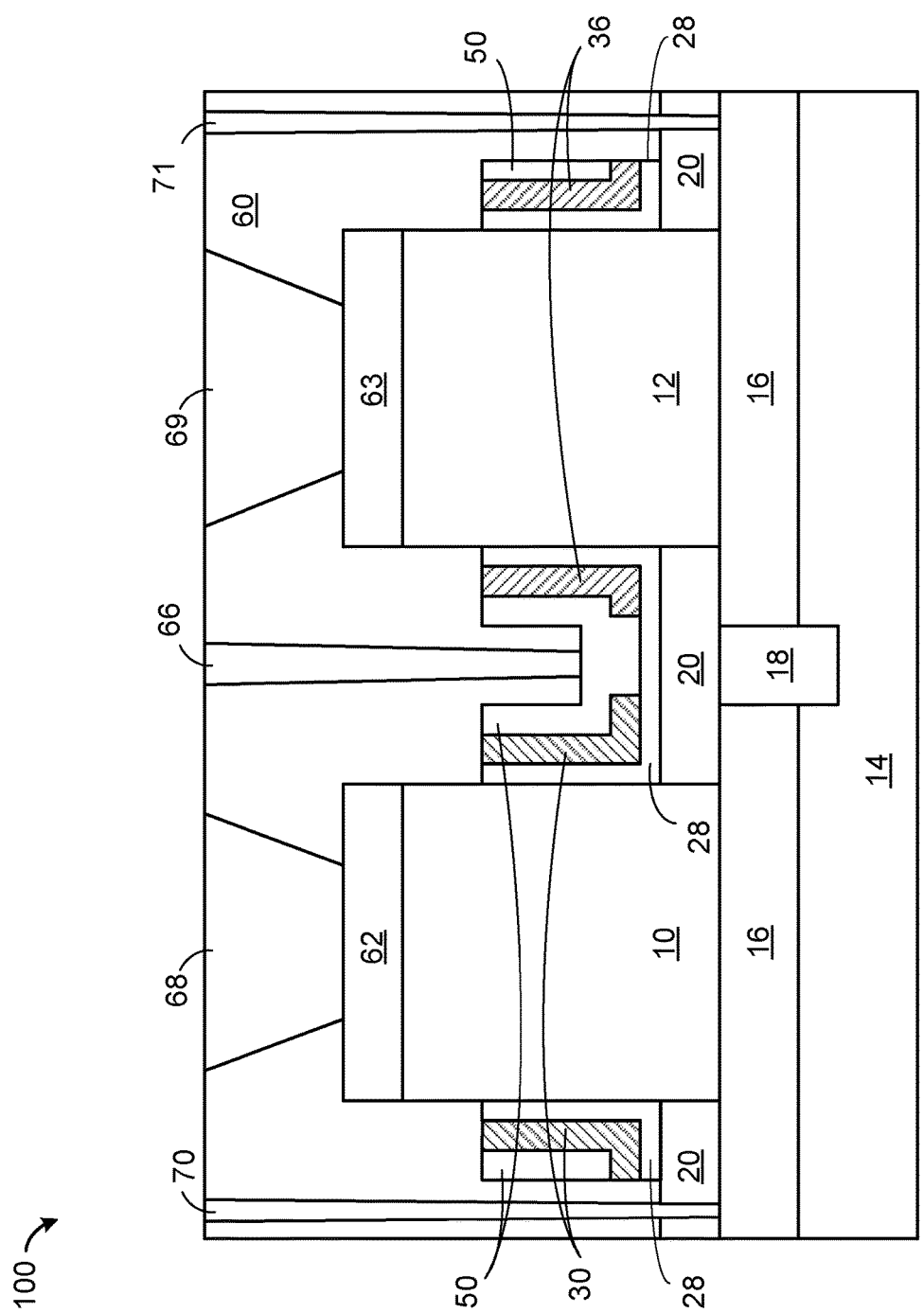
FIG. 43 illustrates a cross-sectional view of the semiconductor, and illustrates a complete structure, according to an exemplary embodiment.

Referring to FIG. 43, subsequent processing of the structure 100 may be performed, according to an exemplary embodiment. The subsequent processing may include selective etching/recessing to remove materials. In the area surrounding the fin 10, a portion of the electrode 50, a portion of the PFET WFM 30, and a portion of the insulator 28 may be removed from the horizontal top surface of the fin 10 and may be removed from a portion of the vertical side wall of the fin 10. A remaining portion of the electrode 50, a remaining portion of the PFET WFM 30, and a remaining portion of the insulator 28 may remain along a portion of the vertical side wall of the fin 10. In the area surrounding the fin 12, a portion of the electrode 50, a portion of the NFET WFM 36 and a portion of the insulator 28 may be removed from a horizontal top surface of the fin 12 and may be removed from a portion of the vertical side wall of the fin 12. A remaining portion of the electrode 50, a remaining portion of the NFET WFM 36 and a remaining portion of the insulator 28 may remain along a portion of the vertical side wall of the fin 12. An additional remaining portion of the electrode 50 may remain over the horizontal top surface of the insulator 28 between the fin 10 and the fin 12. The hard mask 24 and the insulator 22 may be removed from the horizontal top surface of the fins 10 and 12.

A PFET top epitaxy 62 may be formed on the horizontal top surface of the fin 10 and an NFET top epitaxy 63 may be formed on the horizontal top surface of the fin 12. A dielectric 60 may be formed over the structure 100, covering a top surface and a vertical side surface of the PFET top epitaxy 62, covering a top surface and a vertical side surface of the NFET top epitaxy 63, a portion of a horizontal side wall of the fin 10 and the fin 12, a portion of the top surface of the insulator 28, a portion of the top surface of the PFET WFM 30, and a portion of the top surface of the NFET WFM 36. Openings may be made in the dielectric 60, in which contacts may be formed. A PFET top source drain contact 68 may be formed which connects to the PFET top epitaxy 62. An NFET top source drain contact 69 may be formed which connects to the NFET top epitaxy 63. A gate contact 66 may be formed which connects to the electrode 50. A PFET bottom source drain contact 70 may be formed connecting to the epitaxy 16 which is adjacent to the fin 10. An NFET bottom source drain contact 71 may be formed connecting to the epitaxy 16 which is adjacent to the fin 12. Each of the steps illustrated and described in regards to FIG. 30 may be performed in one or more steps, may be performed simultaneously, may be performed in an alternate sequence, and may be performed using known semiconductor manufacturing processes.

The gate contact 66 may be electrically connected to the electrode 50, the PFET WFM 30 and the NFET WFM 36. The PFET WFM 30 surrounding a portion of the vertical sidewalls of the fin 10 may operate as a PFET gate of a first vertical FET device, and the electrically isolated NFET WFM 36 surrounding a portion of the vertical sidewalls of the fin 12 may operate as an NFET gate for a second vertical FET device. The NFET WFM 36 may surround the PFET WFM 30, and may have minimal effect of the operation of the first vertical FET device. The first vertical FET device and the second vertical FET device may have different operating thresholds, due to different materials used in the WFM of each device, different epitaxies used in each of the bottom source drain regions and the top source drain regions, and other material and structural differences.

In this embodiment, the electrode 50 may serve as a gate contact and is connected to both the PFET WFM 30 and the NFET WFM 36. In a prior embodiment, the PFET WFM 30 and the NFET WFM 36 were adjacent and served as a gate contact.

An alternate embodiment of forming different work function metal gates on adjacent fins is described in detail below with reference to FIG. 2 and continuing with FIG. 44.

Figure 45:
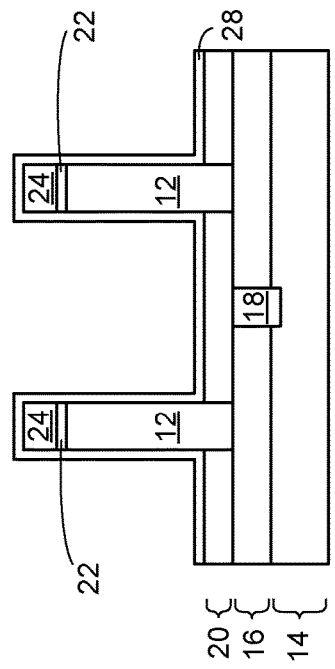
FIGS. 45, 46, and 47 are each cross-sectional views of FIG. 44 along section lines B-B, C-C, and D-D, respectively, according to an exemplary embodiment.
Figure 44:
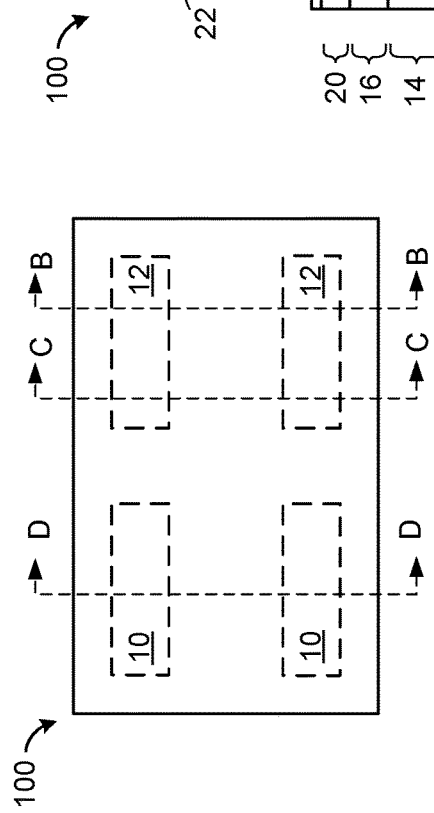
FIG. 44 illustrates a top view of the semiconductor structure at an intermediate step of fabrication, according to an exemplary embodiment.
Figure 47:
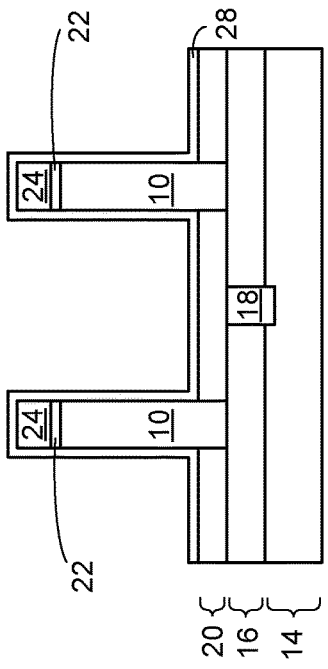
Figure 46:
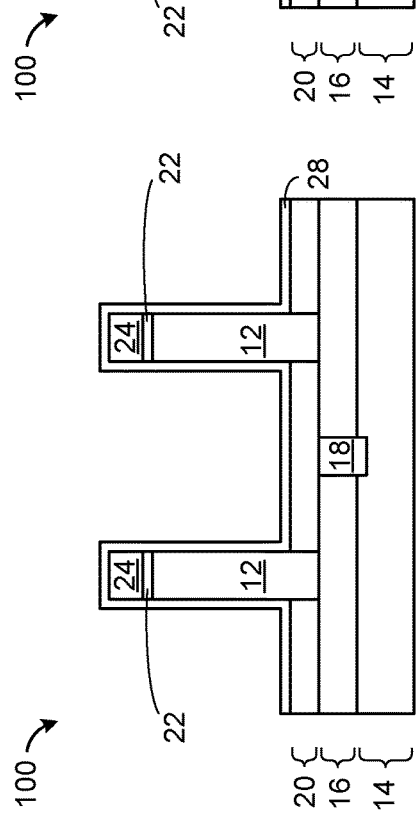

Referring to FIGS. 44, 45, 46, and 47, the structure 100 is shown, according to an exemplary embodiment. FIG. 44 illustrates a top view. FIGS. 45, 46, and 47, are each cross-sectional views of FIG. 44, along Section B-B, C-C, and D-D, respectively. FIGS. 45 and 46 each illustrate two fins 12. FIG. 47 illustrates two fins 10.

Figure 48:
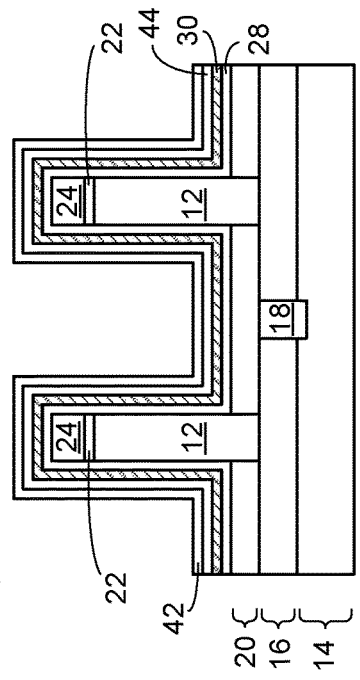
FIG. 48 illustrates a top view of the semiconductor structure and illustrates forming a work function metal layer and a sacrificial buffer, according to an exemplary embodiment.
Figure 49:
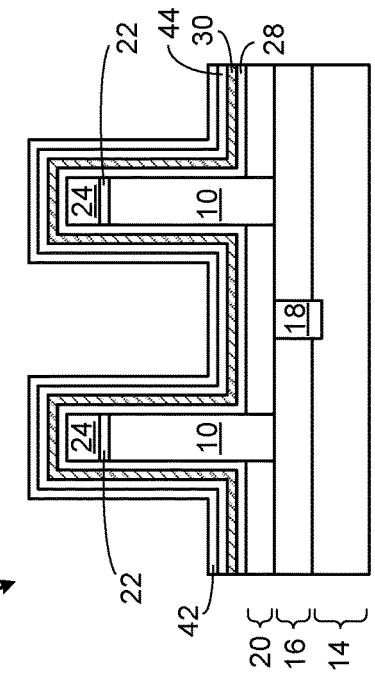
FIGS. 49, 50, and 51 are each cross-sectional views of FIG. 48 along section lines B-B, C-C, and D-D, respectively, according to an exemplary embodiment.
Figure 50:
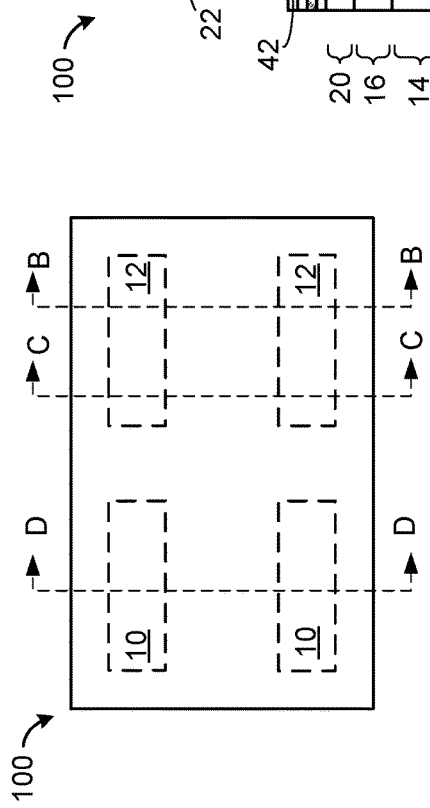
Figure 51:
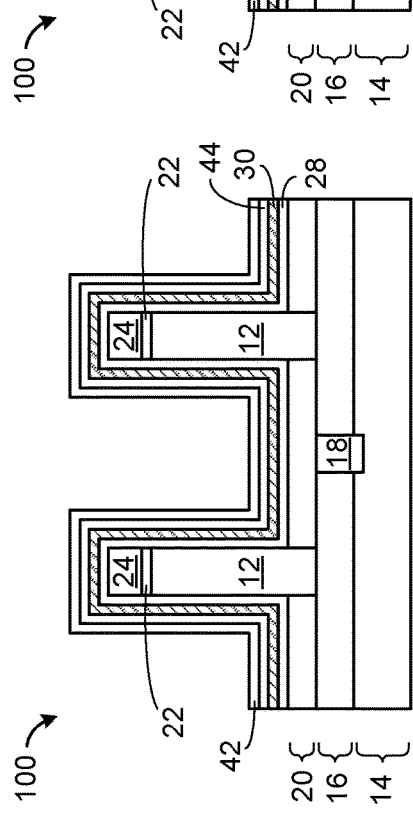

Referring to FIGS. 48, 49, 50, and 51, the structure 100 is shown, according to an exemplary embodiment. FIG. 48 illustrates a top view. FIGS. 49, 50, and 51, are each cross-sectional views of FIG. 48, along Section B-B, C-C, and D-D, respectively. FIGS. 49 and 50 each illustrate two fins 12. FIG. 51 illustrates two fins 10.

A PFET work function metal layer (hereinafter "PFET WFM") 30 may be conformally formed on exposed top surfaces of the structure 100, according to an exemplary embodiment. The PFET WFM 30 may be deposited using typical deposition techniques, for example, atomic layer deposition (ALD), molecular layer deposition (MLD), and chemical vapor deposition (CVD). In an embodiment, the PFET WFM 30 may include one or more layers. The PFET WFM 30 may be deposited on a top surface of the insulator 28. The PFET WFM 30 may be deposited on a top surface of the insulator 28 along the horizontal top surface and a portion of the vertical side walls of the fin 12 and the fin 10. The PFET WFM 30 may be deposited on a portion of the horizontal top surface of the insulator 28 between the fins 10 and 12. In an embodiment, the PFET WFM 30 may include a work function metal, including a metal nitride, for example, titanium nitride or tantalum nitride, titanium carbide or titanium aluminum carbide. In an embodiment, the WFM 30 may have a conformal thickness ranging from about 3 nm to about 8 nm, and ranges there between, although a thickness less than 3 nm and greater than 8 nm may be acceptable.

A sacrificial buffer 44 may be conformally formed on exposed top surfaces of the structure 100, according to an exemplary embodiment. The sacrificial buffer 44 may be deposited on a top surface of the PFET WFM 30. The sacrificial buffer 44 may include any material able to be selectively removed relative to other materials used in this embodiment. In an embodiment, the sacrificial buffer 44 may include aluminum oxide and lanthanum oxide. The sacrificial buffer 44 may be deposited using typical deposition techniques, for example, atomic layer deposition (ALD), molecular layer deposition (MLD), and chemical vapor deposition (CVD). The sacrificial buffer 44 may be recessed/etched, according to an exemplary embodiment. The sacrificial buffer 44 may be recessed using an anisotropic vertical etch process such as a reactive ion etch (RIE), or any suitable etch process. The sacrificial buffer 44 may be thinned to a uniform thickness on the top surface of the PFET WFM 30 of about 1 nm, although a thickness less than 1 nm or above 1 nm may be acceptable.

A cap layer 42 may be conformally formed on exposed top surfaces of the structure 100, according to an exemplary embodiment. The cap layer 42 may be deposited on a top surface of the sacrificial buffer 44. The cap layer may include a metal nitride, for example TiN, and may be used as a protecting layer for subsequent patterning. The cap layer 42 may be deposited using typical deposition techniques, for example, atomic layer deposition (ALD), molecular layer deposition (MLD), and chemical vapor deposition (CVD). The cap layer 42 may be recessed/etched, according to an exemplary embodiment. The cap layer 42 may be recessed using an anisotropic vertical etch process such as a reactive ion etch (RIE), or any suitable etch process. The cap layer 42 may be thinned to a uniform thickness on the top surface of sacrificial buffer 44 of about 1 nm, although a thickness less than 1 nm or above 1 nm may be acceptable.

Figure 52:
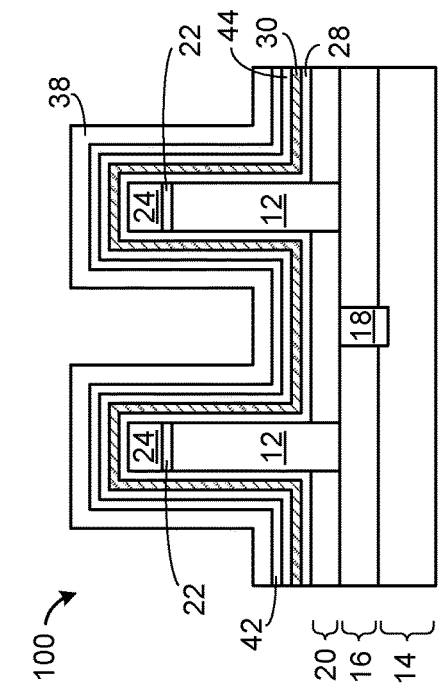
FIG. 52 illustrates a top view of the semiconductor structure and illustrates forming a sacrificial material, according to an exemplary embodiment.
Figure 53:
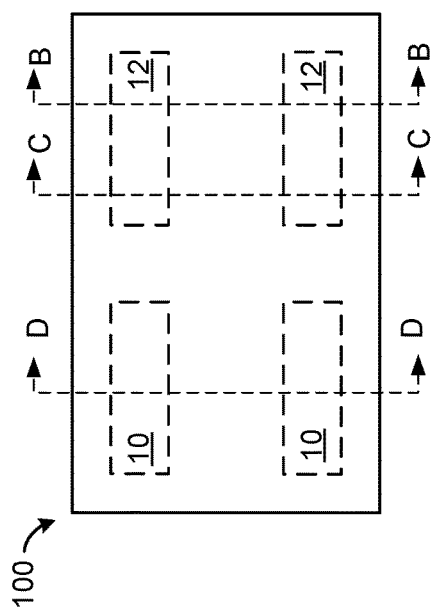
FIGS. 53, 54, and 55 are each cross-sectional views of FIG. 52 along section lines B-B, C-C, and D-D, respectively, according to an exemplary embodiment.
Figure 55:
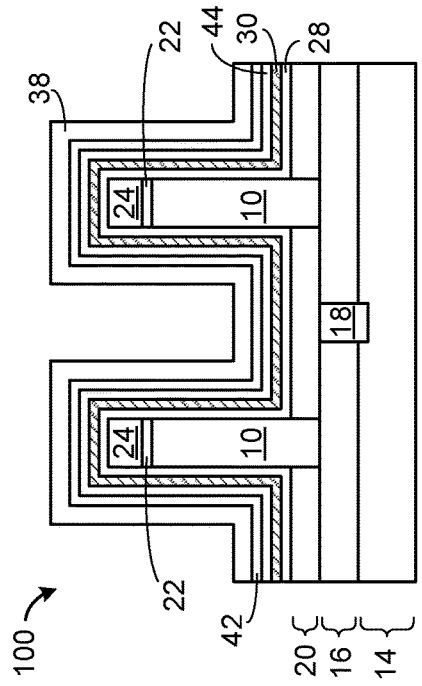
Figure 54:
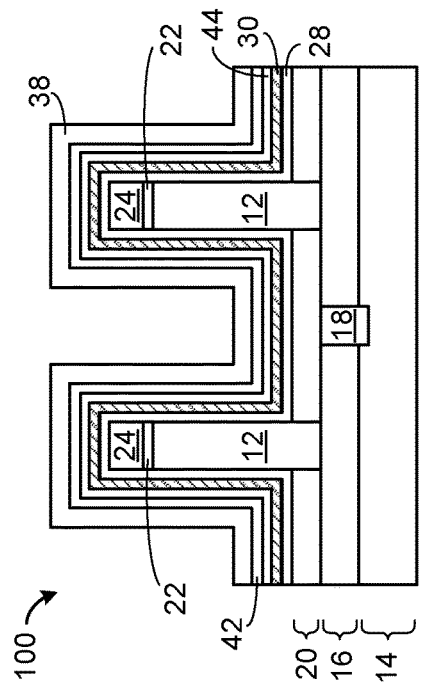

Referring to FIGS. 52, 53, 54, and 55, the structure 100 is shown, according to an exemplary embodiment. FIG. 52 illustrates a top view. FIGS. 53, 54, and 55, are each cross-sectional views of FIG. 52, along Section B-B, C-C, and D-D, respectively. FIGS. 53 and 54 each illustrate two fins 12. FIG. 55 illustrates two fins 10.

A sacrificial layer 38 may be formed on exposed top surfaces of the structure 100, according to an exemplary embodiment. The sacrificial layer 38 may be deposited on a top surface of the cap layer 42. The sacrificial layer 38 may have a non-conformal top surface with a greater thickness above the fin 10 and above the fin 12 compared to a thickness between the fins 10, 12. The sacrificial layer 38 may include silicon germanium, any suitable silicon or polysilicon, and other sacrificial materials able to be selectively removed relative to other materials used in this embodiment. In an embodiment, the sacrificial layer 38 may be deposited by PVD and/or by CVD. In an embodiment, a combination of deposition techniques, such as conventional PVD and modified PVD derivatives, for example directional PVD deposition, and CVD, may be used. In an embodiment, the sacrificial layer 38 may have a vertical thickness, or height, above the cap layer 42 ranging from about 3 nm to about 20 nm.

Figure 56:
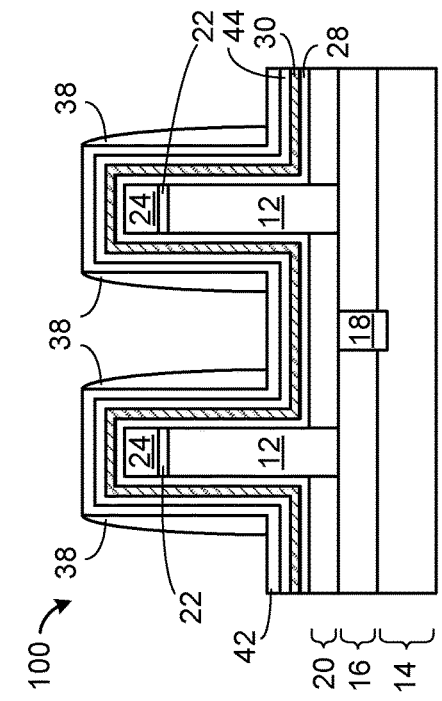
FIG. 56 illustrates a top view of the semiconductor structure and illustrates reducing the sacrificial material, according to an exemplary embodiment.
Figure 58:
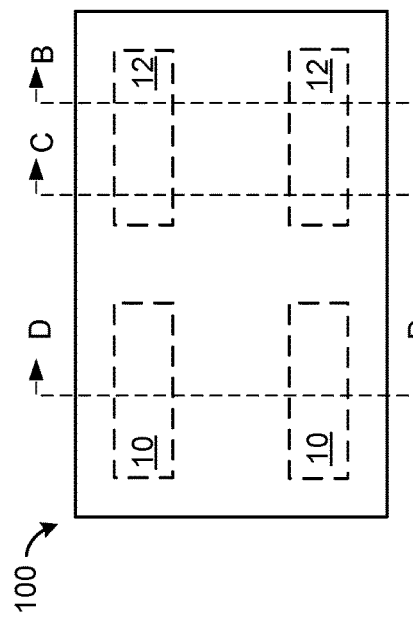
FIGS. 57, 58, and 59 are each cross-sectional views of FIG. 56 along section lines B-B, C-C, and D-D, respectively, according to an exemplary embodiment.
Figure 57:
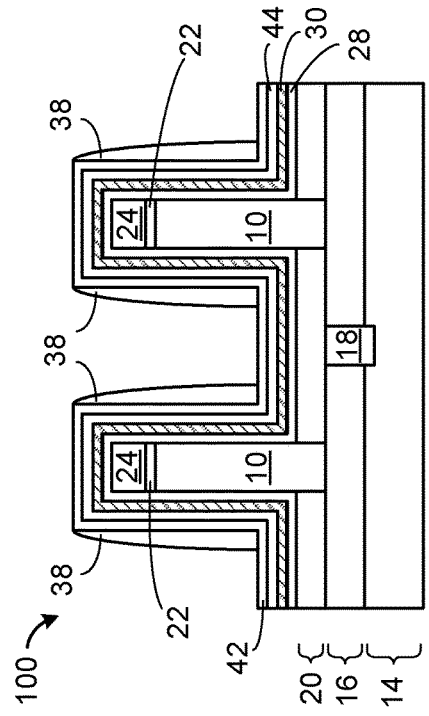
Figure 59:
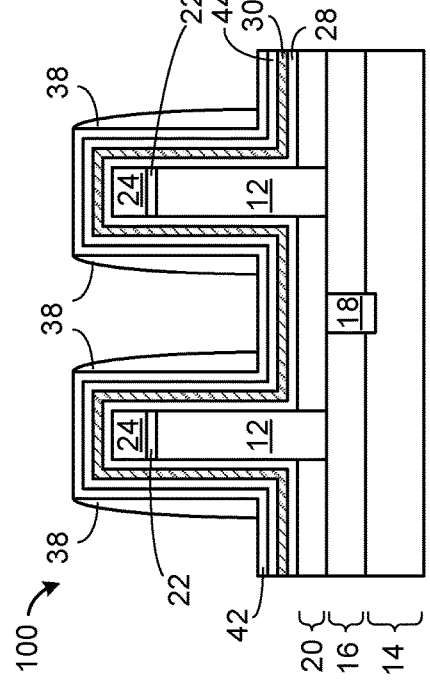

Referring to FIGS. 56, 57, 58, and 59, the structure 100 is shown, according to an exemplary embodiment. FIG. 56 illustrates a top view. FIGS. 57, 58, and 59, are each cross-sectional views of FIG. 56, along Section B-B, C-C, and D-D, respectively. FIGS. 57 and 58 each illustrate two fins 12. FIG. 59 illustrates two fins 10.

The sacrificial layer 38 may be etched/recessed using an anisotropic vertical etch process such as a reactive ion etch (RIE), wets, or any suitable etch process. The sacrificial layer 38 may be removed from a horizontal top surface of the fin 10 and the fin 12. The sacrificial layer 38 and the PFET WFM 30 may be recessed using an anisotropic vertical etch process such as a reactive ion etch (RIE), wets, or any suitable etch process. The sacrificial buffer 44 may be exposed on the horizontal top surface of the fin 10 and the fin 12. A portion of the sacrificial layer 38 may remain along a portion of a vertical side surface of the fin 10 and the fin 12. A thickness of the sacrificial layer 38 along the vertical sidewalls of the fins 10, 12 may become thinner along a height of the fins 10, 12 where a minimum thickness is alongside a horizontal top surface of the fins 10, 12. A horizontal top surface of the sacrificial buffer 44 may be exposed between the fin 10 and the fin 12, and between the fin 10 and an adjacent fin 10 and between the fin 12 and an adjacent fin 12.

Figure 61:
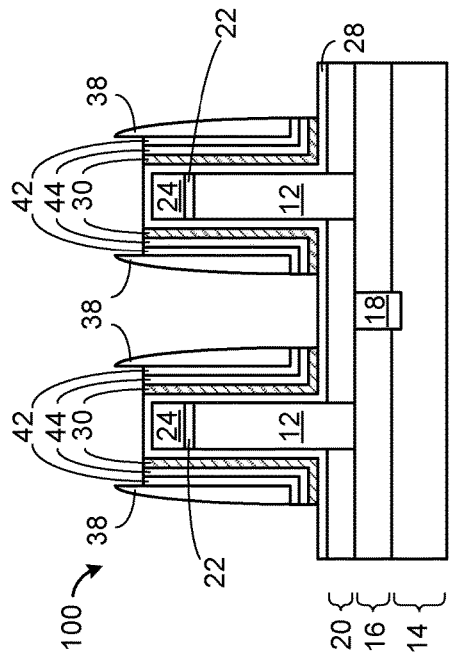
FIGS. 61, 62, and 63 are each cross-sectional views of FIG. 60 along section lines B-B, C-C, and D-D, respectively, according to an exemplary embodiment.
Figure 60:
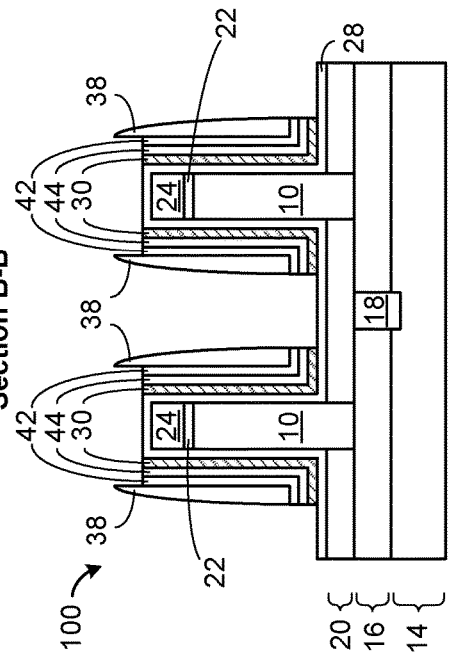
FIG. 60 illustrates a top view of the semiconductor structure and illustrates removing a portion of the work function metal layer, according to an exemplary embodiment.
Figure 62:
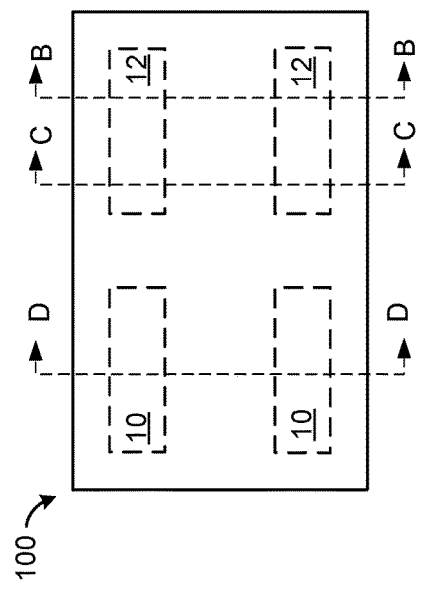
Figure 63:
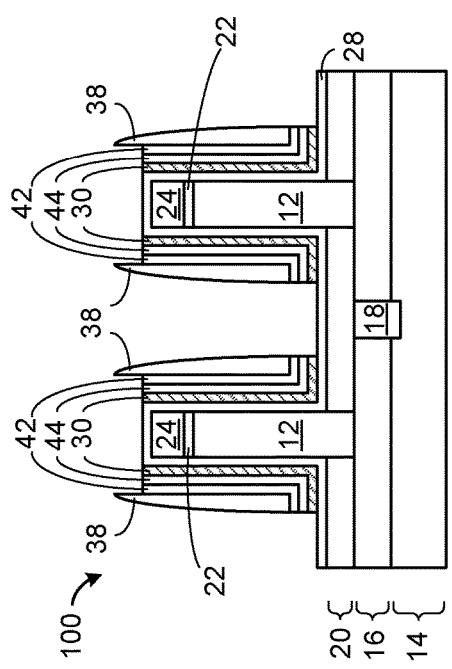

Referring to FIGS. 60, 61, 62, and 63, the structure 100 is shown, according to an exemplary embodiment. FIG. 60 illustrates a top view. FIGS. 61, 62, and 62, are each cross-sectional views of FIG. 60, along Section B-B, C-C, and D-D, respectively. FIGS. 61 and 62 each illustrate two fins 12. FIG. 63 illustrates two fins 10.

The sacrificial layer 38, the cap layer 42, the sacrificial buffer 44, and the PFET WFM 30 may be recessed/etched, according to an exemplary embodiment. The sacrificial layer 38, the cap layer 42, the sacrificial buffer 44, and the PFET WFM 30 may be etched using an anisotropic vertical etch process such as a reactive ion etch (RIE), wets, or any suitable etch process. This may be performed in one or more steps. Due to the greater thickness of the sacrificial layer 38 above the fin 10 and above the fin 12 compared to the thickness between the fins 10, 12, the sacrificial layer 38, the cap layer, the sacrificial buffer 44, and the PFET WFM 30 may be removed in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the sacrificial layer 38, the cap layer 42, the sacrificial buffer 44, and the PFET WFM 30, and the insulator 28 may remain alongside a portion of a vertical sidewall of the fin 10 and alongside a portion of a vertical sidewall of the fin 12. The sacrificial buffer 44, the cap layer 42, and the PFET WFM 30 may be removed from a horizontal top surface of the fin 10 and the fin 12. The insulator 28 may remain on a horizontal top surface of the fin 10, and on a horizontal top surface of the fin 12.

The sacrificial buffer 44, the cap layer 42, and the PFET WFM 30 may be removed from a horizontal top surface of the fin 10 and the fin 12. The sacrificial buffer 44 and the PFET WFM 30 may be removed in an area between the fin 10 and an adjacent fin 10, from an area between the fin 12 and adjacent fin 12 and from an area between the fin 10 and the fin 12. The insulator layer 28 may be exposed on the horizontal top surface of the fin 10 and the fin 12. A portion of the sacrificial layer 38 may remain along a portion of a vertical side surface of the fin 10 and the fin 12 and may extend above a horizontal top surface of the fin 10 and the fin 12. A horizontal top surface of the sacrificial buffer 44 and a horizontal top surface of the PFET WFM 30 may be exposed next to a vertical side surface of the fin 10 and the fin 12.

Referring to FIGS. 64, 65, 66, and 67, the structure 100 is shown, according to an exemplary embodiment. FIG. 64 illustrates a top view. FIGS. 65, 66, and 67, are each cross-sectional views of FIG. 64, along Section B-B, C-C, and D-D, respectively. FIGS. 65 and 66 each illustrate two fins 12. FIG. 67 illustrates two fins 10.

An organic planarization layer 32 may be deposited and patterned on the structure 100, according to an exemplary embodiment. The organic planarization layer 32 may cover an area surrounding the fin 10, as shown in FIG. 67. The organic planarization layer 32 may partially cover the fin 12, or may not cover the fin 12 at all. As shown in FIG. 65, this cross-section of the structure is not covered by the organic planarization layer 32. As shown in FIG. 66, this cross-section of the structure is covered by the organic planarization layer 32. As shown in FIGS. 66, and 67, the organic planarization layer 32 may be deposited and patterned on the structure 100, according to an exemplary embodiment. In an embodiment, the organic planarization layer 32 may be formed on the sacrificial layer 38 over the fin 10 and partially over the fin 12. The organic planarization layer 32 may be formed on a portion of the cap layer 42, a portion of the sacrificial butter 44, on a portion of the PFET WFM 30, and on a portion of the insulator 28, along a portion of the sidewall of the fin 10, and all along a portion of the sidewall of the fin 12. In an alternate embodiment, the organic planarization layer 32 may be formed on the sacrificial layer 38 over the fin 10, and may not be formed on the sacrificial layer 38 over the fin 12. The organic planarization layer 32 may be spin coated and optionally polished using a chemical mechanical polishing (CMP) technique. In an embodiment, the organic planarization layer 32 may include a three-layer stack, including an organic planarization layer (OPL), a hard mask, and a photo resist. The hard mask deposition may be deposited on the organic planarization layer 32. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 32 by reactive ion beam etching. The organic planarization layer 32 may protect an area over the fin 10 from subsequent processing steps, allowing separate processing in the area surrounding the fin 10 and an area surrounding the fin 12. The organic planarization layer 32 may have a height ranging from about 100 nm to 300 nm, and ranges there between, although a thickness less than 100 nm and greater than 300 nm may be acceptable.

Figure 68:
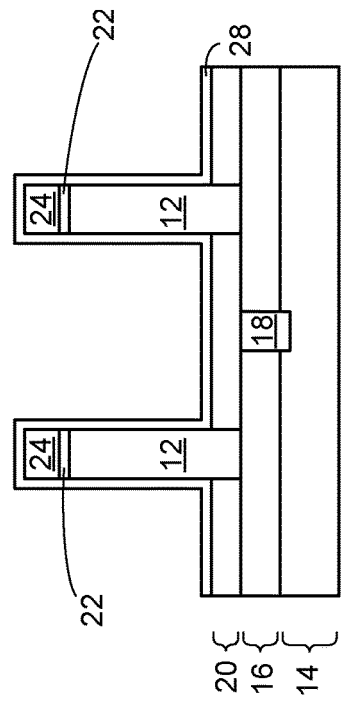
FIG. 68 illustrates a top view of the semiconductor structure and illustrates removing a portion of the work function metal layer, according to an exemplary embodiment.
Figure 69:
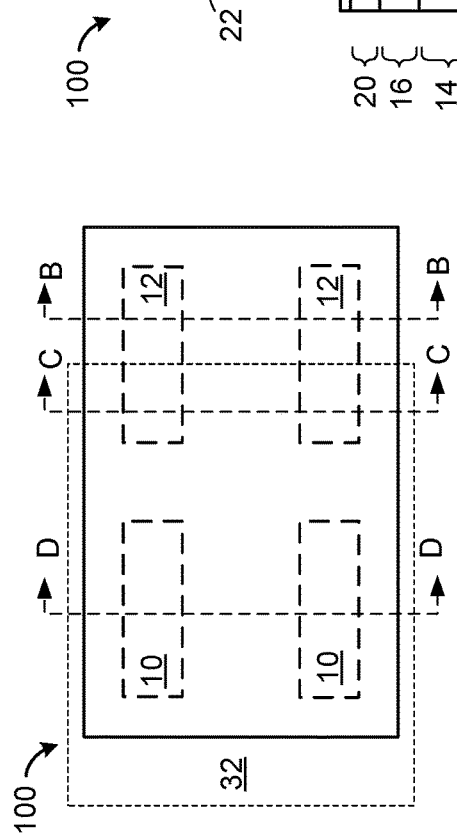
FIGS. 69, 70, and 71 are each cross-sectional views of FIG. 68 along section lines B-B, C-C, and D-D, respectively, according to an exemplary embodiment.
Figure 70:
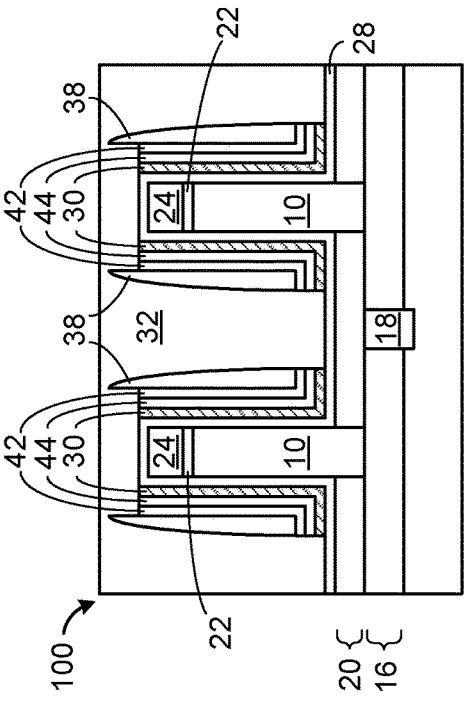
Figure 71:
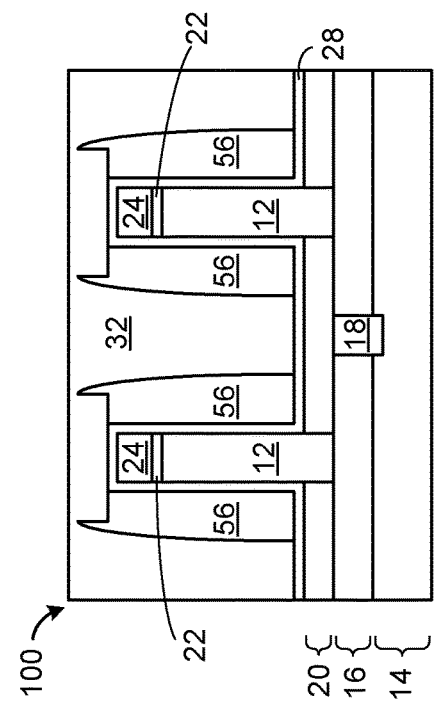

Referring to FIGS. 68, 69, 70, and 71, the structure 100 is shown, according to an exemplary embodiment. FIG. 68 illustrates a top view. FIGS. 69, 70, and 71, are each cross-sectional views of FIG. 68, along Section B-B, C-C, and D-D, respectively. FIGS. 69 and 70 each illustrate two fins 12. FIG. 71 illustrates two fins 10.

As shown in FIG. 70, a seventh opening 56 may be formed by recessing/etching the sacrificial layer 38, the sacrificial buffer 44, and the PFET WFM 30, selective to the organic planarization layer 32 and a portion of the insulator 28 over the fin 12, according to an exemplary embodiment. Specifically, the sacrificial layer 38, the sacrificial buffer 44, and the PFET WFM 30, may be laterally removed from the top and along the vertical sidewalls of the fin 12. The seventh opening 56 may be formed using an etch chemistry selective to the organic planarization layer 32 and the insulator 28, to laterally remove the sacrificial layer 38, the sacrificial buffer 44, and the PFET WFM 30, on the top and along the vertical sidewalls of the fin 12. This may be performed in one or more steps. The organic planarization layer 32 may protect a portion of the sacrificial layer 38 in an area above and surrounding a portion of the vertical sidewalls of the fin 10.

As shown in FIG. 69, the sacrificial layer 38, the sacrificial buffer 44, and the PFET WFM 30, on the top and along the vertical sidewalls of the fin 12, selective to the organic planarization layer 32 and a portion of the insulator 28 over the fin 12, may be removed according to an exemplary embodiment. The layers may be removed simultaneously as forming the seventh opening 56 as shown in FIG. 70.

Referring to FIGS. 72, 73, 74, and 75, the structure 100 is shown, according to an exemplary embodiment. FIG. 72 illustrates a top view. FIGS. 73, 74, and 75, are each cross-sectional views of FIG. 72, along Section B-B, C-C, and D-D, respectively. FIGS. 73 and 74 each illustrate two fins 12. FIG. 75 illustrates two fins 10.

The organic planarization layer 32 and remaining portions of the sacrificial layer 38 may be removed according to known techniques, and may be performed in more than one step.

Referring to FIGS. 76, 77, 78, and 79, the structure 100 is shown, according to an exemplary embodiment. FIG. 76 illustrates a top view. FIGS. 77, 78, and 79, are each cross-sectional views of FIG. 76, along Section B-B, C-C, and D-D, respectively. FIGS. 77 and 78 each illustrate two fins 12. FIG. 79 illustrates two fins 10.

An NFET work function metal layer (hereinafter "NFET WFM") 36 may be conformally formed on the structure 100, according to an exemplary embodiment. The NFET WFM 36 may be deposited using typical deposition techniques, for example, atomic layer deposition (ALD), molecular layer deposition (MLD), and chemical vapor deposition (CVD). In an embodiment, the NFET WFM 36 may include one or more layers. The NFET WFM 36 may be deposited on a top surface of the insulator 28 along the horizontal top surface and a portion of the vertical side walls of the fin 12. The NFET WFM 36 may be deposited on a top surface of the cap layer 42 along the top surface and a portion of the vertical side walls of the fin 10. The NFET WFM 36 may be deposited on a portion of the cap layer 42, a portion of the sacrificial buffer 44, and a portion of the PFET WFM 30, along a portion of the vertical side of the fin 10. The NFET WFM 36 may be deposited on a portion of the horizontal top surface of the insulator 28 between the fins 10 and 12. In an embodiment, the NFET WFM 36 may include a work function metal including titanium aluminum carbide and may include a different work function metal than the PFET WFM 30. In an embodiment, the NFET WFM 36 may have a conformal thickness ranging from about 3 nm to about 8 nm, and ranges there between, although a thickness less than 3 nm and greater than 8 nm may be acceptable.

Referring to FIGS. 80, 81, 82, and 83, the structure 100 is shown, according to an exemplary embodiment. FIG. 80 illustrates a top view. FIGS. 81, 82, and 83, are each cross-sectional views of FIG. 80, along Section E-E, F-F, and G-G, respectively. FIG. 81 illustrates two fins 12. FIGS. 82 and 83 each illustrate two fins 10.

A sacrificial layer 39 may be formed on exposed top surfaces of the structure 100, according to an exemplary embodiment. The sacrificial layer 39 may be deposited on a top surface of the sacrificial buffer 44. The sacrificial layer 39 may have a non-conformal top surface with a greater thickness above the fin 10 and above the fin 12 compared to a thickness between the fins 10, 12. The sacrificial layer 39 may include silicon germanium, any suitable silicon or polysilicon, and other sacrificial materials able to be selectively removed relative to other materials used in this embodiment. In an embodiment, the sacrificial layer 39 may be deposited by PVD and/or by CVD. In an embodiment, a combination of deposition techniques, such as conventional PVD and modified PVD derivatives, for example directional PVD deposition, and CVD, may be used. In an embodiment, the sacrificial layer 39 may have a vertical thickness, or height, above the PFET WFM 30 ranging from about 3 nm to about 20 nm.

The sacrificial layer 38 and the NFET WFM 36 may be recessed/etched, according to an exemplary embodiment. The sacrificial layer 39 and the NFET WFM 36 may be etched using an anisotropic vertical etch process such as a reactive ion etch (RIE), wets, or any suitable etch process. This may be performed in one or more steps. Due to the greater thickness of the sacrificial layer 39 above the fin 10 and above the fin 12 compared to the thickness between the fins 10, 12, the sacrificial layer 39 and the NFET WFM 36 may be removed only in an area between the fins 10, 12. A horizontal top surface of the insulator 28 may be exposed in an area between the fin 10 and the fin 12. In an embodiment, the insulator 28 may be etched in an area between the fin 10 and the fin 12 and may become discontinuous between the fin 10 and the fin 12. A portion of the sacrificial layer 39 and the NFET WFM 36, and the insulator 28 may remain alongside a portion of a vertical sidewall of the fin 10 and alongside a portion of a vertical sidewall of the fin 12. The sacrificial layer 39 and the NFET WFM 36 may remain on a horizontal top surface of the fin 10, and on a horizontal top surface of the fin 12.

A portion of the sacrificial layer 39 and the NFET WFM 36, and the insulator 28 may remain alongside a portion of a vertical sidewall of the fin as shown in FIG. 81. A portion of the sacrificial layer 39, the NFET WFM 36, the sacrificial buffer 44, the PFET WFM 30, and the insulator 28 may remain alongside a portion of a vertical sidewall of the fin as shown in FIGS. 82 and 83. A top portion of the sacrificial layer 38 may remain above a horizontal top surface of the insulator layer 38.

Figure 84:
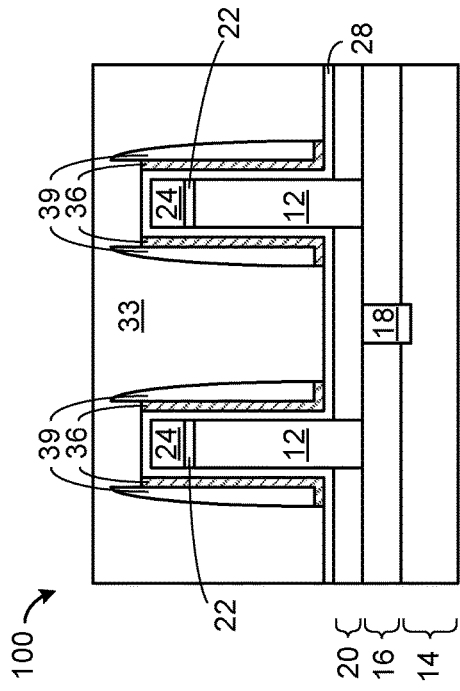
FIG. 84 illustrates a top view of the semiconductor structure and illustrates forming a second photo resist mask, according to an exemplary embodiment.
Figure 85:
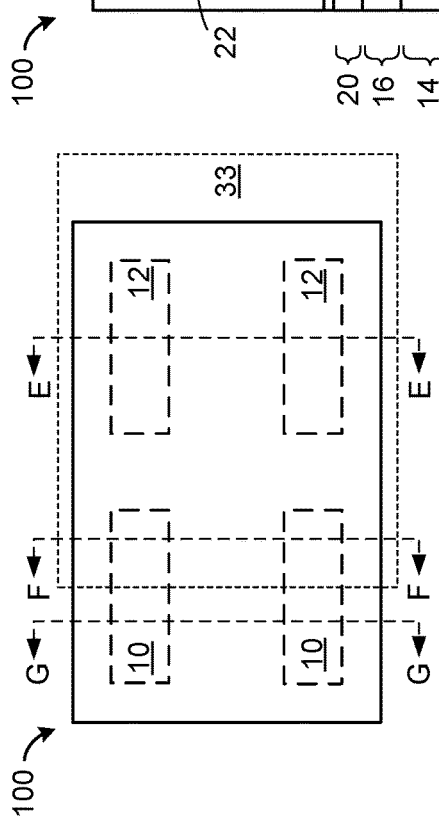
FIGS. 85, 86, and 87 are each cross-sectional views of FIG. 84 along section lines B-B, C-C, and D-D, respectively, according to an exemplary embodiment.
Figure 87:
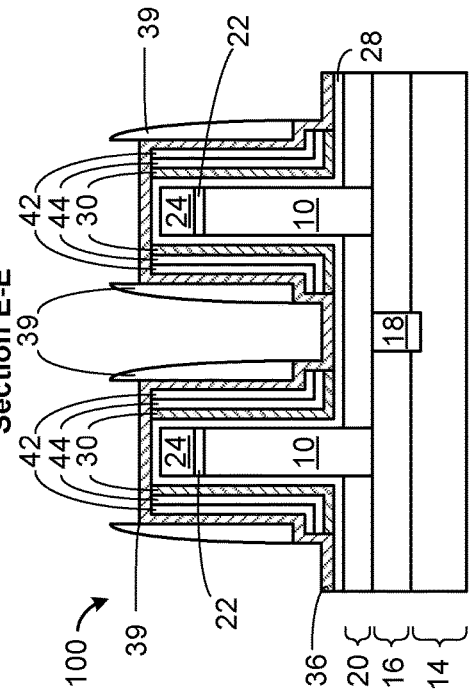
Figure 86:
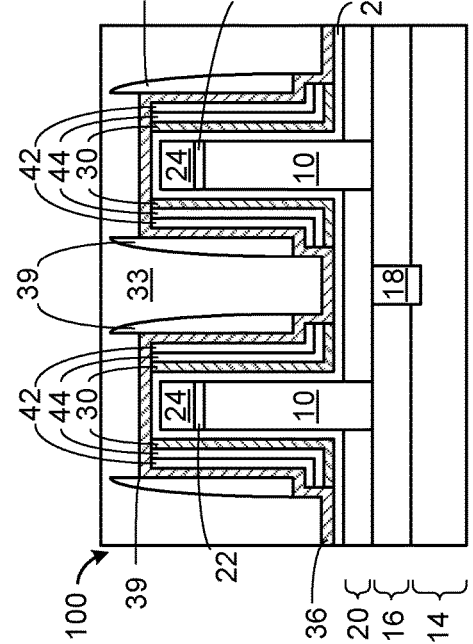

Referring to FIGS. 84, 85, 86, and 87, the structure 100 is shown, according to an exemplary embodiment. FIG. 84 illustrates a top view. FIGS. 85, 86 and 87, are each cross-sectional views of FIG. 84, along Section E-E, F-F, and G-G, respectively. FIG. 85 illustrates two fins 12. FIGS. 86 and 87 each illustrate two fins 10.

An organic planarization layer 33 may be deposited and patterned on the structure 100, according to an exemplary embodiment. The organic planarization layer 33 may cover an area surrounding the fin 12, as shown in FIG. 85. The organic planarization layer 33 may partially cover the fin 10, or may not cover the fin 10 at all. As shown in FIG. 86, this cross-section of the structure is covered by the organic planarization layer 33. As shown in Figure, this cross-section of the structure is not covered by the organic planarization layer 33. As shown in FIG. 87, this cross-section of the structure is not covered by the organic planarization layer 33. As shown in FIG. 86 and FIG. 87, the organic planarization layer 33 may be deposited and patterned on the structure 100, according to an exemplary embodiment. In an embodiment, the organic planarization layer 33 may be formed on the sacrificial layer 39 over the fin 12 and partially over the fin 10. In FIG. 86, the organic planarization layer 33 may be formed on a portion of the NFET WFM 36 over the fin 12. In FIG. 85, the organic planarization layer 33 may be formed on a portion of the insulator 28. In an alternate embodiment, the organic planarization layer 33 may be formed on the sacrificial layer 38 over the fin 12, and may not be formed on the sacrificial layer 38 over the fin 10. The organic planarization layer 33 may be spin coated and optionally polished using a chemical mechanical polishing (CMP) technique. In an embodiment, the organic planarization layer 33 may include a three-layer stack, including an organic planarization layer (OPL), a hard mask, and a photo resist. The hard mask deposition may be deposited on the organic planarization layer 33. The photo resist coating may be deposited on the hard mask deposition. The hard mask and the photo resist are not shown in the drawings. After deposition, the photo resist may be subsequently exposed by immersion lithography, for example 193 nm immersion lithography (193i). In an embodiment, extreme ultraviolet lithography (EUV) may be used to obtain tighter pitch patterning. The patterning of photo resist may be transferred to the hard mask and then transferred to the organic planarization layer 33 by reactive ion beam etching. The organic planarization layer 33 may protect an area over the fin 10 from subsequent processing steps, allowing separate processing in the area surrounding the fin 10 and an area surrounding the fin 12. The organic planarization layer 33 may have a height ranging from about 100 nm to 300 nm, and ranges there between, although a thickness less than 100 nm and greater than 300 nm may be acceptable.

Referring to FIGS. 88, 89, 90, and 91, the structure 100 is shown, according to an exemplary embodiment. FIG. 88 illustrates a top view. FIGS. 89, 90, and 91, are each cross-sectional views of FIG. 88, along Section E-E, F-F, and G-G, respectively. FIG. 89 illustrates two fins 12. FIGS. 90 and 91 each illustrate two fins 10.

As shown in FIG. 90, an eighth opening 58 may be formed by recessing/etching the sacrificial layer 39, and the NFET WFM 36, selective to the organic planarization layer 33 and a portion of the sacrificial buffer 44 over the fin 10, according to an exemplary embodiment. Specifically, the sacrificial layer 39, and the NFET WFM 36, may be laterally removed from the top and along the vertical sidewalls of the fin 12. The eighth opening 58 may be formed using an etch chemistry selective to the organic planarization layer 33 and the insulator 28 and the sacrificial buffer 44, to laterally remove the sacrificial layer 39, and the NFET WFM 36, on the top and along the vertical sidewalls of the fin 10. This may be performed in one or more steps. The organic planarization layer 33 may protect a portion of the sacrificial layer 39 in an area above and surrounding a portion of the vertical sidewalls of the fin 12.

As shown in FIG. 91, the sacrificial layer 39 and the NFET WFM 36, on the top and along the vertical sidewalls of the fin 10, selective to the organic planarization layer 33, a portion of the sacrificial buffer 44, and a portion of the insulator 28 over the fin 10, may be removed according to an exemplary embodiment. The layers may be removed simultaneously as forming the eighth opening 58 as shown in FIG. 90.

The organic planarization layer 33 may be removed according to known techniques, and may be performed in more than one step.

Referring to FIGS. 92, 93, 94, and 95, the structure 100 is shown, according to an exemplary embodiment. FIG. 92 illustrates a top view. FIGS. 93, 94, and 95, are each cross-sectional views of FIG. 92, along Section E-E, F-F, and G-G, respectively. FIG. 93 illustrates two fins 12. FIGS. 94 and 95 each illustrate two fins 10.

Figure 97:
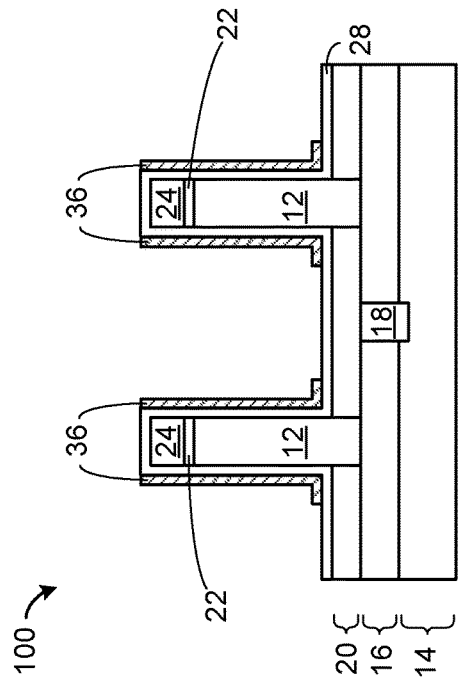
FIGS. 97, 98, and 99 are each cross-sectional views of FIG. 96 along section lines B-B, C-C, and D-D, respectively, according to an exemplary embodiment.
Figure 96:
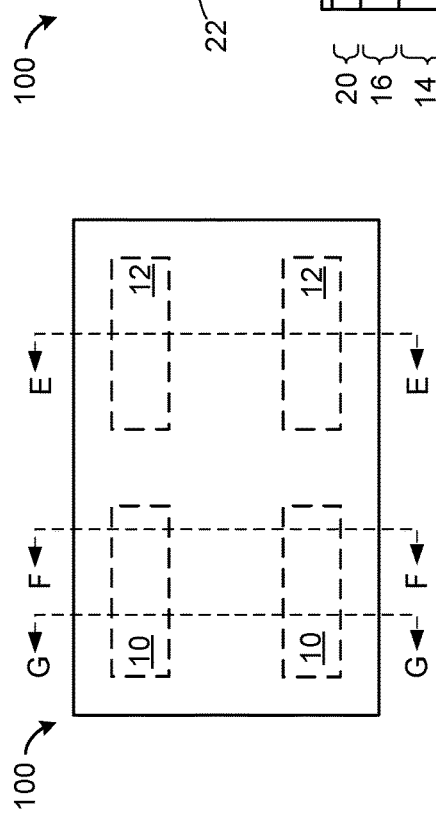
FIG. 96 illustrates a top view of the semiconductor structure and illustrates removing the third sacrificial layer and the sacrificial buffer, according to an exemplary embodiment.
Figure 99:
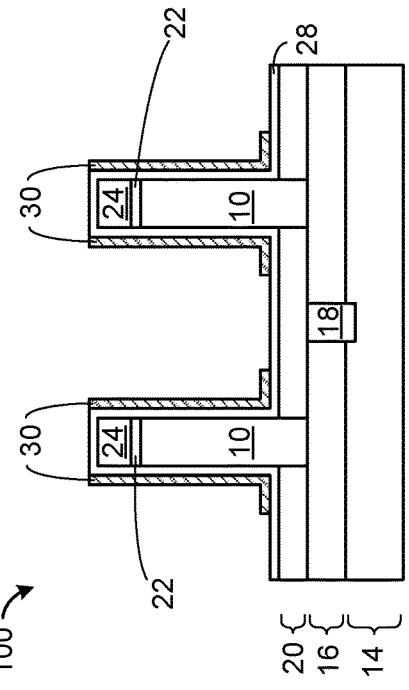
Figure 98:
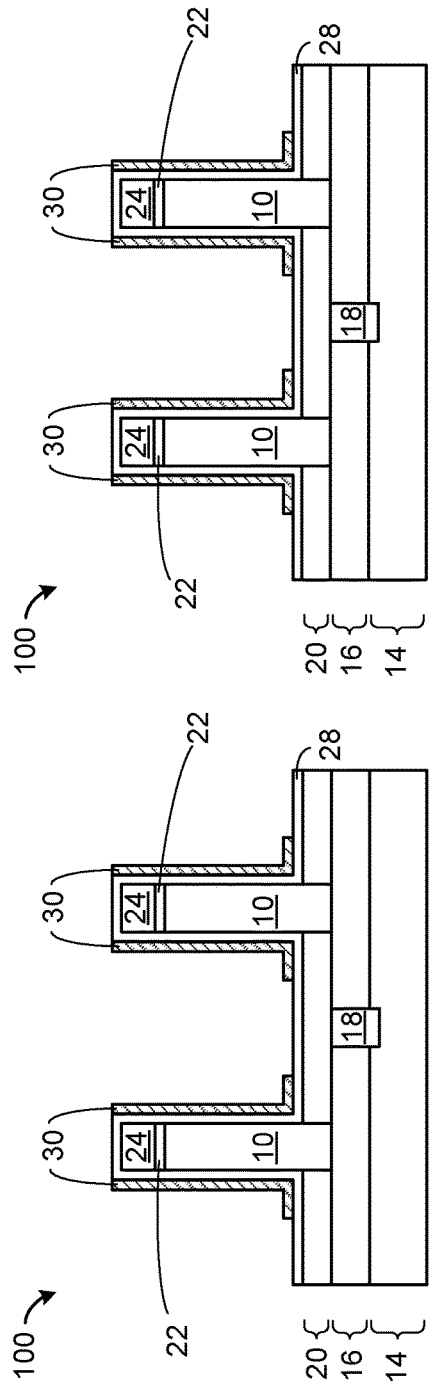

Referring to FIGS. 96, 97, 98, and 99, the structure 100 is shown, according to an exemplary embodiment. FIG. 96 illustrates a top view. FIGS. 97, 98, and 99, are each cross-sectional views of FIG. 96, along Section E-E, F-F, and G-G, respectively. FIG. 97 illustrates two fins 12. FIGS. 98 and 99 each illustrate two fins 10.

Remaining portions of the sacrificial layer 38 and remaining portions of the sacrificial buffer 44 may be removed according to known techniques, and may be performed in more than one step.

Figure 100:
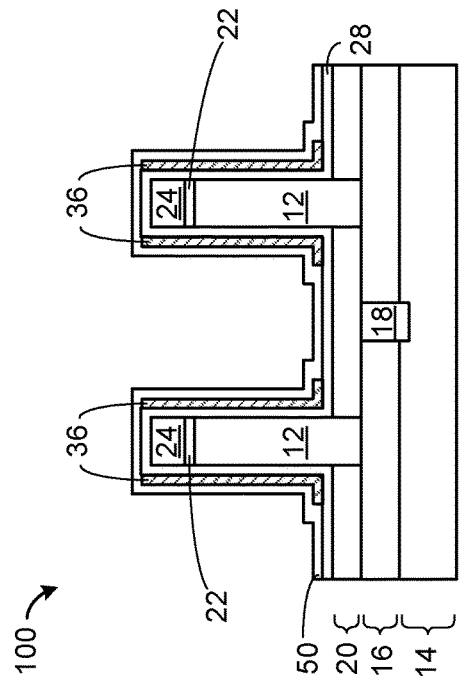
FIG. 100 illustrates a top view of the semiconductor structure and illustrates forming a common metal layer, according to an exemplary embodiment.
Figure 101:
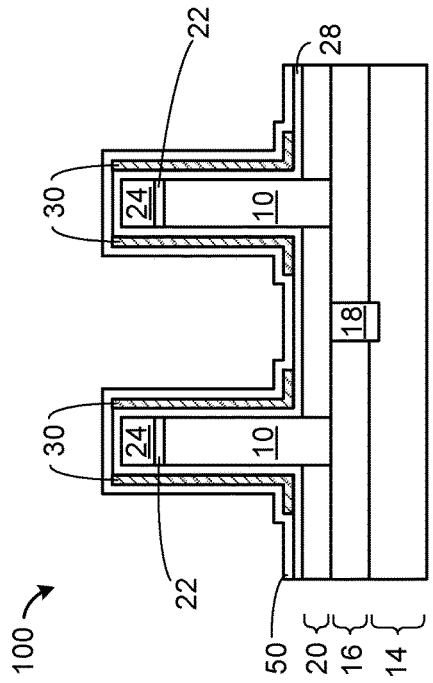
FIGS. 101, 102, and 103 are each cross-sectional views of FIG. 100 along section lines B-B, C-C, and D-D, respectively, according to an exemplary embodiment.
Figure 102:
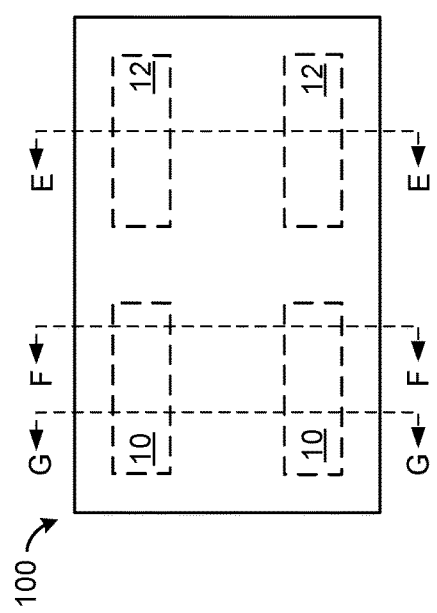
Figure 103:
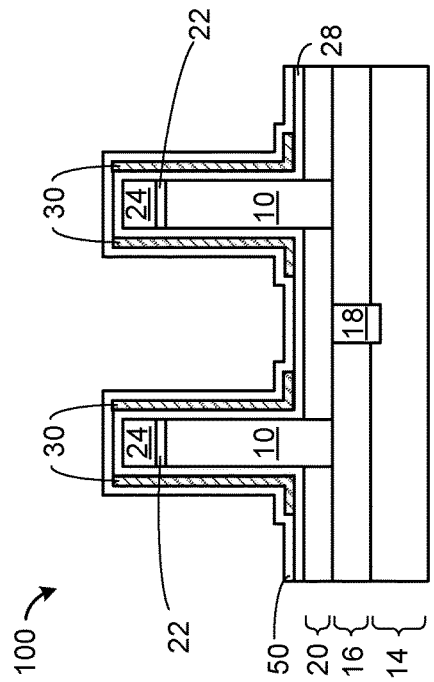
Figure 104:
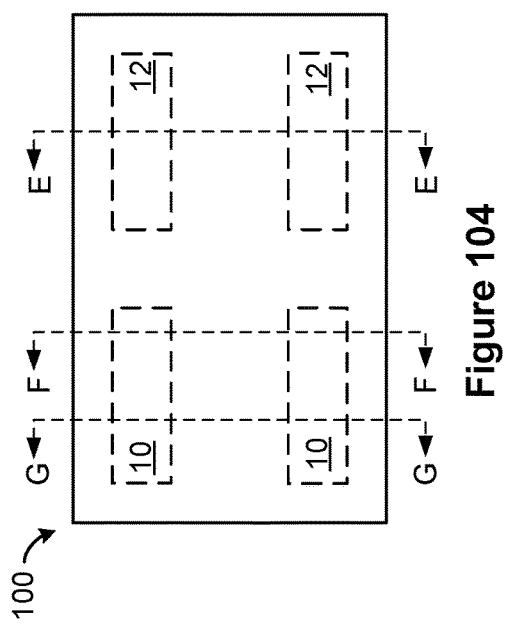
FIG. 104 illustrates a top view of the semiconductor, and illustrates a complete structure, according to an exemplary embodiment.

Referring to FIGS. 100, 101, 102, and 103, the structure 100 is shown, according to an exemplary embodiment. FIG. 100 illustrates a top view. FIGS. 102, 103, and 104, are each cross-sectional views of FIG. 100, along Section E-E, F-F, and G-G, respectively. FIG. 101 illustrates two fins 12. FIGS. 102 and 103 each illustrate two fins 10.

An electrode 50 may be conformally formed on exposed top surfaces of the structure 100, according to an exemplary embodiment. The electrode 50 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the electrode 50 may include one or more layers. The electrode 50 may be deposited on a top surface of the PFET WFM 30 along the top surface and a portion of the vertical side walls of the fin 10. The electrode 50 may be deposited on a top surface of the NFET WFM 36 along the top surface and a portion of the vertical side walls of the fin 10. The electrode 50 may be deposited on a portion of the top surface of the insulator 28. In an embodiment, the electrode 50 may include a conductive material, for example, TiN. The electrode 50 may provide a conductive path between a gate of a device, for example the electrode 50 may be connected to the PFET WFM 30 and the NFET WFM 36. In an embodiment, the electrode 50 may have a thickness ranging from about 3 nm to about 8 nm, and ranges there between, although a thickness less than 3 nm and greater than 8 nm may be acceptable.

Figure 105:
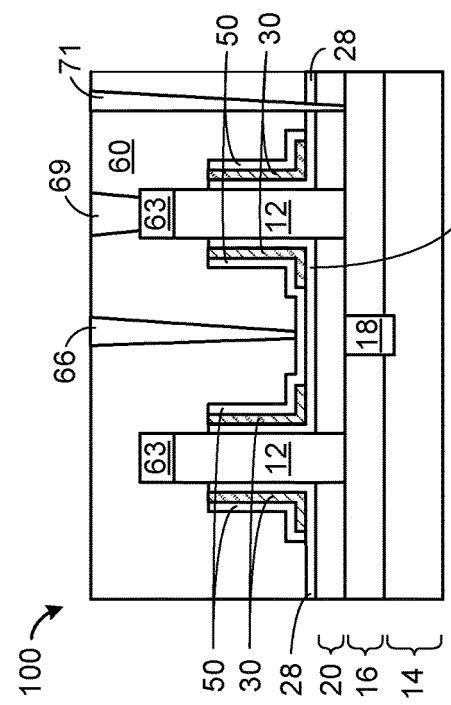
FIGS. 105, 106, and 107 are each cross-sectional views of FIG. 104 along section lines B-B, C-C, and D-D, respectively, according to an exemplary embodiment.
Figure 107:
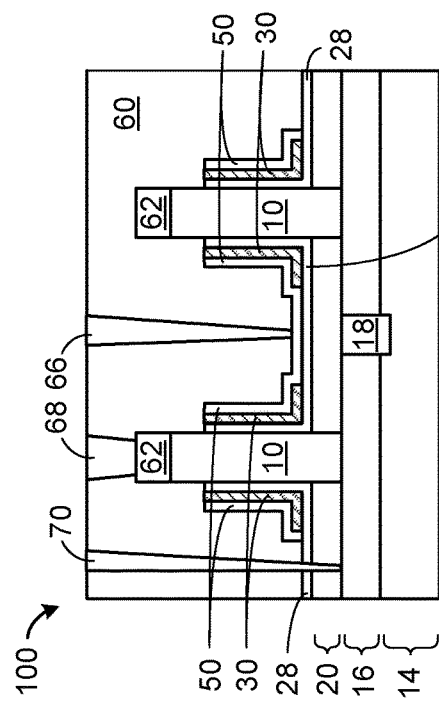
Figure 106:
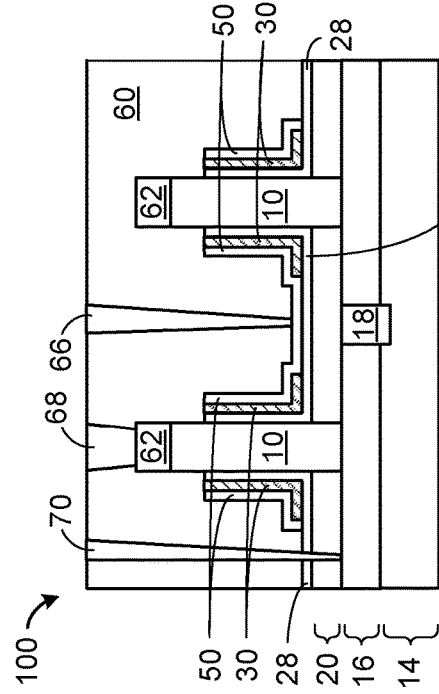

Referring to FIGS. 104, 105, 106, and 107, the structure 100 is shown, according to an exemplary embodiment. FIG. 104 illustrates a top view. FIGS. 105, 106, and 107, are each cross-sectional views of FIG. 104, along Section E-E, F-F, and G-G, respectively. FIG. 105 illustrates two fins 12. FIGS. 106 and 107 each illustrate two fins 10.

Subsequent processing of the structure 100 may be performed, according to an exemplary embodiment. The subsequent processing may include selective etching/recessing to remove materials. In the area surrounding the fin 10, a portion of the electrode 50, a portion of the PFET WFM 30, and a portion of the insulator 28 may be removed from the horizontal top surface of the fin 10 and may be removed from a portion of the vertical side wall of the fin 10. A remaining portion of the electrode 50, a remaining portion of the PFET WFM 30, and a remaining portion of the insulator 28 may remain along a portion of the vertical side wall of the fin 10. In the area surrounding the fin 12, a portion of the electrode 50, a portion of the NFET WFM 36 and a portion of the insulator 28 may be removed from a horizontal top surface of the fin 12 and may be removed from a portion of the vertical side wall of the fin 12. A remaining portion of the electrode 50, a remaining portion of the NFET WFM 36 and a remaining portion of the insulator 28 may remain along a portion of the vertical side wall of the fin 12. An additional remaining portion of the electrode 50 may remain over the horizontal top surface of the insulator 28 between the fin 10 and the fin 12. The hard mask 24 and the insulator 22 may be removed from the horizontal top surface of the fins 10 and 12.

A PFET top epitaxy 62 may be formed on the horizontal top surface of the fin 10 and an NFET top epitaxy 63 may be formed on the horizontal top surface of the fin 12. A dielectric 60 may be formed over the structure 100, covering a top surface and a vertical side surface of the PFET top epitaxy 62, covering a top surface and a vertical side surface of the NFET top epitaxy 63, a portion of a horizontal side wall of the fin 10 and the fin 12, a portion of the top surface of the insulator 28, a portion of the top surface of the PFET WFM 30, and a portion of the top surface of the NFET WFM 36. Openings may be made in the dielectric 60, in which contacts may be formed. A PFET top source drain contact 68 may be formed which connects to the PFET top epitaxy 62. An NFET top source drain contact 69 may be formed which connects to the NFET top epitaxy 63. A gate contact 66 may be formed which connects to the electrode 50. A PFET bottom source drain contact 70 may be formed connecting to the epitaxy 16 which is adjacent to the fin 10. An NFET bottom source drain contact 71 may be formed connecting to the epitaxy 16 which is adjacent to the fin 12. Each of the steps illustrated and described in regards to FIG. 30 may be performed in one or more steps, may be performed simultaneously, may be performed in an alternate sequence, and may be performed using known semiconductor manufacturing processes.

The gate contact 66 may be electrically connected to the electrode 50, the PFET WFM 30 and the NFET WFM 36. The PFET WFM 30 surrounding a portion of the vertical sidewalls of the fin 10 may operate as a PFET gate of a first vertical FET device, and the electrically isolated NFET WFM 36 surrounding a portion of the vertical sidewalls of the fin 12 may operate as an NFET gate for a second vertical FET device. The NFET WFM 36 may surround the PFET WFM 30, and may have minimal effect of the operation of the first vertical FET device. The first vertical FET device and the second vertical FET device may have different operating thresholds, due to different materials used in the WFM of each device, different epitaxies used in each of the bottom source drain regions and the top source drain regions, and other material and structural differences.

In this embodiment, the electrode 50 may serve as a gate contact and is connected to both the PFET WFM 30 and the NFET WFM 36. In a prior embodiment, the PFET WFM 30 and the NFET WFM 36 were adjacent and served as a gate contact.

Please note the above examples allow separate processing on an area surrounding the fin 10 and the fin 12. The process described may be used to allow separate processing between any two features on the structure 100, for example between the fin 10 and an adjacent fin 10. In additional, features and steps from different embodiments may be combined in different sequences in additional embodiments.

Processing semiconductor fabrication steps on areas smaller than lithography spacing may be performed using a described embodiment, by masking an area to be protected from processing steps and partially masking another area which requires processing steps. Lateral etching may be then performed on the partially masked area. This allows processing in areas smaller than lithographic spacing.

It may be noted that not all advantages of the present invention are included above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for forming a semiconductor structure, the method comprising:
    forming a PFET work function metal layer on a p-type field effect transistor (PFET) fin in a PFET region and on an n-type field effect transistor (NFET) fin in an NFET region, wherein a thickness of the PFET work function metal layer is greater on a horizontal top surface of both the PFET fin and the NFET fin, than a thickness of the PFET work function metal layer on a vertical side surface of both the PFET fin and the NFET fin;
    removing a portion of the PFET work function metal layer between the PFET fin and the NFET fin;
    thinning the PFET work function metal layer, wherein a remaining portion of the PFET work function metal layer remains on a horizontal top surface of both the PFET fin and the NFET fin, a remaining portion of the PFET work function metal layer remains on a vertical side surface of both the PFET fin and the NFET fin, and a portion of a horizontal top surface of an insulator is exposed between the PFET fin and the NFET fin;
    patterning an organic planarization layer on the PFET work function metal layer, wherein the organic planarization layer covers the PFET region and partially covers the NFET region;
    removing the PFET work function metal layer in the NFET region, by etching isotropically selective to the organic planarization layer and an insulator in the NFET region;
    removing the organic planarization layer; and
    conformally forming an NFET work function metal layer on the semiconductor structure.

2. The method according to claim 1, further comprising:
    epitaxially growing a PFET bottom source drain on the semiconductor structure, wherein the PFET fin is subsequently formed above the PFET bottom source drain;

epitaxially growing a NFET bottom source drain on the semiconductor structure, wherein the NFET fin is subsequently formed above the NFET bottom source drain.

3. The method according to claim 1, further comprising:
epitaxially growing a PFET top source drain on a top surface of the PFET fin;
epitaxially growing a NFET top source drain on a top surface of the NFET fin.

4. The method according to claim 1, further comprising:
etching the NFET work function metal layer anisotropically to a uniform thickness.

5. The method according to claim 1, further comprising:
forming a dielectric layer;
forming a PFET bottom source drain contact;
forming a PFET top source drain contact;
forming a gate contact connected to the NFET work function metal layer;
forming an NFET bottom source drain contact; and
forming an NFET top source drain contact.

6. The method according to claim 1, further comprising:
conformally forming a common metal layer in the PFET region and in the NFET region;
removing a portion of the common metal layer and a portion of the PFET work function metal layer along a vertical side surface of the PFET fin; and
removing a portion of the common metal layer and a portion of the NFET work function metal layer from a horizontal top surface of the NFET fin.

7. The method according to claim 1, further comprising:
removing the organic planarization layer.

8. A method for forming a semiconductor structure, the method comprising:
conformally forming a PFET work function metal layer on a p-type field effect transistor (PFET) fin in a PFET region and on an n-type field effect transistor (NFET) fin in an NFET region;
conformally forming a sacrificial buffer on the PFET work function metal layer;
conformally forming a cap layer on the sacrificial buffer;
forming a sacrificial layer on the cap layer, wherein a thickness of the sacrificial layer is greater on a horizontal top surface of both the PFET fin and the NFET fin, than a thickness of the sacrificial layer on a vertical side surface of both the PFET fin and the NFET fin;
removing a portion of the sacrificial layer, a portion of the cap layer, a portion of the sacrificial buffer and a portion of the PFET work function metal layer between the PFET fin and the NFET fin, wherein a portion of the sacrificial layer, a portion of the cap layer, a portion of the sacrificial buffer and a portion of the PFET work function metal layer remain on a horizontal top surface of both the PFET fin and the NFET fin, and on a vertical side surface of both the PFET fin and the NFET fin, and wherein a portion of a horizontal top surface of an insulator is exposed between the PFET fin and the NFET fin;
forming an organic planarization layer on the sacrificial layer in the PFET region, on the portion of the horizontal top surface of the insulator between the PFET fin and the NFET fin, and partially on the NFET fin in the NFET region;
removing the sacrificial layer, the cap layer, the sacrificial buffer and the PFET work function metal layer in the NFET region, using an isotropic etch;
removing the organic planarization layer;
conformally forming an NFET work function metal layer, wherein a horizontal top surface of the NFET work function metal layer on the PFET fin is a greater distance from a horizontal bottom surface of the PFET fin than a distance from a horizontal top surface of the NFET work function metal layer on the NFET fin to a horizontal bottom surface of the NFET fin;
conformally forming a second sacrificial layer on NFET work function metal layer, wherein a thickness of the second sacrificial layer is greater on a horizontal top surface of both the PFET fin and the NFET fin, than a thickness of the second sacrificial layer on a vertical side surface of both the PFET fin and the NFET fin;
removing a portion of the second sacrificial layer and a portion of the NFET work function metal layer between the PFET fin and the NFET fin, wherein a remaining portion of the second sacrificial layer and a remaining portion of the NFET work function metal layer remains on a horizontal top surface of both the PFET fin and the NFET fin, and on a vertical side surface of both the PFET fin and the NFET fin, wherein a second portion of the horizontal top surface of an insulator is exposed between the PFET fin and the NFET fin;
patterning a second organic planarization layer on the second sacrificial layer, wherein the second organic planarization layer covers the NFET region, the second portion of the insulator, and partially covers the PFET region; and
removing the second sacrificial layer and the NFET work function metal layer from a the PFET region, selective to the second organic planarization layer and the PFET work function metal, using an isotropic etch.

9. The method according to claim 8, further comprising:
epitaxially growing a PFET bottom source drain on the semiconductor structure, wherein the PFET fin is subsequently formed above the PFET bottom source drain;
epitaxially growing a NFET bottom source drain on the semiconductor structure, wherein the NFET fin is subsequently formed above the NFET bottom source drain.

10. The method according to claim 8, further comprising:
epitaxially growing a PFET top source drain on a top surface of the PFET fin;
epitaxially growing a NFET top source drain on a top surface of the NFET fin.

11. The method according to claim 8, further comprising:
removing the sacrificial layer and the PFET work function metal layer between the PFET fin and the NFET fin.

12. The method according to claim 8, further comprising:
etching the NFET work function metal layer anisotropically to a uniform thickness.

13. The method according to claim 8, further comprising:
removing the second sacrificial layer and the NFET work function metal layer between the PFET fin and the NFET fin.

14. The method according to claim 8, further comprising:
forming a common metal layer, wherein the common metal layer comprises an electrical connection between the PFET work function metal layer and the NFET work function metal layer;
forming a dielectric layer;
forming a PFET bottom source drain contact;
forming a PFET top source drain contact;
forming a gate contact connected to the common metal layer;
forming an NFET bottom source drain contact; and
forming an NFET top source drain contact.

15. The method according to claim 8, further comprising:
conformally forming a common metal layer in the PFET region and in the NFET region;

removing a portion of the common metal layer and a portion of the PFET work function metal layer along a vertical side surface of the PFET fin; and removing a portion of the common metal layer and a portion of the PFET work function metal layer from a horizontal top surface of the PFET fin.

16. The method according to claim 8, further comprising: removing the organic planarization layer.

17. A semiconductor structure comprising:
a p-type field effect transistor (PFET) bottom source drain region on the semiconductor substrate;
an n-type field effect transistor (NFET) bottom source drain region on the semiconductor substrate;
a PFET fin on the PFET source drain region;
an NFET fin on the NFET source drain region;
a PFET work function metal layer conformally surrounding a portion of vertical sidewalls of the PFET fin, and over a horizontal top surface of the PFET fin;
an organic planarization layer, wherein the organic planarization layer covers the PFET fin and partially covers the NFET fin; and
an opening between the organic planarization layer and the NFET fin.

18. The semiconductor structure according to claim 17, further comprising:
a sacrificial layer on the PFET work function metal layer, wherein a thickness of the sacrificial layer is greater on a horizontal top surface of the PFET fin, than a thickness of the sacrificial buffer on a vertical side surface of the PFET fin.

19. The semiconductor structure according to claim 17, further comprising:
a shallow trench isolation region between the PFET bottom source drain region and the NFET bottom source drain region.

20. The semiconductor structure according to claim 17, further comprising:
an insulator layer below the PFET work function metal.

* * * * *